United States Patent
Tsukamoto et al.

(10) Patent No.: US 10,510,807 B2
(45) Date of Patent: Dec. 17, 2019

(54) DISPLAY DEVICE MANUFACTURING METHOD, AND DISPLAY DEVICE

(71) Applicant: Sharp Kabushiki Kaisha, Sakai, Osaka (JP)

(72) Inventors: Yuto Tsukamoto, Sakai (JP); Seiichi Mitsui, Sakai (JP); Shinichi Kawato, Sakai (JP); Satoshi Inoue, Sakai (JP); Yuhki Kobayashi, Sakai (JP); Takashi Ochi, Sakai (JP)

(73) Assignee: SHARK KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/319,840

(22) PCT Filed: Jul. 21, 2017

(86) PCT No.: PCT/JP2017/026546
§ 371 (c)(1),
(2) Date: Jan. 23, 2019

(87) PCT Pub. No.: WO2018/021196
PCT Pub. Date: Feb. 1, 2018

(65) Prior Publication Data
US 2019/0157360 A1    May 23, 2019

(30) Foreign Application Priority Data
Jul. 28, 2016  (JP) .................. 2016-148901

(51) Int. Cl.
*H01L 27/32*    (2006.01)
*C09K 11/06*    (2006.01)
*H01L 51/50*    (2006.01)

(52) U.S. Cl.
CPC .......... *H01L 27/3211* (2013.01); *C09K 11/06* (2013.01); *H01L 27/322* (2013.01);
(Continued)

(58) Field of Classification Search
USPC ................................... 427/58; 428/691, 917
See application file for complete search history.

(56) References Cited

U.S. PATENT DOCUMENTS 10,411,211 B2 * 9/2019 Tsukamoto ......... H01L 51/5028
2015/0311250 A1  10/2015 Seo et al.
(Continued)

FOREIGN PATENT DOCUMENTS

JP    2015-216113 A    12/2015
WO   2016/129536 A1    8/2016

OTHER PUBLICATIONS

Official Communication issued in International Patent Application No. PCT/JP2017/026546, dated Oct. 10, 2017.

*Primary Examiner* — Ashok Patel
(74) *Attorney, Agent, or Firm* — Keating & Bennett, LLP

(57) ABSTRACT

In this manufacturing method, in a blue fluorescent light-emitting layer formation step, a blue fluorescent light-emitting layer is formed in both a subpixel and a subpixel; in a green fluorescent light-emitting layer formation step, a green fluorescent light-emitting layer is formed in both the subpixel and a subpixel; and in a red light-emitting layer formation step, a red light-emitting layer is formed in both the subpixel and a subpixel. In at least two of the above-mentioned steps, linear vapor deposition is performed using a slit mask having an opening that is provided so as to extend across a plurality of pixels.

16 Claims, 15 Drawing Sheets

(52) U.S. Cl.
CPC ...... *H01L 27/3276* (2013.01); *H01L 51/5004* (2013.01); *H01L 51/504* (2013.01); *H01L 51/5056* (2013.01); *H01L 51/5072* (2013.01); *H01L 51/5092* (2013.01); *H01L 51/5096* (2013.01)

(56) References Cited

U.S. PATENT DOCUMENTS

| | | | |
|---|---|---|---|
| 2018/0019428 A1 | 1/2018 | Kawamura | |
| 2018/0323396 A1* | 11/2018 | Tsukamoto | ............. H01L 51/50 |
| 2019/0115398 A1* | 4/2019 | Tsukamoto | ........... H01L 27/156 |
| 2019/0228686 A1* | 7/2019 | Tsukamoto | ............... G09F 9/30 |
| 2019/0237514 A1* | 8/2019 | Tsukamoto | ............. C23C 14/04 |

\* cited by examiner

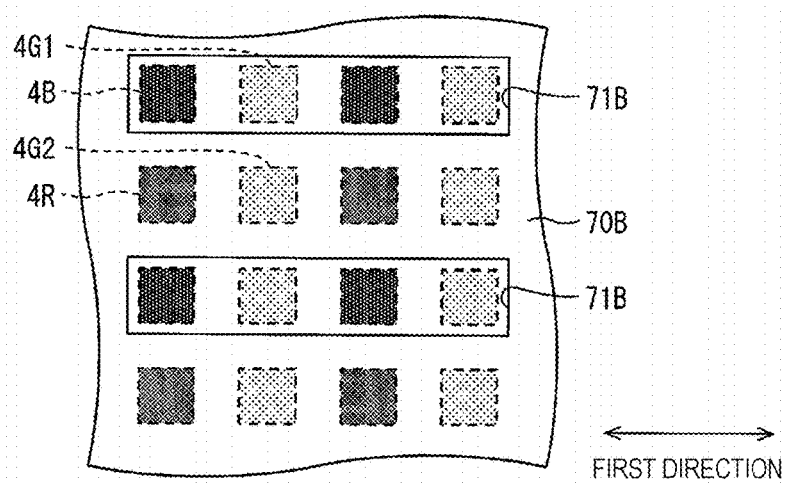
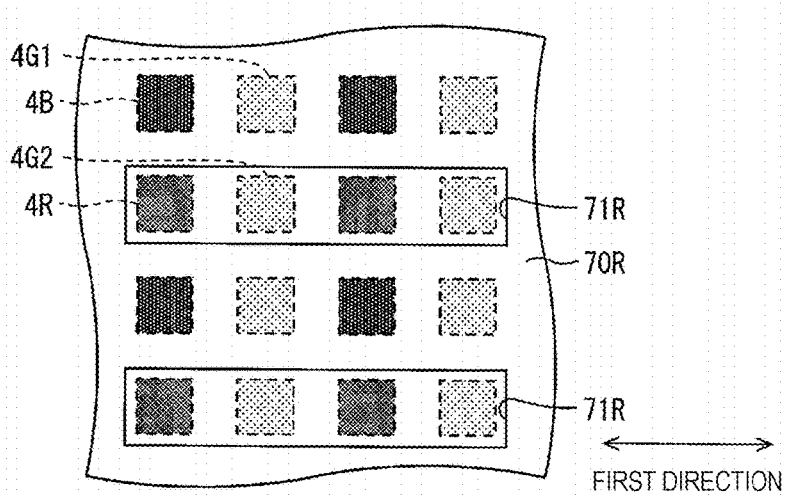
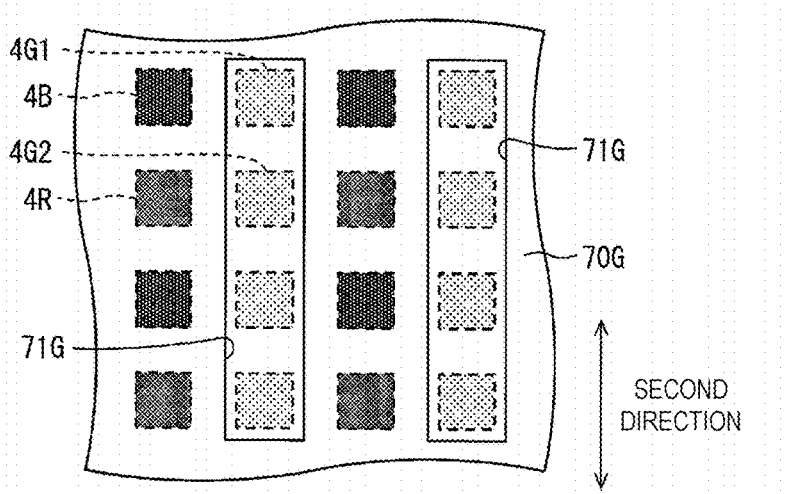

DISPLAY DEVICE MANUFACTURING METHOD, AND DISPLAY DEVICE

TECHNICAL FIELD

The disclosure relates to a display device manufacturing method and to a display device.

BACKGROUND ART

In recent years, a self-luminous display device using a light emitting element (EL element) employing an electroluminescence (hereinafter referred to as "EL") phenomenon has been developed as a display device instead of a liquid crystal display device.

A display device including an EL element can emit light at low voltages. The EL element is a self-luminous element, and therefore has a wide viewing angle and high viewability. Further, the EL element is a thin film-form completely solid element, and is thus garnering attention from the viewpoint of saving space, portability, and the like.

The EL element has a configuration in which a light-emitting layer containing a luminescent material is interposed between a cathode electrode and an anode electrode. The EL element emits light by using the release of light during the deactivation of excitons that are generated by injecting electrons and holes into the light-emitting layer and causing recombination.

The light-emitting layer of an EL element is mainly formed using vapor deposition techniques, such as vacuum vapor deposition. Techniques for forming of a full-color organic EL display device using such vapor deposition can be broadly divided into a white CF (color filter) technique and a separate-patterning technique.

The white CF technique is a technique in which a white light-emitting EL element and a CF layer are combined, and a luminescent color is selected at the subpixel level.

The separate-patterning technique is a technique where separately patterning vapor deposition is carried out for each luminescent color using vapor deposition masks. Generally, subpixels constituted by red (R), green (G), and blue (B) EL elements, arranged on a substrate, are selectively caused to emit light at desired brightnesses using TFTs, and an image is displayed as a result. Banks (partitions) defining light emitting regions in the subpixels are provided between EL elements, and the light-emitting layers of the EL elements are formed in openings of the banks using a vapor deposition mask.

CITATION LIST

Patent Literature

PTL 1: JP 2015-216113 A (published Dec. 3, 2015)

SUMMARY

Technical Problem

The white CF technique has an advantage in that a high-resolution display device can be achieved without requiring a high-resolution vapor deposition mask.

However, with the white CF technique, using a color filter results in energy loss, which is problematic in that a drive voltage is used and more power is consumed. Additionally, this kind of white light-emitting EL element has many layers and requires a color filter, which is a disadvantage in that manufacturing costs are extremely high.

On the other hand, while the separate-patterning technique does provide good light emission efficiency, low voltage driving, and the like, such high-precision patterning is difficult. For example, there is a problem in that colors may bleed to neighboring pixels depending on the precision of the openings in the vapor deposition mask and the distance relationship between the vapor deposition source and the film formed substrate. Furthermore, shadow, where the vapor deposition film ends up thinner than the intended film thickness, can arise depending on the thickness of the vapor deposition mask, the deposition angle, and the like. Thus, with a display device using the separate-patterning technique, there is a problem in that the display quality drops due to color bleeding, shadow, and the like caused by deposited materials infiltrating from the direction of neighboring pixels. Particularly, when another color of dopant is deposited on a neighboring pixel, even if only an extremely small amount of the other color of dopant is deposited, that dopant will, depending on the device structure, have a major influence on the EL light-emission spectrum. This can cause the colors to change.

Thus, to achieve a high-resolution display device using the separate-patterning technique, it is necessary to distance the vapor deposition source from the film formed substrate to achieve an acute deposition angle, which means it is necessary to raise the height of the vacuum chamber to accommodate this distancing.

However, manufacturing a vacuum chamber having a raised height is very expensive, and also has a poor material utilization efficiency, which leads to an increase in material costs as well.

Recent years have seen the practical use of pixel arrangements aside from the RGB stripe arrangement, such as the S-Stripe arrangement and the PenTile arrangement, for the purpose of improving the perceived resolution.

However, regardless of the pixel arrangement, it has been necessary in the past to secure a bank width of at least approximately several tens of μm between subpixels, and the resolution of known display devices using the separate-patterning technique effectively peaks at 500 pixels per inch.

With the aim of providing a light-emitting apparatus having productivity and reduced power consumption, PTL 1 discloses a light-emitting apparatus including at least an R subpixel, which includes a light-emitting element that emits red light and an optical element that transmits the red light, a G subpixel, which includes a light-emitting element that emits green light and an optical element that transmits the green light, and a B subpixel, which includes a light-emitting element that emits blue light and an optical element that transmits the blue light. In each light emitting element, a first light-emitting layer containing a first luminescent material having a spectral peak in a wavelength range of from 540 nm to 580 nm, or a second light-emitting layer containing a second luminescent material having a light-emission peak in a wavelength range of from 420 nm to 480 nm, is used in common.

The light-emitting apparatus may further include a Y subpixel which includes a light-emitting element that emits yellow (Y) light and an optical element that transmits the yellow light. The first light-emitting layer is a light-emitting layer constituted by a luminescent material that emits yellow-green, yellow, or orange light, and the second light-emitting layer is a light-emitting layer constituted by a luminescent material that emits purple, blue, or blue-green light.

In PTL 1, the light-emitting elements are used along with optical elements such as color filters, band-pass filters, multilayer film filters, and the like. The resulting optical interference effect and cutting of mixed color light by the optical elements improves the color purity.

However, in PTL 1, a common layer having a luminance peak at an intermediate color in the spectrum between two subpixels is provided as a common layer for the two subpixels. For example, a light-emitting layer having a luminescent color of yellow or orange is provided as the common layer for the G subpixel and the R subpixel. Accordingly, attempting to enhance a desired color using the optical interference effect can nevertheless result in color shifts and lead to a drop in efficiency, and it is difficult to improve the color reproduction of single colors.

In PTL 1, improving the color using an optical element provided on a counter substrate (a sealing substrate) can be considered. However, there is a tradeoff between color and light emitting efficiency. Therefore, like the white CF technique, there is a problem in that both high color purity and low power consumption cannot be achieved at the same time.

Furthermore, there is a gap between the light emitting element and the optical element, which can produce color mixing in light emitted in oblique directions. The light-emitting apparatus of PTL 1 therefore has a problem in terms of light distribution properties as well.

Having been conceived in light of the above-described problems in the prior art, an object of the disclosure is to provide a display device manufacturing method, and a display device, that can reduce a deposition margin for preventing color mixing by making color mixing less likely than in display devices using the known separate-patterning technique, thereby achieving higher resolutions more easily, and that can achieve both high color levels and low power consumption.

Solution to Problem

To solve the above-described problem, a manufacturing method for a display device according to one aspect of the disclosure is a manufacturing method for a display device, the display device including: a substrate having a display region in which a plurality of pixels are arranged, each pixel including a first subpixel, a second subpixel, a third subpixel, and a fourth subpixel, wherein the first subpixel and the second subpixel are arranged in an alternating manner in a first direction; the third subpixel and the fourth subpixel are arranged in an alternating manner in the first direction; a column constituted by the first subpixel and the second subpixel, and a column constituted by the third subpixel and the fourth subpixel, are arranged in an alternating manner in a second direction orthogonal to the first direction; in the first subpixel, a first fluorescent luminescent material emits light, and the light emitted from the first fluorescent luminescent material is emitted to the exterior; in the second subpixel and the third subpixel, a second fluorescent luminescent material emits light, and the light emitted from the second fluorescent luminescent material is emitted to the exterior; in the fourth subpixel, a third luminescent material emits light, and the light emitted from the third luminescent material is emitted to the exterior; the first fluorescent luminescent material emits light having a first peak wavelength; the second fluorescent luminescent material emits light having a second peak wavelength longer than the first peak wavelength; the third luminescent material emits light having a third peak wavelength longer than the second peak wavelength; and an energy level of the second fluorescent luminescent material in a minimum excited singlet state is lower than an energy level of the first fluorescent luminescent material in a minimum excited singlet state and higher than an energy level of the third luminescent material in a minimum excited singlet state, the method including: a function layer formation step of forming a plurality of function layers constituted by vapor deposition particles on the substrate by vapor-depositing vapor deposition particles corresponding to the respective function layers on the substrate through vapor deposition masks in which a plurality of mask openings having predetermined opening patterns corresponding to the respective function layers are formed, wherein the function layer formation step includes: a first light-emitting layer formation step of forming a first light-emitting layer containing the first fluorescent luminescent material in common for the first subpixel and the second subpixel; a second light-emitting layer formation step of forming a second light-emitting layer containing the second fluorescent luminescent material in common for the second subpixel and the third subpixel; a third light-emitting layer formation step of forming a third light-emitting layer containing the third luminescent material in common for the third subpixel and the fourth subpixel; and an intermediate layer formation step of forming an intermediate layer in the third subpixel, so that in the third subpixel, the second light-emitting layer and the third light-emitting layer are layered with the intermediate layer, constituted by at least one function layer aside from the light-emitting layers and having a thickness exceeding the Förster radius, being interposed therebetween, and in the function layer formation step: the first light-emitting layer and the second light-emitting layer are formed so that in the second subpixel, a distance between opposing surfaces of the first light-emitting layer and the second light-emitting layer is less than or equal to the Förster radius; and in at least two light-emitting layer formation steps among the first light-emitting layer formation step, the second light-emitting layer formation step, and the third light-emitting layer formation step, the vapor deposition particles are linearly deposited on the substrate using, as the vapor deposition mask, a slitted mask including slit-shaped mask openings provided so that the mask openings span a plurality of the pixels.

To solve the above-described problem, a display device according to one aspect of the disclosure includes: a substrate having a display region in which a plurality of pixels are arranged, each pixel including a first subpixel, a second subpixel, a third subpixel, and a fourth subpixel, wherein the first subpixel and the second subpixel are arranged in an alternating manner in a first direction; the third subpixel and the fourth subpixel are arranged in an alternating manner in the first direction; a column constituted by the first subpixel and the second subpixel, and a column constituted by the third subpixel and the fourth subpixel, are arranged in an alternating manner in a second direction orthogonal to the first direction; a first light-emitting layer containing a first fluorescent luminescent material is provided in common for the first subpixel and the second subpixel; a second light-emitting layer containing a second fluorescent luminescent material is provided in common for the second subpixel and the third subpixel; a third light-emitting layer containing a third luminescent material is provided in common for the third subpixel and the fourth subpixel; at least two light-emitting layers among the first light-emitting layer, the second light-emitting layer, and the third light-emitting layer include a light-emitting layer provided spanning a plurality of pixels; an energy level of the second fluorescent luminescent material in a minimum excited singlet state is lower than an energy level of the first fluorescent luminescent material in a minimum excited singlet state and higher than an energy level of the third luminescent material in a minimum excited singlet state; in the second subpixel, a distance between opposing surfaces of the first light-emitting layer and the second light-emitting layer is less than or equal to a Förster radius; the third subpixel includes an intermediate layer, the intermediate layer constituted by at least one function layer aside from the light-emitting layers and having a thickness exceeding the Förster radius, and in the third subpixel, the second light-emitting layer and the third light-emitting layer are layered with the intermediate layer interposed therebetween; in the first subpixel, the first fluorescent luminescent material emits light, and the light emitted from the first fluorescent luminescent material is emitted to the exterior; in the second subpixel and the third subpixel, the second fluorescent luminescent material emits light, and the light emitted from the second fluorescent luminescent material is emitted to the exterior; in the fourth subpixel, the third luminescent material emits light, and the light emitted from the third luminescent material is emitted to the exterior; the first fluorescent luminescent material emits light having a first peak wavelength; the second fluorescent luminescent material emits light having a second peak wavelength longer than the first peak wavelength; and the third luminescent material emits light having a third peak wavelength longer than the second peak wavelength.

Advantageous Effects of Disclosure

According to the above-described aspects of the disclosure, light-emitting layers of a plurality of colors can be linearly-deposited, which has not been possible with known display devices having an S-Stripe arrangement or a PenTile arrangement.

Additionally, by using a slitted mask having slit-shaped mask openings provided spanning a plurality of pixels in the aforementioned linear deposition, non-opening patterns between adjacent subpixels within each pixel and non-opening patterns between adjacent pixels can be eliminated from the vapor deposition mask. Accordingly, in a known vapor deposition mask for forming light-emitting layers, non-opening patterns between adjacent subpixels vapor-deposited at the same time can be reduced; furthermore, shadow dependent on the thicknesses of the non-opening patterns between adjacent subpixels and the non-opening patterns between adjacent pixels can be eliminated, and variations in film thickness within subpixels can be reduced.

Additionally, according to the above-described aspects of the disclosure, in the second subpixel, the first light-emitting layer and the second light-emitting layer are layered. The second fluorescent luminescent material, which is the luminescent material of the second light-emitting layer, has a lower energy level in the minimum excited singlet state than the first fluorescent luminescent material, which is the luminescent material of the first light-emitting layer. Additionally, the distance between opposing surfaces of the first light-emitting layer and the second light-emitting layer is less than or equal to the Förster radius. Accordingly, even if, for example, holes and electrons have recombined in the first light-emitting layer, Förster-type energy transfer enables the second fluorescent luminescent material to emit light at substantially 100% while suppressing color mixing.

In the third subpixel, the second light-emitting layer and the third light-emitting layer are layered, but layering the second light-emitting layer and the third light-emitting layer with the intermediate layer interposed therebetween inhibits energy transfer from the third light-emitting layer to the second light-emitting layer, which makes it possible to suppress color mixing.

Additionally, according to the above-described aspects of the disclosure, light-emitting layers of a plurality of colors can be linearly-deposited as described above, and because color mixing does not occur easily despite employing the layered structure for the light-emitting layers, a deposition margin for preventing color mixing can be made lower than in display devices using a known separate-patterning technique. This makes it possible to realize a higher resolution more easily than in display devices using a known separate-patterning technique.

Additionally, according to the above-described aspects of the disclosure, the display device does not require a CF layer or an optical interference effect as with the white CF technique or PTL 1, despite having the above-described layered structure for the light-emitting layers. This makes it possible to avoid a situation where more power is consumed, the light distribution properties worsen, and the like. Therefore, a high color level and low power consumption can be achieved at the same time.

Thus according to the above-described aspects of the disclosure, it is possible to provide a display device that can reduce the deposition margin for preventing color mixing by making color mixing less likely than in display devices using a known separate-patterning technique, thereby achieving higher resolutions more easily, and that can achieve both high color levels and low power consumption.

BRIEF DESCRIPTION OF DRAWINGS

FIGS. 9A to 9C are plan views illustrating processes for manufacturing the light-emitting layer unit in the organic EL display device according to the first embodiment of the disclosure, in the order of those processes.

DESCRIPTION OF EMBODIMENTS

Hereinafter, embodiments of the disclosure will be described in detail.

First Embodiment

A description follows regarding one aspect of the disclosure, on the basis of FIGS. 1 to 11.

The following describes an organic EL display device as an example of a display device according to the present embodiment.

Overall Configuration of Organic EL Display Device

Figure 1:
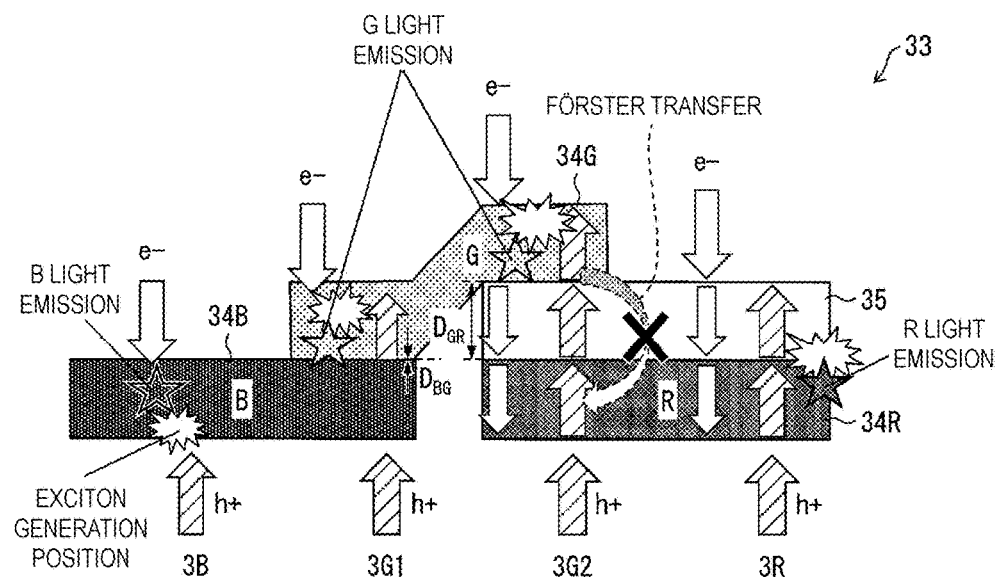
FIG. 1 is a diagram schematically illustrating the principle of light emission by a light-emitting layer unit of an organic EL display device according to a first embodiment of the disclosure.
Figure 2:
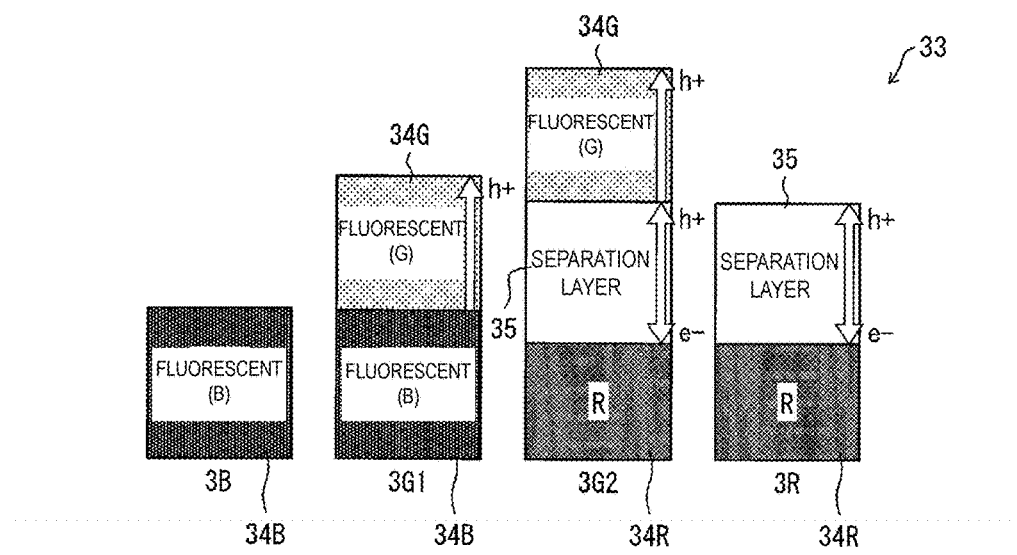
FIG. 2 is a diagram schematically illustrating a layered structure in the light-emitting layer unit of the organic EL display device according to the first embodiment of the disclosure.
Figure 3:
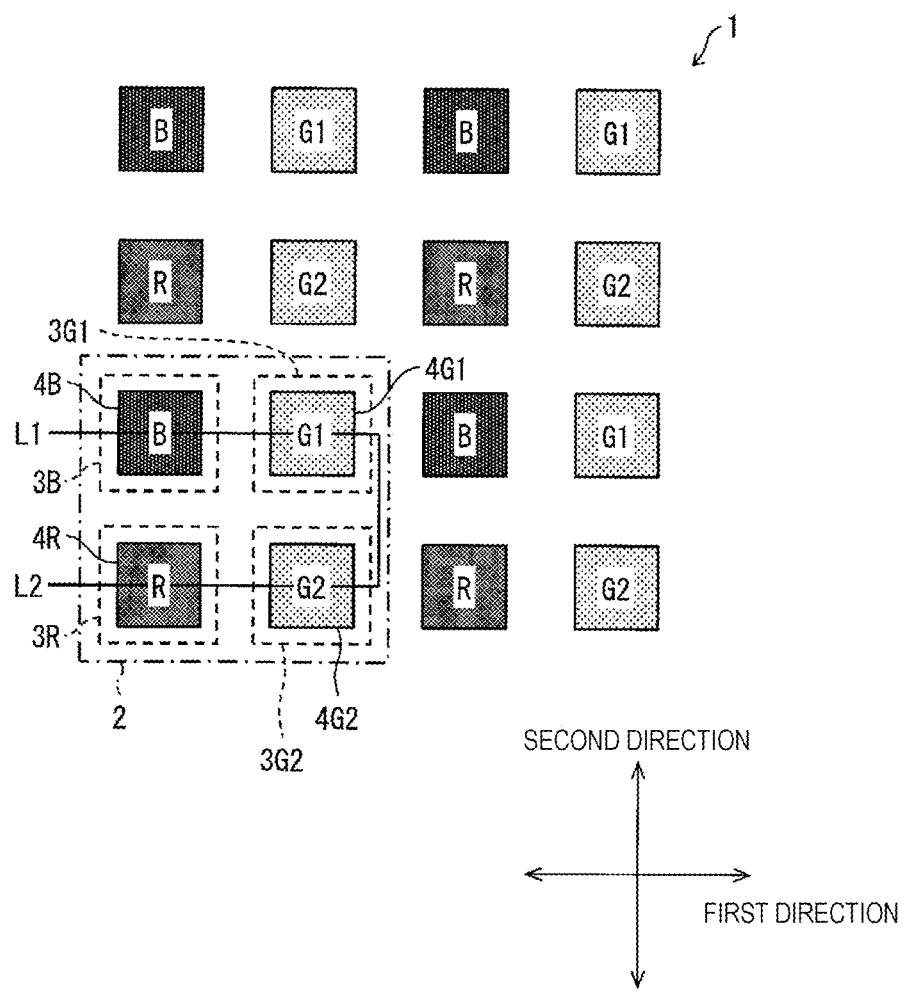
FIG. 3 is a diagram schematically illustrating a pixel arrangement in the organic EL display device according to the first embodiment of the disclosure.
Figures 4, 5:
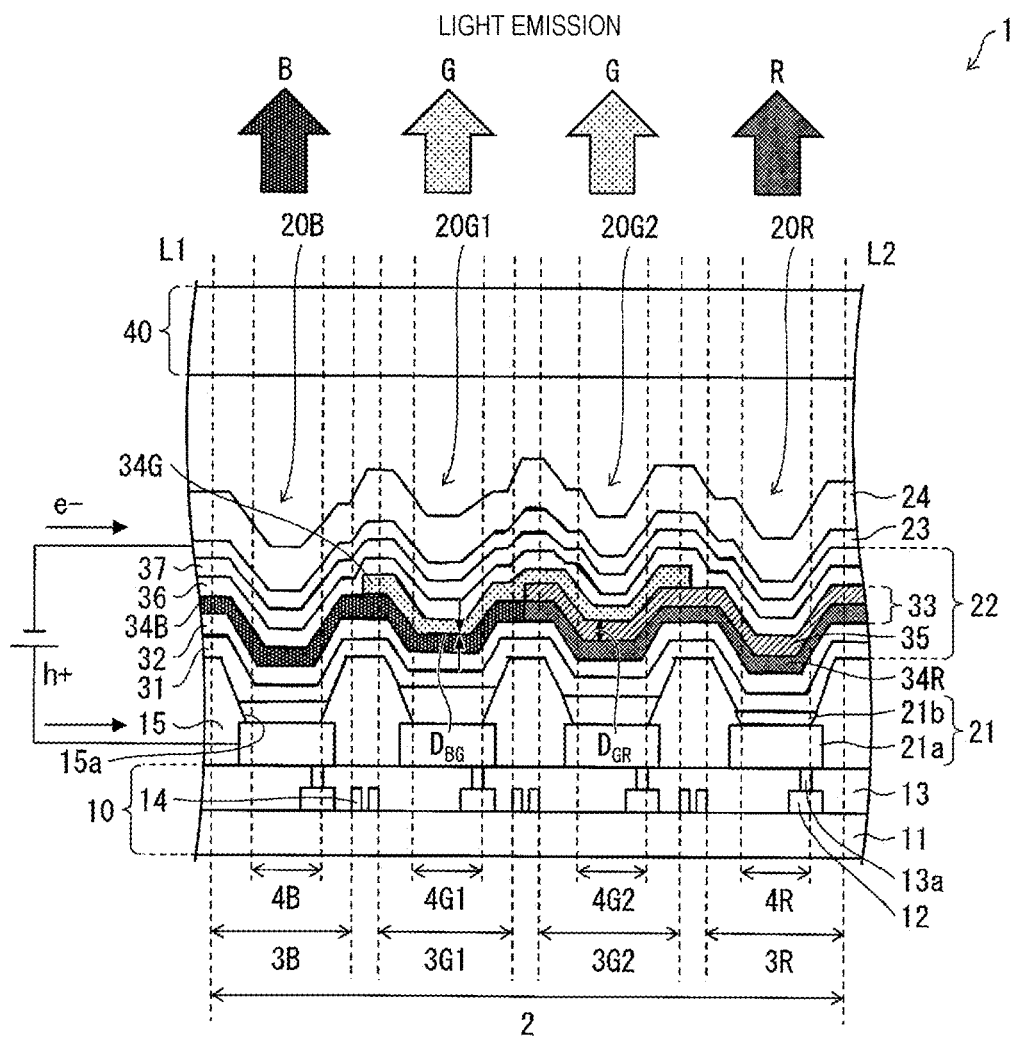
FIG. 4 is a cross-sectional view illustrating an example of the overall configuration of the organic EL display device according to the first embodiment of the disclosure.
FIG. 5 is a diagram illustrating a relationship between energy levels of a blue fluorescent luminescent material, a green fluorescent luminescent material, and a red luminescent material, in minimum excited singlet states.

FIG. 1 is a diagram schematically illustrating the principle of light emission by a light-emitting layer unit 33 of an organic EL display device 1 according to the present embodiment. FIG. 2 is a diagram schematically illustrating the layered structure of the light-emitting layer unit 33 of the organic EL display device 1 according to the present embodiment. FIG. 3 is a diagram schematically illustrating a pixel arrangement in the organic EL display device 1 according to the present embodiment. FIG. 4 is a cross-sectional view illustrating an example of the overall configuration of the organic EL display device 1 according to the present embodiment. Note that FIG. 4 illustrates an example of the overall configuration of a single pixel area, enclosed within the single dot-single dash line in FIG. 3, and corresponds to a cross-section of the organic EL display device 1 taken along the line L1-L2 indicated in FIG. 3.

As illustrated in FIG. 4, the organic EL display device 1 has a configuration in which, for example, a TFT (Thin Film Transistor) substrate 10 (a substrate) and a sealing substrate 40 are affixed to each other by a sealing member (not shown). A plurality of organic EL elements 20 that emit different colors of light are provided on the TFT substrate 10. Accordingly, the organic EL elements 20 are sealed between the pair of substrates, i.e., the TFT substrate 10 and the sealing substrate 40. A filler layer (not shown), for example, is provided between the TFT substrate 10, on which the organic EL elements 20 are layered, and the sealing substrate 40. The following describes an example in which the TFT substrate 10 is rectangular in shape.

The organic EL display device 1 according to the present embodiment is a top-emitting display device that emits light from the sealing substrate 40 side. This will be described in more detail below.

Configuration of TFT Substrate 10

The TFT substrate 10 is a circuit substrate in which a TFT circuit, which includes TFTs 12, wiring lines 14, and the like, is formed. The TFT substrate 10 includes an insulating substrate 11 (not shown) as a support substrate.

The insulating substrate 11 is not particularly limited as long as it has insulating properties. For example, various types of known insulating substrates, including an inorganic substrate such as a glass substrate or a silica substrate, a plastic substrate formed from polyethylene terephthalate or polyimide resin, or the like, can be used as the insulating substrate 11.

The present embodiment will later describe, as an example, a case where a transparent glass substrate (a transparent substrate) is used as the insulating substrate 11. However, the insulating substrate 11 need not be transparent for the top-emitting organic EL elements 20. Therefore, when the organic EL display device 1 is a top-emitting organic EL display device as in the present embodiment, an insulating substrate that is not transparent (a non-transparent substrate) including a semiconductor substrate such as a silicon wafer, a substrate in which a surface of a metal substrate formed from aluminum (Al) or iron (Fe) is coated with an insulating material such as silicon oxide or an organic insulating material, a substrate in which a surface of a metal substrate formed from Al is subjected to an insulation treatment through an anode oxidation method, or the like, may be used as the insulating substrate 11.

A plurality of the wiring lines 14 are provided on the insulating substrate 11, the wiring lines 14 being constituted by a plurality of gate lines extending in the horizontal direction and a plurality of signal lines extending in the vertical direction and intersecting with the gate lines. The wiring lines 14 and the TFTs 12 are covered by an interlayer insulating film 13. A gate line drive circuit (not shown), which drives the gate lines, is connected to the gate lines, and a signal line drive circuit (not shown), which drives the signal lines, is connected to the signal lines.

Light emitting regions 4 of the organic EL elements 20, which emit red (R), green (G), and blue (B) light, respectively, are provided on the TFT substrate 10, in regions surrounded by the wiring lines 14.

In other words, the region surrounded by the wiring lines 14 is a single subpixel 3 (a dot), and R, G, and B light emitting regions 4 are defined for each subpixel 3.

As illustrated in FIGS. 3 and 4, each of pixels 2 (i.e., each pixel) is constituted by four subpixels, namely subpixels 3B, 3G1, 3G2, and 3R. Organic EL elements 20B, 20G1, 20G2, and 20R, which have corresponding luminescent colors, are provided as the organic EL elements 20 for the subpixels 3B, 3G1, 3G2, and 3R, respectively.

The subpixel 3B (a first subpixel; a blue subpixel), which displays blue serving as a first color, is constituted by the organic EL element 20B, which has a luminescent color of blue, and transmits blue light. The subpixel 3G1 (a second subpixel; a first green subpixel), which displays green serving as a second color, is constituted by the organic EL element 20G1, which has a luminescent color of green, and transmits green light. Likewise, the subpixel 3G2 (a third subpixel; a second green subpixel), which displays green serving as the second color, is constituted by the organic EL element 20G2, which has a luminescent color of green, and transmits green light. The subpixel 3R (a fourth subpixel; a red subpixel), which displays red serving as a third color, is constituted by the organic EL element 20R, which has a luminescent color of red, and transmits red light.

In the present embodiment, the subpixels 3B, 3G1, 3G2, and 3R will be collectively referred to simply as "subpixels 3" where there is no need to distinguish between the subpixels 3B, 3G1, 3G2, and 3R. Likewise, in the present embodiment, the organic EL elements 20B, 20G1, 20G2, and 20R will be collectively referred to simply as "organic EL elements 20" where there is no need to distinguish between the organic EL elements 20B, 20G1, 20G2, and 20R. Furthermore, light emitting regions 4B, 4G1, 4G2, and 4R will be collectively referred to simply as "light emitting regions 4" where there is no need to distinguish between the light emitting regions 4B, 4G1, 4G2, and 4R.

A plurality of the TFTs 12, including a TFT serving as a drive transistor supplying drive current to the organic EL element 20, are provided for each of the subpixels 3. The light emission intensity of each subpixel 3 is determined by scanning and selection by the wiring line 14 and the TFT 12. As described above, the organic EL display device 1 selectively causes each organic EL element 20 to emit light at the desired luminance using the TFT 12, thereby displaying an image.

Configuration of Organic EL Element 20

As illustrated in FIG. 4, each organic EL element 20 includes a first electrode 21, an organic EL layer 22, and a second electrode 23. The organic EL layer 22 is interposed between the first electrode 21 and the second electrode 23. In the present embodiment, the layers provided between the first electrode 21 and the second electrode 23 are collectively referred to as the organic EL layer 22. The organic EL layer 22 is an organic layer constituted by at least one function layer, and includes the light-emitting layer unit 33, which in turn includes at least one of a blue fluorescent light-emitting layer 34B, a green fluorescent light-emitting layer 34G, and a red light-emitting layer 34R (the blue fluorescent light-emitting layer 34B, the green fluorescent light-emitting layer 34G, and the red light-emitting layer 34R will collectively be referred to simply as "light-emitting layers 34" hereinafter when there is no need to distinguish between the blue fluorescent light-emitting layer 34B, the green fluorescent light-emitting layer 34G, and the red light-emitting layer 34R).

The first electrode 21, the organic EL layer 22, and the second electrode 23 are layered in that order from the TFT substrate 10 side.

The first electrode 21 is formed in an island-like pattern for each subpixel 3, and an end portion of the first electrode 21 is covered by a bank 15 (a partition; an edge cover). The first electrode 21 is connected to the TFT 12 via a contact hole 13a provided in the interlayer insulating film 13.

The bank 15 is an insulating layer, and is constituted by a photosensitive resin, for example. The bank 15 prevents short-circuiting with the second electrode 23 due to increased electrode density, the organic EL layer 22 being thinner, or the like at the end portion of the first electrode 21. The bank 15 also functions as a pixel separation film to prevent current from leaking to adjacent subpixels 3.

An opening 15a is provided in the bank 15, for each subpixel 3. As illustrated in FIG. 4, parts of the first electrode 21 and the organic EL layer 22 exposed by the opening 15a correspond to the light emitting region 4 of each subpixel 3, and the other regions are non-emissive regions.

On the other hand, the second electrode 23 is a common electrode provided in common for the subpixels 3. However, the present embodiment is not limited thereto, and the second electrode 23 may be provided for each subpixel 3 individually.

A protection layer 24 is provided on the second electrode 23 to cover the second electrode 23. The protection layer 24 protects the second electrode 23, which serves as an upper electrode, and prevents outside oxygen and moisture from infiltrating into each organic EL element 20. Note that the protection layer 24 may be provided in common for all of the organic EL elements 20 so as to cover the second electrode 23 in all of the organic EL elements 20. In the present embodiment, the first electrode 21, the organic EL layer 22, and the second electrode 23, which are formed for each subpixel 3, as well as the protection layer 24 formed as necessary, are collectively referred to as the organic EL element 20.

First Electrode 21 and Second Electrode 23

The first electrode 21 and the second electrode 23 serve as a pair of electrodes, with one functioning as an anode electrode and the other functioning as a cathode electrode.

The anode electrode may function as an electrode for injecting holes ($h^+$) into the light-emitting layer unit 33. The cathode electrode may function as an electrode for injecting electrons ($e^-$) into the light-emitting layer unit 33.

The shape, structure, size, or the like of the anode electrode and the cathode electrode are not particularly limited and can be appropriately selected according to the application and purpose of the organic EL element 20.

The present embodiment will describe an example in which the first electrode 21 is the anode electrode and the second electrode 23 is the cathode electrode, as illustrated in FIG. 4. However, the present embodiment is not limited thereto, and the first electrode 21 may be a cathode electrode and the second electrode 23 may be an anode electrode. The order in which the function layers constituting the light-emitting layer unit 33 are layered, or the carrier transport properties (hole transport properties and electron transport properties), are inverted depending on whether the first electrode 21 is an anode electrode and the second electrode 23 is a cathode electrode, or the first electrode 21 is a cathode electrode and the second electrode 23 is an anode electrode. Likewise, the materials constituting the first electrode 21 and the second electrode 23 are inverted as well.

Electrode materials that can be used as the anode electrode and the cathode electrode are not particularly limited. For example, known electrode materials can be used.

As the anode electrode, for example, metals such as gold (Au), platinum (Pt), and nickel (Ni), transparent electrode materials such as indium tin oxide (ITO), tin oxide ($SnO_2$), indium zinc oxide (IZO), and gallium-added zinc oxide (GZO), or the like can be used.

On the other hand, it is preferable that a material having a small work function be used for the cathode electrode to inject electrons into the light-emitting layer 34. As the cathode electrode, for example, metals such as lithium (Li), calcium (Ca), cerium (Ce), barium (Ba), and aluminum (Al), or alloys such as Ag (silver)-Mg (magnesium) alloy and Al—Li alloy containing these metals, can be used.

The thicknesses of the anode electrode and cathode electrode are not particularly limited, and can be set to the same thicknesses as employed in the past.

Light emitted by the light-emitting layer unit 33 is light emitted from the side on which one of the electrodes, out of the first electrode 21 and the second electrode 23, is located. Preferably, a transparent or semitransparent light-transmissive electrode (a transparent electrode, a semitransparent electrode) employing a light-transmissive electrode material is used as the electrode on the side where light is emitted, and a reflective electrode employing a reflective electrode material, or an electrode having a reflective layer which serves as a reflective electrode, is used as the electrode on the side where light is not emitted.

In other words, a variety of conductive materials can be used for the first electrode 21 and the second electrode 23. However, when the organic EL display device 1 is a top-emitting organic EL display device as described above, it is preferable that the first electrode 21 on the side of the TFT substrate 10, which serves as a support body supporting the organic EL elements 20, be formed from a reflective electrode material, and that the second electrode 23, which is located on the side opposite from the first electrode 21 with the organic EL elements 20 interposed therebetween, be formed from a transparent or semitransparent light-transmissive electrode material.

The first electrode 21 and the second electrode 23 may each have a single layer structure formed from one electrode material, or may each have a layered structure formed from a plurality of electrode materials.

Accordingly, when the organic EL elements 20 are top-emitting organic EL elements as described above, the first electrode 21 may have a layered structure including a reflective electrode 21a (a reflective layer) and a light-transmissive electrode 21b, as illustrated in FIG. 2. In the present embodiment, the first electrode 21 has a configuration in which the reflective electrode 21a and the light-transmissive electrode 21b are layered in that order from the TFT substrate 10 side.

Examples of reflective electrode materials include a black electrode material such as tantalum (Ta) or carbon (C), a reflective metal electrode material such as Al, Ag, gold (Au), Al—Li alloy, Al-neodymium (Nd) alloy, or Al-silicon (Si) alloy.

A transparent electrode material such as those described above, or a semitransparent electrode material such as a thin film of Ag, may be used as the light-transmissive electrode material, for example.

Organic EL Layer 22

As illustrated in FIG. 4, the organic EL layer 22 according to the present embodiment has a configuration in which a hole injection layer 31, a hole transport layer 32, the light-emitting layer unit 33 including the light-emitting layer 34, an electron transport layer 36, and an electron injection layer 37, serving as function layers, are layered in that order from the first electrode 21 side. The hole injection layer 31, the hole transport layer 32, the electron transport layer 36, and the electron injection layer 37 are provided in common for the subpixels 3 in all of the pixels 2.

However, the function layers aside from the light-emitting layer unit 33 are not layers necessary for the organic EL layer 22, and may be formed as appropriate according to required properties of the organic EL element 20. Each of the above-described function layers will be described next.

Light-Emitting Layer Unit 33

As described above, the organic EL layer 22 in each organic EL element 20 is an organic layer constituted by at least one function layer. The light-emitting layer unit 33 in each organic EL element 20 includes at least one light-emitting layer 34, as illustrated in FIGS. 1, 2, and 4.

Of the organic EL elements 20, the organic EL element 20B includes, as the light-emitting layer 34, a blue fluorescent light-emitting layer 34B containing a blue fluorescent luminescent material that emits blue light. The organic EL element 20R includes, as the light-emitting layer 34, a red light-emitting layer 34R containing a red luminescent material that emits red light. The organic EL element 20G1 includes, as the light-emitting layer 34, a green fluorescent light-emitting layer 34G containing a green fluorescent luminescent material that emits green light, as well as the blue fluorescent light-emitting layer 34B. The organic EL element 20G2 includes, as the light-emitting layer 34, the green fluorescent light-emitting layer 34G, as well as the red light-emitting layer 34R.

The blue fluorescent light-emitting layer 34B is provided in common for the subpixel 3B and the subpixel 3G1. The green fluorescent light-emitting layer 34G is provided in common for the subpixel 3G1 and the subpixel 3G2. The red light-emitting layer 34R is provided in common for the subpixel 3G2 and the subpixel 3R.

As such, in each pixel 2, a plurality of function layers including at least the blue fluorescent light-emitting layer 34B, the green fluorescent light-emitting layer 34G, and the red light-emitting layer 34R are formed between the first electrode 21 and the second electrode 23, as illustrated in FIG. 4. In each subpixel 3, at least one function layer including at least one of the light-emitting layers 34 among the blue fluorescent light-emitting layer 34B, the green fluorescent light-emitting layer 34G, and the red light-emitting layer 34R, is provided between the first electrode 21 and the second electrode 23.

In the present embodiment, the blue fluorescent light-emitting layer 34B and the green fluorescent light-emitting layer 34G in the subpixel 3B are provided adjacent to each other. On the other hand, a separation layer 35 that inhibits Förster-type energy transfer (Förster transfer) is provided between the green fluorescent light-emitting layer 34G and the red light-emitting layer 34R in the subpixel 3G1.

The separation layer 35 does not contain a luminescent material, is constituted by at least one function layer aside from the light-emitting layer, and has a thickness exceeding the Förster radius. Preferably, the separation layer 35 is at least 15 nm thick.

"Förster radius" refers to the distance between adjacent light-emitting layers 34 at which Förster transfer can arise (specifically, the distance between opposing surfaces of adjacent light-emitting layers 34 that are closest to each other). The Förster radius is higher when there is a large amount of overlap between the PL (photoluminescence)

emission spectrum of the luminescent material contained in one of the adjacent light-emitting layers 34 and the absorption spectrum of the luminescent material contained in the other of the light-emitting layers 34, and the Förster radius is lower when there is a small amount of such overlap.

The Förster radius is said to typically be approximately from 1 to 10 nm. As such, Förster transfer will not arise as long as the distance between the opposing surfaces of light-emitting layers 34 adjacent to each other is kept greater than 10 nm.

However, making the distance between adjacent light-emitting layers 34 at least 15 nm ensures that Förster transfer will not arise between the adjacent light-emitting layers 34 even if the PL (photoluminescence) emission spectrum and the absorption spectrum of the luminescent materials in the adjacent light-emitting layers 34 overlap perfectly. It is therefore preferable that the distance between opposing surfaces of the green fluorescent light-emitting layer 34G and the red light-emitting layer 34R (an opposing surface distance $D_{GR}$), i.e., a distance between the surface of the green fluorescent light-emitting layer 34G located furthest on the red light-emitting layer 34R side (a lower surface of the green fluorescent light-emitting layer 34G, in the present embodiment) and the surface of the red light-emitting layer 34R located furthest on the green fluorescent light-emitting layer 34G side (an upper surface of the red light-emitting layer 34R, in the present embodiment), be greater than or equal to 15 nm. For this reason, preferably, the separation layer 35 is at least 15 nm thick.

Like the red light-emitting layer 34R, the separation layer 35 is provided in common for the subpixel 3G2 and the subpixel 3R. Note that the thickness of the separation layer 35 may be set to any thickness capable of inhibiting Förster transfer, and is not limited to a thickness exceeding the Förster radius. An increase in the thickness of the separation layer 35 will result in a corresponding increase in the thickness of the organic EL display device 1, and thus from the standpoint of keeping the organic EL display device 1 small, achieving low voltages for the elements, and the like, a thickness of less than or equal to 50 nm is preferable, and a thickness of less than or equal to 30 nm is more preferable.

As such, part of the separation layer 35 is interposed between the green fluorescent light-emitting layer 34G and the red light-emitting layer 34R in the subpixel 3G2, and another part is layered adjacent to the red light-emitting layer 34R in the subpixel 3R.

In each embodiment, a layered body constituted by the light-emitting layer 34 and an intermediate layer including function layers, aside from the light-emitting layer 34, that are at least partially interposed between a plurality of light-emitting layers 34, is referred to as the light-emitting layer unit 33. Note that the intermediate layer is the separation layer 35 in the organic EL display device 1 according to the present embodiment.

In the organic EL display device 1 according to the present embodiment, the light-emitting layers 34 and the separation layer 35 constituting the light-emitting layer unit 33 in the pixel 2 are layered in the following order, from the first electrode 21 side, as illustrated in FIGS. 1, 2, and 4: the blue fluorescent light-emitting layer 34B and the red light-emitting layer 34R, the intermediate layer, and the green fluorescent light-emitting layer 34G.

The light-emitting layer unit 33 is constituted by the blue fluorescent light-emitting layer 34B in the subpixel 3B, and in the subpixel 3G1, has a layered structure in which the blue fluorescent light-emitting layer 34B and the green fluorescent light-emitting layer 34G are layered in that order from the first electrode 21 side. In the subpixel 3G2, the light-emitting layer unit 33 has a layered structure in which the red light-emitting layer 34R, the separation layer 35, and the green fluorescent light-emitting layer 34G are layered in that order from the first electrode 21 side. In the subpixel 3R, the light-emitting layer unit 33 has a layered structure in which the red light-emitting layer 34R and the separation layer 35 are layered in that order from the first electrode 21 side.

FIG. 5 is a diagram illustrating a relationship between energy levels of the blue fluorescent luminescent material, the green fluorescent luminescent material, and the red luminescent material, in minimum excited singlet states (denoted as "$S_1$ levels" hereinafter). In FIG. 5, $S_1(1)$ indicates the $S_1$ level of the blue fluorescent luminescent material, which is a first fluorescent luminescent material; $S_1(2)$ indicates the $S_1$ level of the green fluorescent luminescent material, which is a second fluorescent luminescent material; and $S_1(3)$ indicates the $S_1$ level of the red luminescent material, which is a third luminescent material. Note that $S_0$ indicates a ground state in FIG. 5.

As illustrated in FIG. 5, the energy level of the green fluorescent luminescent material in the minimum excited singlet state ($S_1(2)$) is lower than the $S_1$ level of the blue fluorescent luminescent material ($S_1(1)$) and is higher than the $S_1$ level of the red luminescent material ($S_1(3)$).

Figure 6:
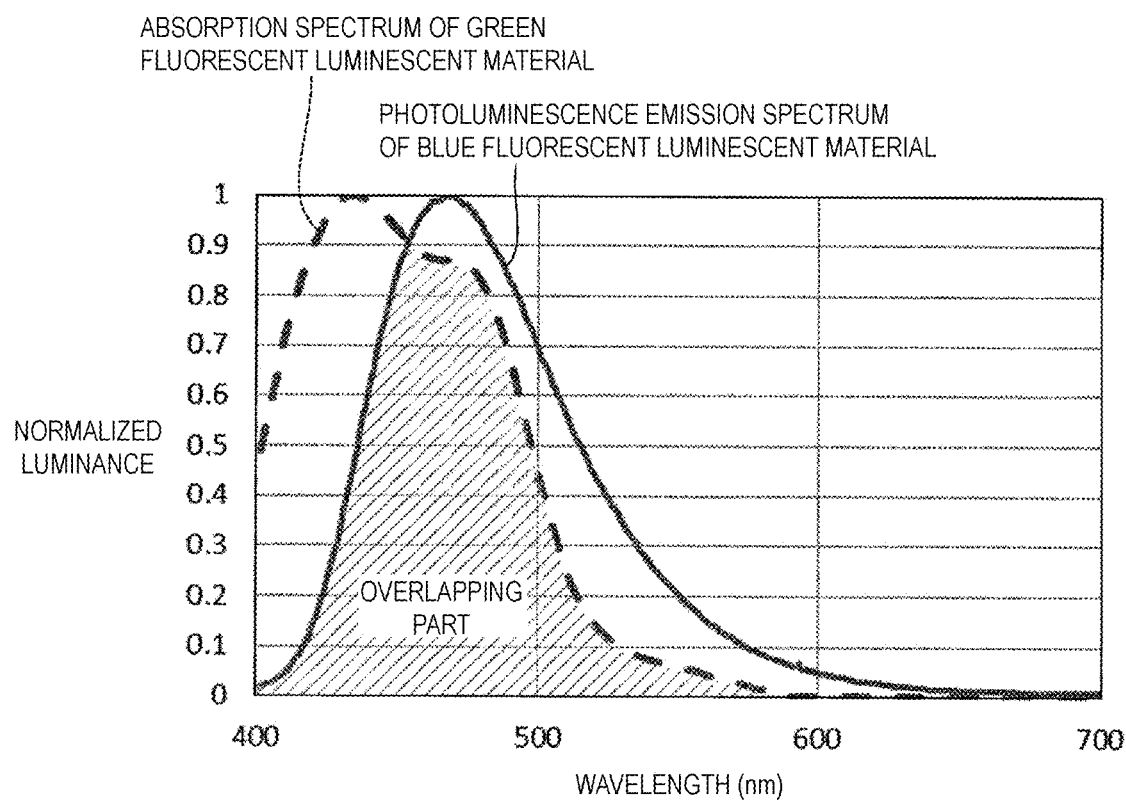
FIG. 6 is a graph illustrating an example of a photoluminescence emission spectrum of the blue fluorescent luminescent material, and an absorption spectrum of the green fluorescent luminescent material, used in the first embodiment of the disclosure.

FIG. 6 is a graph illustrating an example of the PL (photoluminescence) emission spectrum of the blue fluorescent luminescent material and the absorption spectrum of the green fluorescent luminescent material used in the present embodiment.

Note that FIG. 6 indicates the PL emission spectrum of 2,5,8,11-tetra-tert-butylperylene (TBPe), used in Example 1 defining dimensions, materials, and the mixing ratio of materials (described later), as the PL emission spectrum of the blue fluorescent luminescent material, and indicates the absorption spectrum of 2,3-(2-benzothiazolyl)-7-(diethylamino) coumarin (coumarin 6), used in Example 1 defining dimensions, materials, and the mixing ratio of materials (described later), as the absorption spectrum of the green fluorescent luminescent material.

Figure 7:
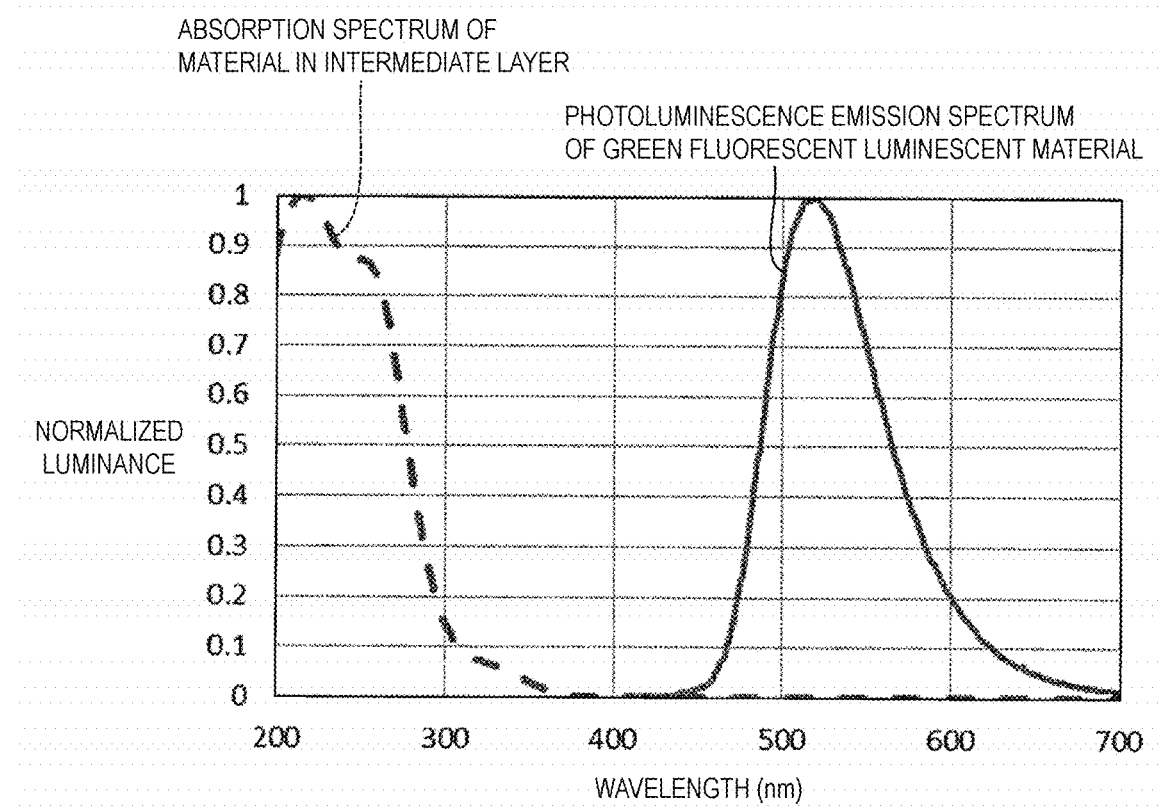
FIG. 7 is a graph illustrating an example of an absorption spectrum of a material of a separation layer, and a photoluminescence emission spectrum of the green fluorescent luminescent material, used in the first embodiment of the disclosure.

FIG. 7 is a graph illustrating an example of the absorption spectrum of the material of the separation layer 35, which is the intermediate layer, and the PL emission spectrum of the green fluorescent luminescent material, used in the present embodiment.

Note that FIG. 7 indicates the absorption spectrum of 4,4'-bis (9-carbazoyl)-biphenyl (CBP), used in Example 1 defining dimensions, materials, and the mixing ratio of materials (described later), as the absorption spectrum of the material of the separation layer 35, and indicates the above-described PL emission spectrum of coumarin 6, used in Example 1 defining dimensions, materials, and the mixing ratio of materials (described later), as the PL emission spectrum of the green fluorescent luminescent material.

As indicated in FIG. 6, it is preferable that the PL emission spectrum of the blue fluorescent luminescent material and the absorption spectrum of the green fluorescent luminescent material partially overlap. Furthermore, as indicated in FIG. 7, it is preferable that no overlap be present between the PL emission spectrum of the green fluorescent luminescent material and the absorption spectrum of all the material contained in the intermediate layer provided between the green fluorescent light-emitting layer 34G and the red light-emitting layer 34R (the material of the separation layer 35, in the present embodiment).

Ensuring the PL emission spectrum of the blue fluorescent luminescent material and the absorption spectrum of the green fluorescent luminescent material partially overlap in this manner makes it easy for energy to be transferred from the blue fluorescent luminescent material to the green fluorescent luminescent material.

In the subpixel 3G1, the blue fluorescent light-emitting layer 34B and the green fluorescent light-emitting layer 34G are in direct contact, and thus the distance between opposing surfaces of the blue fluorescent light-emitting layer 34B and the green fluorescent light-emitting layer 34G (an opposing surface distance $D_{BG}$) is less than or equal to the Förster radius.

Thus, in the subpixel 3G1, Förster transfer arises, from the $S_1$ level of the blue fluorescent luminescent material to the $S_1$ level of the green fluorescent luminescent material. In other words, Förster transfer arises from the blue fluorescent light-emitting layer 34B to the green fluorescent light-emitting layer 34G.

Note that in the present embodiment, the distance between opposing surfaces of the blue fluorescent light-emitting layer 34B and the green fluorescent light-emitting layer 34G (the opposing surface distance $D_{BG}$) is a distance between the surface of the blue fluorescent light-emitting layer 34B located furthest on the green fluorescent light-emitting layer 34G side (an upper surface of the blue fluorescent light-emitting layer 34B, in the present embodiment) and the surface of the green fluorescent light-emitting layer 34G located furthest on the blue fluorescent light-emitting layer 34B side (a lower surface of the green fluorescent light-emitting layer 34G, in the present embodiment).

On the other hand, ensuring that no overlap is present between the absorption spectrum of all the material included in the intermediate layer (the material of the separation layer 35) and the emission spectrum of the green fluorescent luminescent material makes it difficult for energy to transfer from the green fluorescent luminescent material to the material included in the intermediate layer.

The separation layer 35 has a thickness exceeding the Förster radius, and thus the opposing surface distance $D_{GR}$ in the subpixel 3G2 is greater than the Förster radius.

Thus in the subpixel 3G2, Förster-type energy transfer does not arise from the green fluorescent light-emitting layer 34G to the red light-emitting layer 34R through the intermediate layer. Of course, the intermediate layer is provided between the green fluorescent light-emitting layer 34G and the red light-emitting layer 34R, and the green fluorescent light-emitting layer 34G and the red light-emitting layer 34R are not in contact with each other, which means that Dexter-type energy transfer does not occur as well.

Each of the light-emitting layers 34 may be formed from a two-component system including a host material for transporting holes and electrons and a luminescent dopant (guest) material serving as a luminescent material and emitting light, or may be formed from a luminescent material alone.

Of the materials (components) of the light-emitting layer 34, either the host material or the luminescent material may have the greater content percentage.

The host material is a material into which holes and electrons can be injected, and has a function of causing the luminescent material to emit light by holes and electrons being transported and recombining within the molecules of the material. When using a host material, the luminescent material is dispersed uniformly throughout the host material.

When using a host material, an organic compound having a higher value for the $S_1$ level, the energy level in a minimum excited triplet state (denoted as "$T_1$ level" hereinafter), or both, than that of the luminescent material, is used for the host material. Accordingly, the host material can trap the energy of the luminescent material in the luminescent material, which makes it possible to improve the light emission efficiency of the luminescent material.

To improve the efficiency of the luminescent colors to be displayed by the subpixels 3 having the layered structure described in the present embodiment, it is desirable that the material in the green fluorescent light-emitting layer 34G having the highest content percentage, and desirably all the materials, be a hole transporting material with extremely low electron mobility, as indicated by the arrows in FIGS. 1 and 2 that represent the movement of holes ($h^+$) and electrons ($e^-$). Additionally, it is desirable that the separation layer 35 exhibit bipolar transport properties, where both the hole transport properties and the electron transport properties are high, for the separation layer 35 as a whole. Accordingly, the material contained in the separation layer 35 may be a material exhibiting bipolar transport properties alone, such as a bipolar transporting material. Alternatively, two or more types of a material that alone exhibits hole transport properties in which the hole mobility is higher than the electron mobility, or a material that alone exhibits electron transport properties in which the electron mobility is higher than the hole mobility, may be used in combination so as to exhibit bipolar transport properties as the separation layer 35. Furthermore, it is desirable that the material in the red light-emitting layer 34R having the highest combination ratio, and desirably all of the materials, be a bipolar transporting material, as indicated in FIGS. 1 and 2. However, this material may be a hole transporting material. A bipolar transporting material or a hole transporting material can be used favorably as the material in the blue fluorescent light-emitting layer 34B having the highest combination ratio, and desirably, as all of the materials.

Hole transporting materials such as 4,4'-bis [N-phenyl-N-(3"-methylphenyl) amino] biphenyl (TPD), 9,10-di (2-naphthyl) anthracene (ADN), 1,3-bis (carbazol-9-yl) benzene (mCP), 3,3'-di (9H-carbazol-9-yl) biphenyl (mCBP), and the like can be given as examples of host materials having hole transport properties. Electron transporting materials such as 2,9-dimethyl-4,7-diphenyl-1,10-phenanthroline (BCP), bis [(2-diphenylphosphoryl) phenyl] ether (DPEPO), 4,4'-Bis (2,2-diphenylvinyl)-1,1'-biphenyl (DPVBi), 2,2', 2"-(1,3,5-benztrile)-tris (1-phenyl-benzimidazolyl) (TPBi), bis (2-methyl-8-quinolinolate)-4-(phenylphenolate) aluminum (BAlq), and the like can be given as examples of host materials having electron transport properties. A bipolar transporting material such as 4,4'-bis (9-carbazoyl)-biphenyl (CBP) can be given as an example of a host material having bipolar transport properties.

The luminescent materials in the blue fluorescent light-emitting layer 34B and the green fluorescent light-emitting layer 34G are both fluorescent luminescent materials.

A fluorescent luminescent material that emits blue light, such as 2,5,8,11-tetra-tert-butylperylene (TBPe), bis [4-(9, 9-dimethyl-9,10-dihydroacridine) phenyl] sulfone (DMAC-DPS), perylene, 4,5-bis (carbazol-9-yl)-1,2-dicyanobenzene (2CzPN), or the like can be used as the blue fluorescent luminescent material.

3-(2-benzothiazolyl)-7-(diethylamino) coumarin (coumarin 6), 8-hydroxyquinoline aluminum (Alq 3), 1,2,3,5-tetrakis (carbazol-9-yl)-4,6-dicyano benzene (4CzIPN), 1,2, 3,4-tetrakis (carbazol-9-yl)-5,6-dicyanobenzene (4CzPN), PXZ-DPS indicated in the following formula, and the like can be given as examples of green fluorescent luminescent materials.

[Chemical Formula 1]

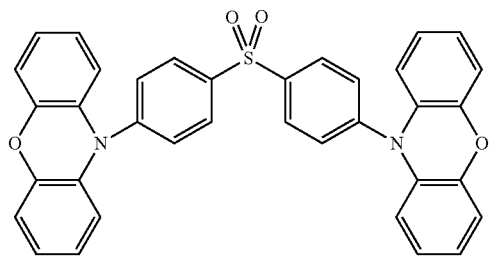

These materials can be given as examples of green fluorescent luminescent.

The red luminescent material may be a phosphorescent luminescent material or a fluorescent luminescent material, as long as the luminescent color is red. However, because the red light-emitting layer 34R does not use energy transfer, a phosphorescent luminescent material or a TADF (Thermally Activated Delayed Fluorescence) material has a high light emission efficiency and is therefore desirable.

The TADF material is a material in which a minimum excited singlet state can be generated through reverse intersystem crossing from a minimum excited triplet state by thermal activation, and is a delayed fluorescent material in which the energy difference $\Delta E_{ST}$ between the $S_1$ level and the $T_1$ level is extremely small. When a delayed fluorescent material in which the energy difference $\Delta E_{ST}$ between the $S_1$ level and the $T_1$ level is extremely small is used for the luminescent material, reverse intersystem crossing from the $T_1$ level to the $S_1$ level occurs due to thermal energy. Using the delayed fluorescence provided by the TADF material can theoretically enhance the internal quantum efficiency to 100%, even in the case of fluorescent light emission. The lower $\Delta E_{ST}$ is, the easier it is for reverse intersystem crossing to arise from the minimum excited triplet state to the minimum excited singlet state, and reverse intersystem crossing can occur comparatively easily, even at room temperature, if $\Delta E_{ST}$ is less than or equal to 0.3 eV.

Tetraphenyldibenzoperilenthene (DBP), (E)-2-{2-[4-(dimethylamino) styryl]-6-methyl-4H-pyran-4-ylidene} malononitrile (DCM), and the like can be given as examples of red fluorescent luminescent materials. Tris (1-phenylisoquinoline) iridium (III) (Ir(piq)3), bis (2-benzo [b] thiophen-2-yl-pyridine) (acetylacetonate) iridium (III) (Ir (btp) 2 (acac)), and the like can be given as examples of red phosphorescent luminescent materials. Examples of the TADF material that emits red light include PPZ-DPO, indicated by the following formula:

[Chemical Formula 2]

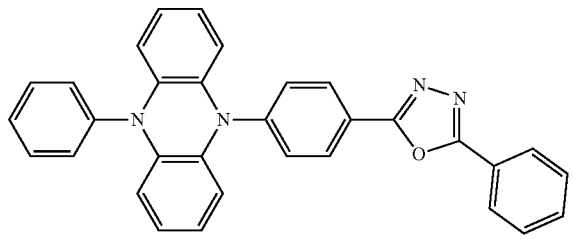

PPZ-DPS, indicated by the following formula:

[Chemical Formula 3]

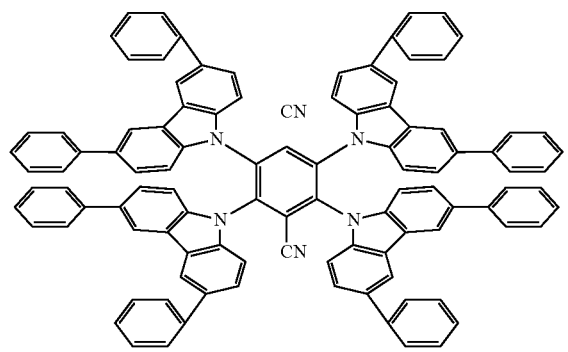

and 4CzTPN-Ph, indicated by the following formula:

[Chemical Formula 4]

These materials can be used.

4,4'-bis (9-carbazoyl)-biphenyl (CBP) or the like, which is one of the above-described bipolar transporting materials, can be given as an example of the separation layer 35.

The thicknesses of the function layers in the light-emitting layer unit 33 are not particularly limited as long as the layers are formed so that the opposing surface distance $D_{GR}$ and the opposing surface distance $D_{BG}$ satisfy the above-described conditions. However, of the light-emitting layer unit 33, it is preferable that the thickness of the blue fluorescent light-emitting layer 34B be set to less than or equal to 10 nm.

Förster transfer is used in the subpixel 3G1, as described earlier. Setting the thickness of the blue fluorescent light-emitting layer 34B to less than or equal to 10 nm ensures that the distance, in the subpixel 3G1, from the molecules of the blue fluorescent luminescent material in the blue fluorescent light-emitting layer 34B that are furthest from the green fluorescent light-emitting layer 34G (i.e., the molecules at the surface of the blue fluorescent light-emitting layer 34B on the side opposite from the side on which the green fluorescent light-emitting layer 34G is located, which in the present embodiment are the molecules of the blue fluorescent luminescent material located on the lower surface of the blue fluorescent light-emitting layer 34B) to green fluorescent luminescent material in the green fluorescent light-emitting layer 34G is less than or equal to 10 nm. In other words, the shortest distances from given positions of the blue fluorescent light-emitting layer 34B to the green fluorescent light-emitting layer 34G are all less than or equal to 10 nm. As such, Förster transfer is possible from the molecules at a given location of the blue fluorescent luminescent material to the green fluorescent luminescent material in the subpixel 3G1. Förster transfer is also possible from, for example, molecules of the blue fluorescent luminescent material located at the surface of the blue fluorescent light-emitting layer 34B on the opposite side from the side on which the green fluorescent light-emitting layer 34G is located.

Hole Injection Layer 31 and Hole Transport Layer 32

The hole injection layer 31 includes a material with hole injecting properties, and has a function of increasing the hole injection efficiency to the light-emitting layer 34. The hole injection layer 31 and the hole transport layer 32 may be formed as mutually independent layers, or may be integrated together as a hole injection-cum-transport layer. It is not necessary that both the hole injection layer 31 and the hole transport layer 32 be provided, and only one (e.g., the hole transport layer 32) may be provided.

A known material can be used as the material of the hole injection layer 31, the hole transport layer 32, or the hole injection-cum-transport layer, that is, as a hole injection material or a hole transporting material.

Examples of such a material include linear or heterocyclic conjugated monomers, oligomers, or polymers such as naphthalene, anthracene, azatriphenylene, fluorenone, hydrazone, stilbene, triphenylene, benzine, styrylamine, triphenylamine, porphyrins, triazole, imidazole, oxadiazole, oxazole, polyarylalkane, phenylenediamine, arylamine, and derivatives thereof, a thiophene-based compound, a polysilane-based compound, a vinyl carbazole-based compound, and an aniline-based compound. Specifically, N,N'-di(naphthalen-1-yl)-N,N'-diphenyl-benzidine (α-NPD), 2,3,6,7,10,11-hexacyano-1,4,5,8,9,12-hexaazatriphenylene (HAT-CN), 1,3-bis(carbazol-9-yl)benzene (mCP), di-[4-(N,N-ditolylamino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium (III) tris[N,N'-diphenylbenzimidazol-2-ylidene-C2,C2'] ($Ir(dpbic)_3$), 4,4',4''-tris-(N-carbazolyl)-triphenylamine (TCTA), 2,2-bis(p-trimellitic oxyphenyl)propanoic anhydride (BTPD), bis[4-(p,p-ditolylamino)phenyl]diphenylsilane (DTASi), or the like is used.

For the hole injection layer 31, the hole transport layer 32, or the hole injection-cum-transport layer, an intrinsic hole injecting material or an intrinsic hole transporting material that is not doped with an impurity may be used. Alternatively, the material may be doped with an impurity to enhance the electrical conductivity.

To achieve highly-efficient light emission, it is desirable that the excitation energy be trapped within the light-emitting layer unit 33, and particularly within the light-emitting layer 34 of the light-emitting layer unit 33. Therefore, it is desirable that as the hole injecting material and the hole transporting material, a material having an $S_1$ level and a $T_1$ level that are excitation levels higher than the $S_1$ level and the $T_1$ level of the luminescent material in the light-emitting layer 34 be used. Therefore, it is more preferable that as the hole injecting material and the hole transporting material, a material having high excitation level and high hole mobility be selected.

Electron Transport Layer 36 and Electron Injection Layer 37

The electron injection layer 37 includes an electron injecting material and has a function of increasing the electron injection efficiency to the light-emitting layer 34.

The electron transport layer 36 includes an electron transporting material and has a function of increasing the electron transport efficiency to the light-emitting layers 34.

The electron injection layer 37 and the electron transport layer 36 may be formed as mutually independent layers, or may be integrated together as an electron injection-cum-transport layer. It is not necessary that both the electron injection layer 37 and the electron transport layer 36 be provided, and only one, e.g., the electron transport layer 36, may be provided. Of course, it is acceptable for neither to be provided as well.

A known material can be used as a material for the electron injection layer 37, the electron transport layer 36, or an electron injection-cum-transport layer, i.e., a material used as the electron injecting material or the electron transporting material.

Examples of the material include quinoline, perylene, phenanthroline, bisstyryl, pyrazine, triazole, oxazole, oxadiazole, fluorenone, and derivatives and metal complexes thereof, and lithium fluoride (LiF).

More specific examples thereof include bis[(2-diphenylphosphoryl)phenyl]ether (DPEPO), 4,7-diphenyl-1,10-phenanthroline (Bphen), 3,3'-bis(9H-carbazole-9-yl)biphenyl (mCBP), 2,9-dimethyl-4,7-diphenyl-1,10-phenanthroline (BCP), 1,3,5-tris(N-phenylbenzoimidazole-2-yl)benzene (TPBI), 3-phenyl-4(1'-naphthyl)-5-phenyl-1,2,4-triazole (TAZ), 1,10-phenanthroline, Alq(tris(8-hydroxyquinoline)aluminum), LiF, and the like.

Protection Layer 24

The protection layer 24 is formed from a transparent insulating material or conductive material. Inorganic insulating materials such as silicon nitride (SiN), silicon oxide (SiO), silicon oxynitride (SiON), and aluminum oxide ($Al_2O_3$), conductive materials such as ITO, and the like can be given as examples of the material of the protection layer 24. Note that the protection layer 24 may have a layered structure including an inorganic insulating layer and an organic insulating layer. A polysiloxane, silicon oxide carbide (SiOC), an acrylate, a polyurea, parylene, a polyimide, a polyamide, and the like can be given as examples of organic insulating materials that can be used as the organic insulating layer.

The thickness of the protection layer 24 is not particularly limited, and may be set as appropriate in accordance with the material so that oxygen, moisture, and the like can be prevented from infiltrating into the organic EL elements 20.

Sealing Substrate 40

An insulating substrate such as a glass substrate or a plastic substrate can be used as the sealing substrate 40. When the organic EL display device 1 is a top-emitting organic EL display device as in the present embodiment, a transparent insulating substrate is used as the sealing substrate 40.

Note that the insulating substrate 11 and the sealing substrate 40 may be flexible insulating films. Using flexible substrates for the insulating substrate 11 and the sealing substrate 40 makes it possible to make the organic EL display device 1 a flexible display or a bendable display.

Note that gap spacers (not shown) may be provided between the TFT substrate 10 and the sealing substrate 40, to prevent the sealing substrate 40 from contacting the TFT substrate 10 and damaging the organic EL elements 20.

Display Method of Organic EL Display Device 1

A display method of the organic EL display device 1 according to the present embodiment will be described next.

As described earlier, the organic EL display device 1 includes a plurality of subpixels 3 in which the organic EL elements 20, which include the light-emitting layers 34 of the respective colors, are provided. A color display is achieved by using the TFTs 12 to selectively cause the organic EL elements 20 in the subpixels 3 to emit light at desired luminances. The emission of light by the subpixels 3 will be described next.

The organic EL display device 1 according to the present embodiment is an active-matrix organic EL display device, and a plurality of the pixels 2 are arranged in a matrix in a display region.

As described above, each pixel 2 includes two types of green subpixels 3 (subpixels 3G), namely the subpixel 3G1 and the subpixel 3G2, and is therefore constituted by four subpixels 3, namely the subpixel 3B, the subpixel 3G1, the subpixel 3G2, and the subpixel 3R.

As illustrated in FIG. 3, in the display region, the pixels 2 have a S-Stripe type pixel arrangement (an S-Stripe arrangement), in which the subpixel 3B is adjacent to the subpixel 3G1 and the subpixel 3R is adjacent to the subpixel 3G2 in a row direction (a first direction), and the subpixel 3B is adjacent to the subpixel 3R and the subpixel 3G1 is adjacent to the subpixel 3G2 in a column direction (a second direction) orthogonal to the row direction. A column constituted by the subpixel 3B and the subpixel 3G1, and a column constituted by the subpixel 3G2 and the subpixel 3R, which are formed along the row direction, are arranged so as to alternate in the column direction. As such, in the display region, the subpixels 3B and the subpixels 3G1 are arranged in an alternating manner in odd-numbered rows, for example, and the subpixels 3R and the subpixels 3G2 are arranged in an alternating manner in even-numbered rows.

According to the present embodiment, employing an S-Stripe type pixel arrangement makes it possible to improve the apparent resolution.

Unlike organic EL display devices having a known S-Stripe type pixel arrangement, the subpixel 3G1 and the subpixel 3G2 have different layered structures in the present embodiment, as illustrated in FIGS. 1, 2, and 4.

In the organic EL display device 1 according to the present embodiment, the holes ($h^+$) and electrons ($e^-$) injected into the organic EL layer 22 from the first electrode 21 and the second electrode 23, respectively, as indicated in FIG. 4, recombine and generate excitons in the blue fluorescent light-emitting layer 34B of the subpixel 3B, as indicated in FIG. 1. The generated excitons give off light upon deactivating and returning to a ground state (denoted as "$S_0$" hereinafter). The subpixel 3B emits blue light as a result.

Additionally, as described earlier, the $S_1$ level of the green fluorescent luminescent material is lower than the $S_1$ level of the blue fluorescent luminescent material. Additionally, a hole transporting material is used for the material having the highest content percentage among the materials in the green fluorescent light-emitting layer 34G, and a bipolar transporting material or a hole transporting material is used for the material having the highest content percentage among the materials in the blue fluorescent light-emitting layer 34B. As such, in the subpixel 3G1, the holes and electrons injected into the organic EL layer 22 from the first electrode 21 and the second electrode 23, respectively, recombine in the green fluorescent light-emitting layer 34G and generate excitons, as indicated in FIG. 1.

Even if, for example, holes and electrons recombine in the blue fluorescent light-emitting layer 34B, energy moves from the blue fluorescent light-emitting layer 34B to the green fluorescent light-emitting layer 34G through Förster transfer between the $S_1$ levels. The green fluorescent light-emitting layer 34G emits light (green light) at substantially 100%, which suppresses the mixing of blue light.

Additionally, as described earlier, a hole transporting material is used for the material having the highest content percentage among the materials in the green fluorescent light-emitting layer 34G, and a bipolar transporting material, for example, is used for the material having the highest content percentage among the materials in the red light-emitting layer 34R and the separation layer 35. Accordingly, in the subpixel 3G2, the holes and electrons injected into the organic EL layer 22 from the first electrode 21 and the second electrode 23, respectively, recombine in the green fluorescent light-emitting layer 34G and generate excitons, as indicated in FIG. 1.

At this time, the $S_1$ level of the green fluorescent luminescent material is higher than the $S_1$ level of the red luminescent material. However, the separation layer 35 inhibits energy transfer from the green fluorescent light-emitting layer 34G to the red light-emitting layer 34R. This suppresses mixing of red light in the subpixel 3G2, so that the subpixel 3G2 emits green light.

Even if, when the blue fluorescent light-emitting layer 34B is formed in common for the subpixel 3B and the subpixel 3G1 through linear deposition (described later), the blue fluorescent light-emitting layer 34B has infiltrated the subpixel 3G1, the green fluorescent light-emitting layer 34G has extremely low electron transport properties, and almost no electrons flow as a result. As such, blue color mixing does not arise in the subpixel 3G2. "Linear deposition" refers to deposition in a linear shape rather than in dot shapes.

Furthermore, as described earlier, a bipolar transporting material, for example, is used for the material having the highest content percentage among the materials in the red light-emitting layer 34R and the separation layer 35. Accordingly, in the subpixel 3R, the holes and electrons injected into the organic EL layer 22 from the first electrode 21 and the second electrode 23, respectively, recombine in the red light-emitting layer 34R and generate excitons, as indicated in FIG. 1. The subpixel 3R emits blue light as a result.

Manufacturing Method for Organic EL Display Device 1

A manufacturing method for the organic EL display device 1 according to the present embodiment will be described next with reference to FIGS. 8 to 11.

Figure 10:
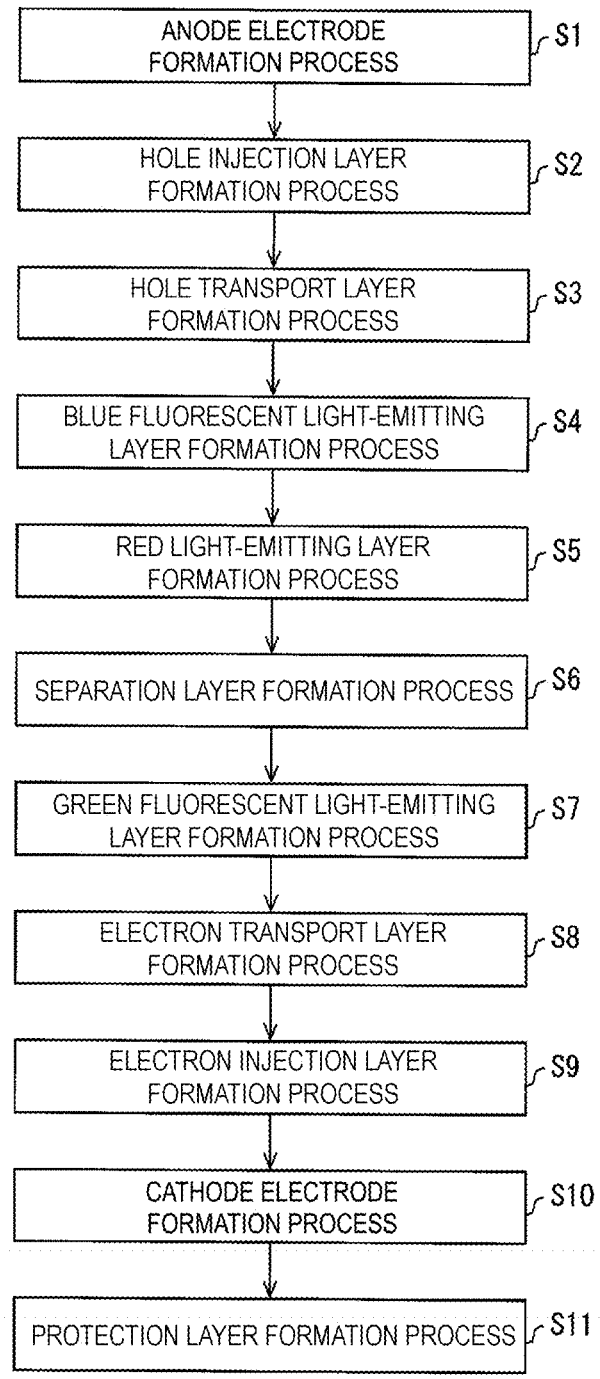
FIG. 10 is a flowchart illustrating the flow of processes for manufacturing main portions of the organic EL display device according to the first embodiment of the disclosure.
Figure 11:
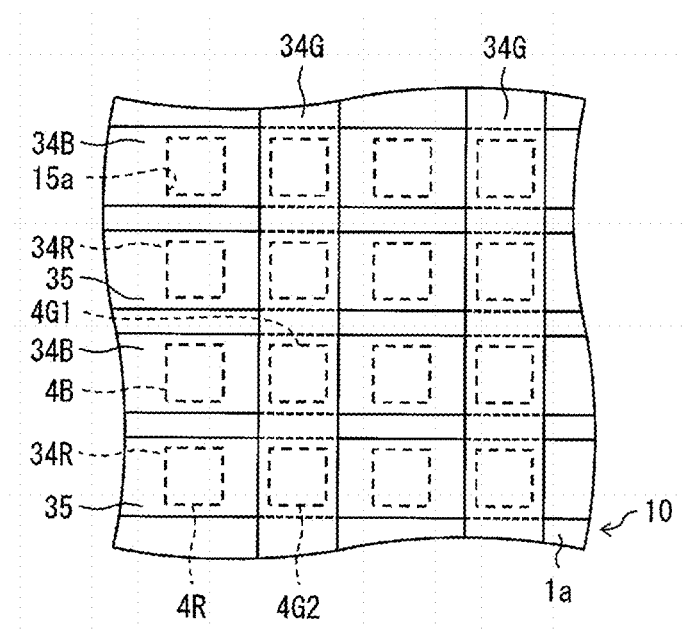
FIG. 11 is a plan view illustrating the layered state of each color of light-emitting layer and the separation layer in the organic EL display device according to Embodiment 1 of the disclosure.

FIGS. 9A to 9C are plan views illustrating processes for manufacturing the light-emitting layer unit 33 in the organic EL display device 1 according to the present embodiment, in the order of those processes. FIG. 10 is a flowchart illustrating the flow of processes for manufacturing main portions of the organic EL display device 1 according to the present embodiment. FIG. 11 is a plan view illustrating the layered state of each color of light-emitting layer 34 and the separation layer 35 in the organic EL display device 1 according to the present embodiment. Note that FIG. 11 illustrates the light-emitting layer 34R and the separation layer 35 as overlapping such that the separation layer 35 serves as the upper layer and the light-emitting layer 34R serves as the lower layer.

Note that in FIGS. 9A to 9C, the same hatching as that indicated in FIG. 3 has been added to the light emitting regions 4 for the purpose of identifying the light emitting region 4B, the light emitting region 4G1, the light emitting region 4G2, and the light emitting region 4R. The actual deposition is carried out through openings 71B, 71R, and 71G (mask openings) in vapor deposition masks 70B, 70R, and 70G, respectively. The light emitting region 4B, the light emitting region 4G1, the light emitting region 4G2, and the light emitting region 4R are positioned within the subpixel 3B, the subpixel 3G1, the subpixel 3G2, and the subpixel 3R, respectively, in that order.

FIG. 11 illustrates only the light-emitting layers 34B, 34R, and 34G, and the openings 15a in the banks 15 corresponding to the light emitting regions 4B, 4G1, 4G2, and 4R, in a display region 1a of the TFT substrate 10, for the sake of simplicity.

The vapor deposition masks 70B, 70R, and 70G will collectively be referred to simply as "vapor deposition masks 70" hereinafter when there is no need to distinguish between the vapor deposition masks 70B, 70R, and 70G. Likewise, the openings 71B, 71R, and 71G will collectively be referred to simply as "openings 71" hereinafter when there is no need to distinguish between the openings 71B, 71R, and 71G.

It is desirable that a slitted mask having slit-shaped openings 71 be used as the vapor deposition masks 70 for depositing the function layers of the light-emitting layer unit 33, and particularly when depositing the light-emitting layers 34. In the present embodiment, a slitted mask is used for each of the vapor deposition masks 70B, 70R, and 70G.

The processes of manufacturing the organic EL display device 1 according to the present embodiment include a TFT substrate preparation process of preparing the above-described TFT substrate 10, an organic EL element preparation process of forming the organic EL elements 20 on the TFT substrate 10, and a sealing process of sealing the organic EL elements 20 prepared in the organic EL element preparation process.

As illustrated in FIG. 10, the organic EL element preparation process includes, for example, an anode electrode formation process (S1), a hole injection layer formation process (S2), a hole transport layer formation process (S3), a blue fluorescent light-emitting layer formation process (S4), a red light-emitting layer formation process (S5), a separation layer formation process (S6), a green fluorescent light-emitting layer formation process (S7), an electron transport layer formation process (S8), an electron injection layer formation process (S9), a cathode electrode formation process (S10), and a protection layer formation process (S11). The organic EL element preparation process is carried out in this order, for example, in the present embodiment. Note that the signs in the parentheses indicate step numbers.

However, as long as the organic EL display device 1 having the layered structure illustrated in FIGS. 1, 2, and 4 can be manufactured, the present embodiment is not limited to the above-described order of manufacturing processes.

First, in the TFT substrate preparation process, a photosensitive resin is applied, using a known technique, to the insulating substrate 11 in which the TFTs 12, the wiring lines 14, and the like are formed, and is then patterned through a photolithography technique to form the interlayer insulating film 13 on the insulating substrate 11.

An acrylic resin, a polyimide resin, or the like can be used as the interlayer insulating film 13, for example. As long as steps produced by the TFTs 12 can be compensated for, the film thickness of the interlayer insulating film 13 is not particularly limited.

Next, the contact hole 13a for electrically connecting the first electrode 21, serving as the anode electrode, to the TFT 12, is formed in the interlayer insulating film 13. The TFT substrate 10 is prepared as a result.

Next, the organic EL elements 20 are formed on the TFT substrate 10 formed in this manner (the organic EL element preparation process).

In the organic EL element preparation process, first, the first electrode 21 is formed on the TFT substrate 10 as the anode electrode (S1).

The anode electrode formation process (S1) according to the present embodiment includes a reflective electrode formation process of forming the reflective electrode 21a on the TFT substrate 10, and a light-transmissive electrode formation process of forming the light-transmissive electrode 21b on the reflective electrode 21a.

Accordingly, in the anode electrode formation process (S1), first, a reflective electrode material is patterned and formed at a prescribed thickness on the TFT substrate 10 as the reflective electrode 21a of the first electrode 21.

The reflective electrode 21a may, for example, be patterned by forming a reflective electrode material as a film through sputtering or the like, using photolithography to form a resist pattern (not shown) for each subpixel 3, etching the layer constituted by the reflective electrode material using the resist patterns as a mask, and then separating the resist pattern on a subpixel 3-by-subpixel 3 basis through peeling and cleaning. Alternatively, a pattern film may be formed through a printing method, vapor deposition using a vapor deposition mask, or the like. For example, vacuum vapor deposition, CVD (chemical vapor deposition), plasma CVD, or the like can be used as the vapor deposition method.

Next, a light-transmissive electrode material is patterned and formed at a prescribed thickness on the reflective electrode 21a as the light-transmissive electrode 21b of the first electrode 21.

It is desirable that the distance between the reflective electrode 21a and the second electrode 23 serving as the cathode electrode be set to a distance that strengthens the intensity of the peak wavelengths of light in the wavelength ranges of the colors of light emitted from the respective subpixels 3.

Figure 8:
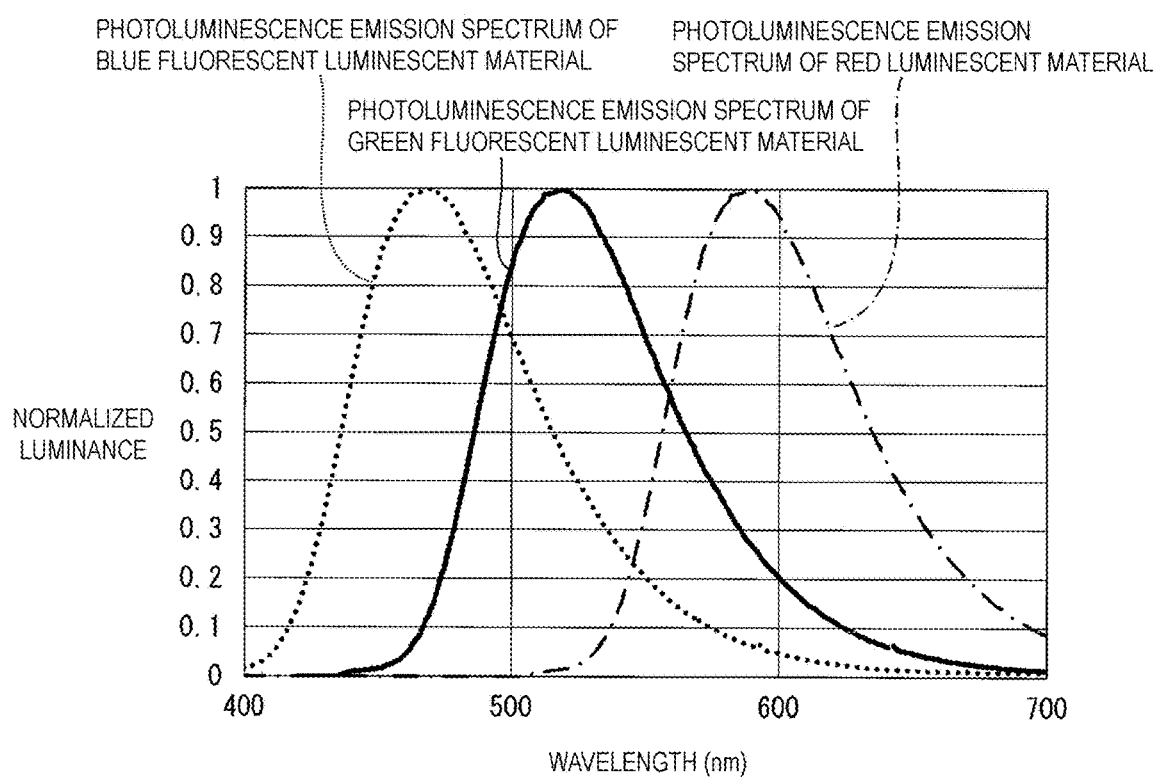
FIG. 8 is a graph illustrating an example of the photoluminescence emission spectrum of the blue fluorescent luminescent material, the photoluminescence emission spectrum of the green fluorescent luminescent material, and a photoluminescence emission spectrum of the red luminescent material.

FIG. 8 is a graph illustrating an example of the PL emission spectrum of the blue fluorescent luminescent material, the PL emission spectrum of the green fluorescent luminescent material, and the PL emission spectrum of the red luminescent material.

Note that FIG. 8 illustrates the PL emission spectrum of TBPe, used in Example 1 defining dimensions, materials, and the mixing ratio of materials (described later), as the PL emission spectrum of the blue fluorescent luminescent material; the PL emission spectrum of coumarin 6, used in Example 1 defining dimensions, materials, and the mixing ratio of materials (described later), as the PL emission spectrum of the green fluorescent luminescent material; and the PL emission spectrum of Ir(piq)3, used in Example 1 defining dimensions, materials, and the mixing ratio of materials (described later), as the PL emission spectrum of the red luminescent material.

As illustrated in FIG. 8, the peak wavelength of the blue fluorescent luminescent material (a first peak wavelength) is approximately 470 nm, the peak wavelength of the green fluorescent luminescent material (a second peak wavelength) is approximately 520 nm, and the peak wavelength of the red luminescent material (a third peak wavelength) is approximately 590 nm.

The organic EL elements 20 according to the present embodiment are microcavity-type organic EL elements. In a microcavity-type organic EL element, emitted light is reflected in multiple between the anode electrode and the cathode electrode and resonated to produce a steep emission spectrum, and the light emission intensity at a specific wavelength is amplified.

A method of varying lengths between two resonance surfaces of organic EL elements (cavity lengths) on a luminescent color-by-luminescent color basis, i.e., varying the optical path length, is known as an example of a method for introducing such a resonance structure (microcavity structure) into organic EL elements.

In the present embodiment, the cavity length is varied on a subpixel 3-by-subpixel 3 basis by setting the thickness of the light-transmissive electrode 21b on a subpixel 3-by-subpixel 3 basis, and the microcavity effect is used to improve the light emission color, the light emission efficiency, and the like.

Accordingly, some of the light emitted from the luminescent materials in each subpixel 3 according to the present embodiment is emitted directly to the exterior, and the remaining light is reflected in multiple and then emitted to the exterior. In other words, the light emitted to the exterior from each subpixel 3 includes: light that is emitted from the luminescent material, and is emitted as-is to the exterior through the light-transmissive electrode (the second electrode 23, in the present embodiment) provided on the side opposite from the side on which the reflective electrode is provided, with the organic EL layer 22 interposed therebetween; and light that is emitted from the luminescent material, is reflected in multiple between the anode electrode and the cathode electrode (and more specifically, between the reflective electrode and the light-transmissive electrode, which in the present embodiment is between the reflective electrode 21a of the first electrode 21 and the second electrode 23), and is then emitted to the exterior through the light-transmissive electrode (the second electrode 23, in the present embodiment) provided on the side opposite from the side on which the reflective electrode is provided.

As such, in the subpixel 3B, the light emitted from the blue fluorescent light-emitting layer 34B is emitted to the exterior, and the light emitted to the exterior at this time includes light obtained by the light emitted from the blue fluorescent light-emitting layer 34B (i.e., light emitted from the blue fluorescent luminescent material) being reflected in multiple between the anode electrode and the cathode electrode in the subpixel 3B. Likewise, in the subpixel 3G1 and the subpixel 3G2, the light emitted from the green fluorescent light-emitting layer 34G is emitted to the exterior; the light emitted to the exterior from the subpixel 3G1 includes light obtained by the light emitted from the green fluorescent light-emitting layer 34G (i.e., light emitted from the green fluorescent luminescent material) being reflected in multiple between the anode electrode and the cathode electrode in the subpixel 3G1, and the light emitted to the exterior from the subpixel 3G2 includes light obtained by the light emitted from the green fluorescent light-emitting layer 34G being reflected in multiple between the anode electrode and the cathode electrode in the subpixel 3G2. Additionally, in the subpixel 3R, the light emitted from the red light-emitting layer 34R is emitted to the exterior, and the light emitted to the exterior at this time includes light obtained by the light emitted from the red light-emitting layer 34R (i.e., light emitted from the red luminescent material) being reflected in multiple between the anode electrode and the cathode electrode in the subpixel 3R.

In the subpixel 3B, the thickness of the light-transmissive electrode 21b is set such that the distance between the reflective electrode 21a and the second electrode 23 is an optimal thickness for emitting light in a blue wavelength range to the exterior (a distance that strengthens the intensity of the peak wavelength of the blue fluorescent luminescent material). Likewise, in the subpixel 3G1 and the subpixel 3G2, the thickness of the light-transmissive electrode 21b is set such that the distance between the reflective electrode 21a and the second electrode 23 is an optimal thickness for emitting light in a green wavelength range to the exterior (a distance that strengthens the intensity of the peak wavelength of the green fluorescent luminescent material); and in the subpixel 3R, the thickness of the light-transmissive electrode 21b is set such that the distance between the reflective electrode 21a and the second electrode 23 is an optimal thickness for emitting light in a red wavelength range to the exterior (a distance that strengthens the intensity of the peak wavelength of the red luminescent material).

The method for changing the thickness of the light-transmissive electrode 21b in each subpixel 3 is not particularly limited. The light-transmissive electrode material may be formed at a desired thickness for each subpixel 3 through vapor deposition, a printing method, or the like; or the light-transmissive electrode material may be formed through sputtering and patterned through photolithography, after which the thickness of each layer constituted by the light-transmissive electrode material is adjusted to the desired thickness through ashing or the like.

As a result, the first electrodes 21, which have a different thickness for each of the subpixels 3, are formed in a matrix on the TFT substrate 10.

Next, the banks 15 are patterned and formed so as to cover the end portions of the first electrodes 21, in the same manner as the interlayer insulating film 13. Through this process, the first electrodes 21 are formed as the anode electrodes, so as to be separated by the bank 15 in each subpixel 3.

The TFT substrate 10 that has gone through the processes described above is then subjected to low-pressure baking to remove moisture, and an oxygen plasma process to clean the surfaces of the first electrodes 21.

Next, the material of the hole injection layer 31 and the material of the hole transport layer 32 are vapor-deposited, in that order, on the entirety of the display region 1a (see FIG. 11) of the TFT substrate 10 on which the first electrodes 21 are formed, as carried out in the past (S2, S3).

Next, the blue fluorescent light-emitting layer 34B is formed on the hole transport layer 32 (S4).

In the blue fluorescent light-emitting layer formation process (S4), the material of the blue fluorescent light-emitting layer 34B is linearly-deposited in the direction connecting the light emitting region 4B and the light emitting region 4G1 adjacent in the row direction (i.e., the direction connecting the subpixel 3B and the subpixel 3G1) using, as the vapor deposition mask 70B for forming the blue fluorescent light-emitting layer, a slitted mask having the slit-shaped openings 71B in which the openings are longer in the above-described first direction, which is provided spanning a plurality of the pixels 2 so as to connect the light emitting region 4B and the light emitting region 4G1 adjacent in the row direction (the first direction) (i.e., directly adjacent); as a result, the blue fluorescent light-emitting layer 34B is formed in the light emitting region 4B and the light emitting region 4G1 indicated by the broken lines in FIG. 9A.

In the present embodiment, the following descriptions of the method of manufacturing the organic EL display device 1 can be given with equivalent meaning by replacing "light emitting regions 4", "light emitting region 4B", "light emitting region 4G1", "light emitting region 4G2", and "light emitting region 4R" with "subpixels 3", "subpixel 3B", "subpixel 3G1", "subpixel 3G2", and "subpixel 3R", respectively.

Assuming, for example, that the light emitting region 4B and the light emitting region 4G1 provided in the same pixel 2 constitute a single set, the openings 71B are formed corresponding to a plurality of sets of the light emitting regions 4 connected in the row direction, so as to connect, in an alternating manner, the light emitting regions 4B and the light emitting regions 4G1 within the same pixel 2 and in the pixels 2 adjacent in the row direction.

The number of pixels 2 is not illustrated in FIGS. 9A to 9C and 11 for the sake of simplicity. Thus the example in FIG. 9A illustrates a case where a plurality of the openings 71B are formed spanning the light emitting regions 4B and the light emitting regions 4G1 corresponding to two pixels arranged in the row direction (i.e., the light emitting regions 4B and the light emitting regions 4G1 corresponding to four subpixels).

However, each of the openings 71B may be formed corresponding to the light emitting regions 4B and the light emitting regions 4G1 in three or more pixels 2 arranged consecutively in the row direction, and may, for example, be formed continuously from one end of the display region 1a of the TFT substrate 10 to the other end of the display region 1a with respect to the row direction.

Accordingly, the openings 71B may be formed as intermittent stripes along the row direction so as to correspond to the light emitting regions 4B and the light emitting regions 4G1 in a plurality of pixels 2 arranged in the row direction, or may be formed as continuous stripes from one end to the other end of the display region 1a with respect to the row direction.

In either case, in the blue fluorescent light-emitting layer formation process (S4), the blue fluorescent light-emitting layer 34B is formed having the same pattern as the openings 71B in the vapor deposition mask 70B when viewed in a plan view (i.e., when viewed from a direction perpendicular to the mask surface of the vapor deposition mask 70). As a result, in the present embodiment, a line-shaped blue fluorescent light-emitting layer 34B spanning a plurality of pixels along the row direction is formed in subpixel columns of odd-numbered rows that constitute the subpixel 3B and the subpixel 3G1, as illustrated in FIG. 11.

Next, the red light-emitting layer 34R is formed on the hole transport layer 32 parallel to the blue fluorescent light-emitting layer 34B (S5).

In the red light-emitting layer formation process (S5), the material of the red light-emitting layer 34R is linearly-deposited in the direction connecting the light emitting region 4R and the light emitting region 4G2 adjacent in the row direction using, as the vapor deposition mask 70R for forming the red light-emitting layer, a slitted mask having the slit-shaped openings 71R in which the openings are longer in the above-described first direction, which is provided spanning a plurality of the pixels 2 so as to connect the light emitting region 4R and the light emitting region 4G2 adjacent in the row direction (the first direction) (i.e., directly adjacent); as a result, the red light-emitting layer 34R is formed in the light emitting region 4R and the light emitting region 4G2 indicated by the broken lines in FIG. 9B.

Assuming, for example, that the light emitting region 4R and the light emitting region 4G2 provided in the same pixel 2 constitute a single set, the openings 71R are formed corresponding to a plurality of sets of the light emitting regions 4 connected in the row direction, so as to connect, in an alternating manner, the light emitting regions 4R and the light emitting regions 4G" within the same pixel 2 and in the pixels 2 adjacent in the row direction.

As described above, the number of pixels 2 is not illustrated in FIGS. 9A to 9C and 11 for the sake of simplicity. Thus the example in FIG. 9B illustrates a case where a plurality of the openings 71R are formed spanning the light emitting regions 4R and the light emitting regions 4G2 corresponding to two pixels arranged in the row direction (i.e., the light emitting regions 4R and the light emitting regions 4G2 corresponding to four subpixels).

However, each of the openings 71R may be formed corresponding to the light emitting regions 4R and the light emitting regions 4G2 in three or more pixels 2 arranged consecutively in the row direction, and may, for example, be formed continuously from one end of the display region 1a of the TFT substrate 10 to the other end of the display region 1a with respect to the row direction.

Accordingly, the openings 71R may be formed as intermittent stripes along the row direction so as to correspond to the light emitting regions 4R and the light emitting regions 4G2 in a plurality of pixels 2 arranged in the row direction, or may be formed as continuous stripes from one end to the other end of the display region 1a with respect to the row direction.

In either case, in the red light-emitting layer formation process (S5), the red light-emitting layer 34R is formed having the same pattern as the openings 71R in the vapor deposition mask 70R when viewed in a plan view. As a result, in the present embodiment, a line-shaped red light-emitting layer 34R spanning a plurality of pixels along the row direction is formed, parallel to the blue fluorescent light-emitting layer 34B, in subpixel columns of even-numbered rows that constitute the subpixel 3R and the subpixel 3G2, as illustrated in FIG. 11.

Next, the material of the separation layer 35 is deposited linearly in a direction connecting the light emitting region 4R and the light emitting region 4G2, using the vapor deposition mask 70R for forming the red light-emitting layer, on the red light-emitting layer 34R. As a result, the separation layer 35 having the same pattern as the red light-emitting layer 34R when viewed in a plan view is layered upon the red light-emitting layer 34R, as illustrated in FIG. 11 (S6).

Note that in the present embodiment, the red light-emitting layer 34R and the separation layer 35 have the same pattern when viewed in a plan view, and thus an example in which the red light-emitting layer 34R and the separation layer 35 are formed consecutively using the same vapor deposition mask 70R has been described as an example. However, the present embodiment is not limited thereto. The red light-emitting layer 34R and the separation layer 35 may be patterned and formed using separate dedicated vapor deposition masks having the same opening pattern.

Next, the green fluorescent light-emitting layer 34G is formed on the hole transport layer 32 so as to intersect (be orthogonal to) both the blue fluorescent light-emitting layer 34B and the separation layer 35 (S7).

In the green fluorescent light-emitting layer formation process (S7), the material of the green fluorescent light-emitting layer 34G is linearly-deposited in the direction connecting the light emitting region 4G1 and the light emitting region 4G2 adjacent in the column direction using, as the vapor deposition mask 70G for forming the green fluorescent light-emitting layer, a slitted mask having the slit-shaped openings 71G in which the openings are longer in the above-described second direction, which is provided spanning a plurality of the pixels 2 so as to connect the light emitting region 4G1 and the light emitting region 4G2 adjacent in the column direction (the second direction) (i.e., directly adjacent); as a result, the green fluorescent light-emitting layer 34G is formed in the light emitting region 4G1 and the light emitting region 4G2 indicated by the broken lines in FIG. 9C.

Assuming, for example, that the light emitting region 4G1 and the light emitting region 4G2 provided in the same pixel 2 constitute a single set, the openings 71G are formed corresponding to a plurality of sets of the light emitting regions 4 connected in the column direction, so as to connect, in an alternating manner, the light emitting regions 4G1 and the light emitting regions 4G2 within the same pixel 2 and in the pixels 2 adjacent in the column direction.

The example in FIG. 9C illustrates a case where a plurality of the openings 71G are formed spanning the light emitting regions 4G1 and the light emitting regions 4G2 corresponding to two pixels arranged in the column direction (i.e., the light emitting regions 4G1 and the light emitting regions 4G2 corresponding to four subpixels).

However, each of the openings 71G may be formed corresponding to the light emitting regions 4G1 and the light emitting regions 4G2 in three or more pixels 2 arranged consecutively in the column direction, and may, for example, be formed continuously from one end of the display region 1a of the TFT substrate 10 to the other end of the display region 1a with respect to the column direction.

Accordingly, the openings 71G may be formed as intermittent stripes along the column direction so as to correspond to the light emitting regions 4G1 and the light emitting regions 4G2 in a plurality of pixels 2 arranged in the column direction, or may be formed as continuous stripes from one end to the other end of the display region 1a with respect to the column direction.

In either case, in the green fluorescent light-emitting layer formation process (S7), the green fluorescent light-emitting layer 34G is formed having the same pattern as the openings 71G in the vapor deposition mask 70G when viewed in a plan view. Thus in the present embodiment, the green fluorescent light-emitting layer 34G is formed as a line following the column direction, overlapping the blue fluorescent light-emitting layer 34B in the subpixel 3G1 and overlapping the separation layer 35 in the subpixel 3G2, in subpixel columns of even-numbered columns constituted by the subpixels 3G1 and the subpixels 3G2, as illustrated in FIG. 11.

The light-emitting layers 34 can be formed as follows, for example. First, when viewed in a plan view, each of the vapor deposition masks 70 (specifically, the vapor deposition masks 70R, 70G, and 70B, for example), which are substantially the same size as the TFT substrate 10, are aligned with respect to the TFT substrate 10 and then affixed to the TFT substrate 10 in contact with the TFT substrate 10. Then, while rotating the TFT substrate 10 and the vapor deposition masks 70 together, vapor deposition particles dispersed from a vapor deposition source (not illustrated) are vapor-deposited uniformly across the entire surface of the display region 1a through the openings 71 in the vapor deposition masks 70.

Alternatively, the light-emitting layers 34 may be formed as follows. First, the vapor deposition masks 70 are aligned with respect to the TFT substrate 10 and then affixed to the TFT substrate 10 in contact with the TFT substrate 10. Then, vapor deposition particles dispersed from a vapor deposition source are vapor-deposited uniformly across the entire surface of the display region 1a through the openings 71 in the vapor deposition masks 70 by moving the TFT substrate 10 and vapor deposition masks 70, the vapor deposition source, or both relative to each other.

Additionally, the light-emitting layers 34 may be formed by using vapor deposition masks smaller than the TFT substrate 10 as the vapor deposition masks 70 and carrying out stepwise deposition, in which the vapor deposition masks 70 are moved in order relative to the TFT substrate 10 and brought into contact with the TFT substrate 10 each time.

Note that metal masks formed from a metal or composite masks containing metal can be used as the vapor deposition masks 70, for example. When using such masks as the vapor deposition masks 70, disposing a magnet such as a magnet plate or a magnetism generating source such as an electromagnet on the side of the vapor deposition mask 70 opposite from the side where the TFT substrate 10 is located and then attaching and holding the vapor deposition mask 70 through magnetic force makes it possible to fix the vapor deposition masks 70 to the TFT substrate 10 in contact with the TFT substrate 10 when forming the light-emitting layers 34. However, the present embodiment is not limited thereto, and it goes without saying that resin-based vapor deposition masks may be used as the vapor deposition masks 70.

Then, the material of the electron transport layer 36 and the material of the electron injection layer 37 are vapor-deposited, in that order, on the entirety of the display region 1a of the TFT substrate 10 on which the above-described colors of light-emitting layers 34 are formed, as carried out in the past (S8, S9).

Next, the second electrode 23 is formed as the cathode electrode on the entirety of the display region 1a in the TFT substrate 10, so as to cover the electron injection layer 37 (S10).

Vapor deposition such as vacuum vapor deposition, CVD, plasma CVD, or the like, sputtering, a printing method, or the like may be used to form the second electrode 23.

Then, the material of the protection layer 24 is vapor-deposited on the entirety of the display region 1a in the TFT substrate 10, so as to cover the second electrode 23 (S11). The organic EL elements 20 are formed on the TFT substrate 10 as a result.

The TFT substrate 10 on which the organic EL elements 20 are formed and the sealing substrate 40 are then affixed to each other by a filler layer and a sealing member (not shown), as illustrated in FIG. 4, by carrying out the sealing process. The organic EL display device 1 according to the present embodiment is obtained in this manner.

However, the method of sealing the organic EL elements 20 is not limited to the method described above, and various known sealing methods can be employed instead.

In the present embodiment, the reflective electrode 21a, the light-transmissive electrode 21b, the hole injection layer 31, the hole transport layer 32, the blue fluorescent light-emitting layer 34B, the red light-emitting layer 34R, the separation layer 35, the green fluorescent light-emitting layer 34G, the electron transport layer 36, the electron injection layer 37, the second electrode 23, and the protection layer 24 were layered, in that order from the TFT substrate 10 side, on the TFT substrate 10, on the basis of the flowchart illustrated in FIG. 10, as Example 1 defining dimensions, materials, and the mixing ratio of materials.

Materials for the layers layered on the TFT substrate 10 and thicknesses thereof in Example 1 defining dimensions, materials, and the mixing ratio of materials are as follows. However, the dimensions and materials denoted below are merely examples, and the present embodiment is not intended to be limited to these specific dimensions and materials. The following assumes that the thickness of the light-transmissive electrode 21b has been optically optimized through optical simulations to align the luminescent color of the subpixel 3G1 and the luminescent color of the subpixel 3G2.

Example 1: Defining Dimensions, Materials, and Mixing Ratio of Materials

Reflective electrode 21a (first electrode 21; anode electrode): Ag (100 nm) Light-transmissive electrode 21b (first electrode 21, anode electrode): ITO (subpixel 3B: 135 nm/subpixel 3G1: 160 nm/subpixel 3G2: 145 nm/subpixel 3R: 40 nm)

Hole injection layer 31: HAT-CN (10 nm)
Hole transport layer 32: TCTA (20 nm)
Blue fluorescent light-emitting layer 34B: ADN (host material, 90%)/TBPe (blue fluorescent luminescent material, 10%) (10 nm)
Red light-emitting layer 34R: CBP (host material 90%)/Ir(piq)3 (red luminescent material, 10%) (10 nm)
  Separation layer 35: CBP (20 nm)
  Green fluorescent light-emitting layer 34G: TPD (host material, 90%)/coumarin 6 (green fluorescent luminescent material, 10%) (10 nm)
  Electron transport layer 36: BCP (30 nm)
  Electron injection layer 37: LiF (1 nm)
  Second electrode 23 (cathode electrode, semitransparent electrode): Ag—Mg alloy (Ag/Mg mixing ratio=0.9/0.1) (20 nm)
  Protection layer 24: ITO (80 nm)

As described above, in the present embodiment, the blue fluorescent light-emitting layer 34B, the green fluorescent light-emitting layer 34G, and the red light-emitting layer 34R are common light-emitting layers that are each common to two of the subpixels 3 in each pixel 2. By using common light-emitting layers, light emission is achieved using the Förster-type energy transfer of the fluorescent luminescent material and the transferrable distance thereof, while improving the productivity.

As described above, according to the present embodiment, in the subpixel 3G2, the blue fluorescent light-emitting layer 34B and the green fluorescent light-emitting layer 34G are layered, but the green fluorescent luminescent material has a lower $S_1$ level than the blue fluorescent luminescent material, and the opposing surface distance $D_{BG}$ between the blue fluorescent light-emitting layer 34B and the green fluorescent light-emitting layer 34G is less than or equal to the Förster radius. As such, even if, for example, holes and electrons recombine in the blue fluorescent light-emitting layer 34B, the Förster transfer enables the green fluorescent luminescent material to emit light at substantially 100% while suppressing color mixing.

In the subpixel 3R, the green fluorescent light-emitting layer 34G and the red light-emitting layer 34R are layered, but the green fluorescent light-emitting layer 34G and the red light-emitting layer 34R are layered with the separation layer 35 (the intermediate layer) interposed therebetween. Energy transfer from the red light-emitting layer 34R to the green fluorescent light-emitting layer 34G is inhibited as a result, which makes it possible to suppress color mixing.

In an organic EL display device having an S-Stripe arrangement that does not employ the above-described layered structure, linear deposition can only be carried out for subpixel columns constituted by green subpixels. To rephrase, in an organic EL display device having an S-Stripe arrangement lacking the above-described layered structure, a slitted mask can only be used to form the light-emitting layer of a single color.

However, according to the present embodiment, the subpixel 3G1 and the subpixel 3G2 have the above-described layered structure. Therefore, as described above, linear deposition can be carried out not only in the direction connecting the light emitting region 4G1 and the light emitting region 4G2, but also in the direction connecting the light emitting region 4B and the light emitting region 4G1 and in the direction connecting the light emitting region 4G2 and the light emitting region 4R. In other words, according to the present embodiment, linear deposition can be carried out not only in the direction connecting the subpixel 3G1 and the subpixel 3G2, but also in the direction connecting the subpixel 3B and the subpixel 3G1 and in the direction connecting the subpixel 3G2 and the subpixel 3R. This makes it possible to suppress color mixing in those directions.

That is to say, according to the present embodiment, a slitted mask can be used for any of the blue fluorescent light-emitting layer formation process (S4), the red light-emitting layer formation process (S5), and the green fluorescent light-emitting layer formation process (S7). Thus according to the present embodiment, a slitted mask can be used in the formation of a plurality of light-emitting layers 34 having different colors, the luminescent colors of which have different peak wavelengths (i.e., can be used in at least two of the processes of S4, S5, and S7), unlike in the past.

Going even further, according to the present embodiment, a slitted mask can, as described above, be used to form all of the light-emitting layers 34, unlike in the past.

Thus according to the present embodiment, linear deposition is possible for a plurality of light-emitting layers 34 having different colors, and furthermore for all of the light-emitting layers 34, which has not been possible with organic EL display devices having S-Stripe arrangements lacking the above-described layered structure.

Furthermore, according to the present embodiment, the light-emitting layers 34 and the separation layer 35 in all of the RGB subpixels 3, which are arranged having an S-Stripe arrangement, can be deposited using a slitted mask having the slit-shaped openings 71 provided spanning a plurality of the pixels 2, as described above. Thus according to the present embodiment, a slitted mask can be used to form not only the light-emitting layers 34, but also all of the layers constituting the light-emitting layer unit 33, as described above.

Using slitted masks for the vapor deposition masks 70 in this manner makes it possible to reduce non-opening patterns (e.g., metal patterns) between adjacent subpixels 3 deposited at the same time, in known vapor deposition masks for forming light-emitting layers.

The present embodiment describes, as an example, a case where a slitted mask, which has the openings 71 including slit-shaped openings 71 provided spanning a plurality of the pixels 2 (e.g., four light emitting regions 4), is used to form all of the layers constituting the light-emitting layer unit 33. However, the present embodiment is not limited thereto.

A vapor deposition mask 70 in which the openings 71 are provided for two subpixels, corresponding to the subpixel 3B and the subpixel 3G1 in each of the pixels 2, for example, may be used as the vapor deposition mask 70. non-opening patterns between adjacent subpixels 3 within each of the pixels 2 can be eliminated when forming the light-emitting layers 34 for each of the pixels 2 in this manner. Thus in this case as well, non-opening patterns between adjacent subpixels 3 deposited at the same time can be reduced in known vapor deposition masks for forming light-emitting layers.

Of course, when forming some of the light-emitting layers 34 among the blue fluorescent light-emitting layer 34B, the red light-emitting layer 34R, and the green fluorescent light-emitting layer 34G, a normal vapor deposition mask having an opening pattern in which individual openings 71 are provided for each subpixel may be used as the vapor deposition mask 70.

For example, of the function layers constituting the light-emitting layer unit 33, the green fluorescent light-emitting layer 34G may be deposited using the above-described normal vapor deposition mask, and the other function layers may be formed using the above-described slitted mask. This makes it possible to linearly-deposit the blue fluorescent light-emitting layer 34B and linearly-deposit the red light-emitting layer 34R, which cannot be carried out in an organic EL display device having an S-Stripe arrangement that lacks the above-described layered structure.

However, using slitted masks having slit-shaped openings 71 provided spanning a plurality of pixels 2 as the vapor deposition masks 70 is advantageous, compared to a case where the light-emitting layers 34 are formed for each of the pixels 2 as described above, in that non-opening patterns in the vapor deposition masks between adjacent pixels 2 can be eliminated.

According to the present embodiment, shadowing dependent on the thicknesses of the above-described non-opening pattern between adjacent subpixels 3 and the non-opening pattern between adjacent pixels 2 can be eliminated, and variations in film thickness within subpixels 3 can be reduced.

Additionally, according to the present embodiment, the deposition margin for preventing color mixing can be reduced; additionally, when forming the light-emitting layers 34, the resolution can be improved by reducing the pitch of the subpixels 3 adjacent within each of the openings 71, and the surface area of the subpixels 3 can be broadened and current stress reduced while providing the same resolution, which makes it possible to lengthen the lifespan of the organic EL elements 20.

Thus according to the present embodiment, the blue fluorescent light-emitting layer 34B, the green fluorescent light-emitting layer 34G, and the red light-emitting layer 34R can be linearly deposited, and color mixing does not arise easily despite the light-emitting layers 34 having the layered structures described above. Accordingly, the deposition margin for preventing color mixing can be reduced more than in display devices using known separate-patterning techniques, and a higher resolution can be achieved than in display devices using known separate-patterning techniques.

Additionally, the organic EL display device 1 does not require a CF layer or an optical interference effect as with the white CF technique or PTL 1, despite having the above-described layered structure for the light-emitting layers. This makes it possible to avoid a situation where more power is consumed, the light distribution properties worsen, and the like. Therefore, a high color level and low power consumption can be achieved at the same time.

Thus according to the present embodiment, it is possible to provide a display device that can reduce the deposition margin for preventing color mixing by making color mixing less likely than in display devices using the known separate-patterning technique, thereby achieving higher resolutions more easily, and that can achieve both high color levels and low power consumption.

Modified Example

The present embodiment describes an example in which the display device according to the present embodiment is an organic EL display device. However, the display device according to the present embodiment may be any display device employing PL light emission. The display device according to the present embodiment is therefore not limited to the above-described examples, and may be, for example, an inorganic EL display device, a display device aside from an EL display device that employs PL light emission, or the like. Furthermore, inorganic materials may be used for the luminescent materials, and inorganic layers may be formed instead of organic layers.

The present embodiment describes forming the blue fluorescent light-emitting layer 34B as the first light-emitting layer containing the first fluorescent luminescent material, forming the green fluorescent light-emitting layer 34G as the second light-emitting layer containing the second fluorescent luminescent material, and forming the red light-emitting layer 34R as the third light-emitting layer containing the third luminescent material. However, the present embodiment is not limited thereto. The combination of the first fluorescent luminescent material, the second fluorescent luminescent material, and the third luminescent material is not limited to a combination of the blue fluorescent luminescent material, the green fluorescent luminescent material, and the red luminescent material. Any combination may be used as long as the second fluorescent luminescent material emits light having a peak wavelength (second peak wavelength) longer than the peak wavelength of the light emitted from the first fluorescent luminescent material (first peak wavelength), the third luminescent material emits light having a peak wavelength (third peak wavelength) longer than the second peak wavelength, and the $S_1$ level of the second fluorescent luminescent material is lower than the $S_1$ level of the first fluorescent luminescent material and higher than the $S_1$ level of the third luminescent material.

Second Embodiment

A description follows regarding another embodiment of the disclosure, primarily on the basis of FIGS. 1 to 4, 10 and 12 to 14.

The present embodiment will describe differences from the first embodiment, and constituent elements having the same functions as the constituent elements described in the first embodiment will be assigned the same reference signs, with descriptions thereof omitted. It goes without saying that the same modifications as those of the first embodiment can be applied to the present embodiment as well.

Overall Configuration of Organic EL Display Device 1

Figure 12:
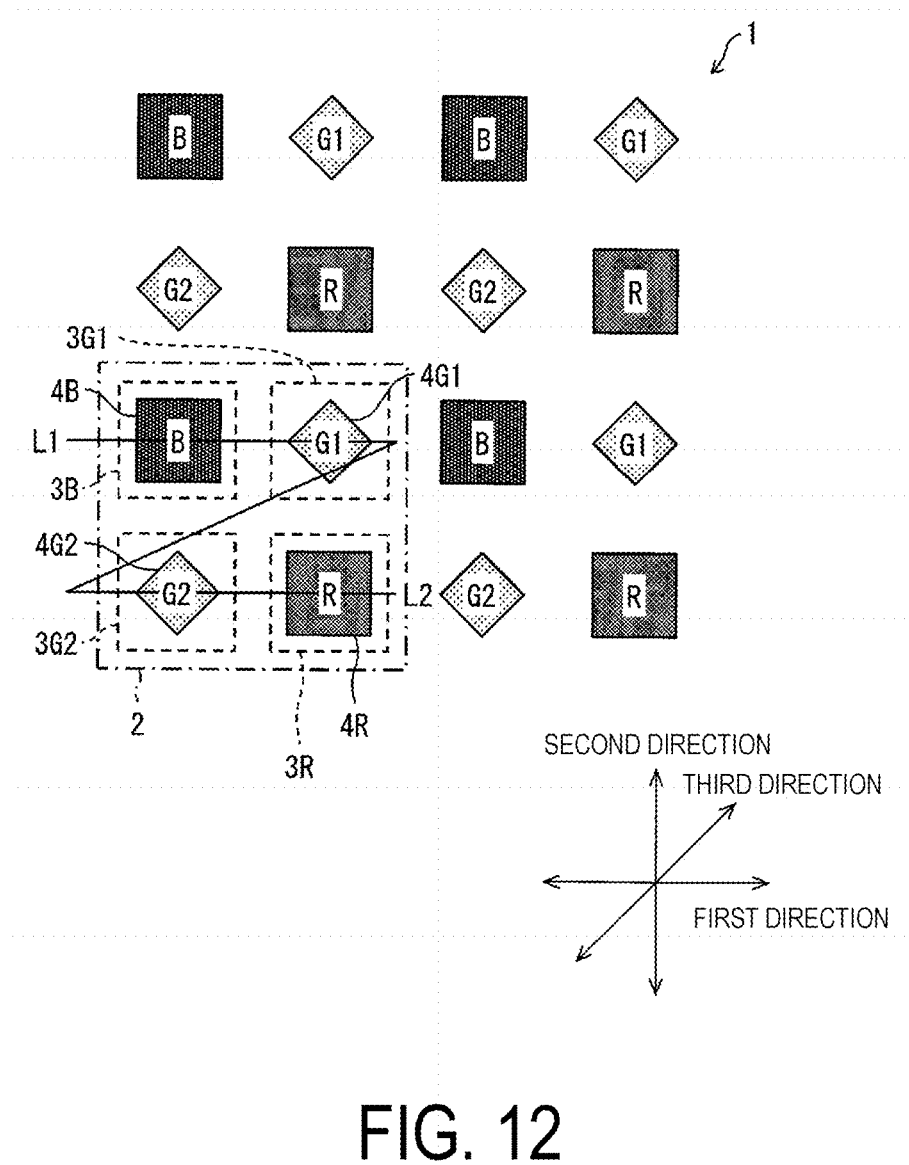
FIG. 12 is a diagram schematically illustrating a pixel arrangement in an organic EL display device according to Embodiment 2 of the disclosure.

FIG. 12 is a diagram schematically illustrating a pixel arrangement in the organic EL display device 1 according to the present embodiment.

Embodiment 1 describes a case where the organic EL display device 1 has an S-Stripe arrangement as an example. However, as illustrated in FIG. 12, the organic EL display device 1 may have a PenTile-type pixel arrangement (PenTile arrangement), in which the subpixel 3G1 is adjacent to the subpixel 3B in the row direction (the first direction) and adjacent to the subpixel 3R in the column direction, the subpixel 3G2 is adjacent to the subpixel 3R in the row direction and adjacent to the subpixel 3B in the column direction (e.g., a direction orthogonal to the row direction; the second direction), and the subpixel 3B is adjacent to the subpixel 3R, and the subpixel 3G1 to the subpixel 3G2, in an oblique direction (a third direction) intersecting with the row direction and the column direction (specifically, intersecting with those directions at an angle of 45 degrees).

Note that a PenTile arrangement has a configuration in which, in the display region 1a, the pixels 2 are arranged such that in the row direction, the subpixel 3B is adjacent to the subpixel 3G1 and the subpixel 3G2 is adjacent to the subpixel 3R, and in the column direction, the subpixel 3B is adjacent to the subpixel 3G2 and the subpixel 3G1 is adjacent to the subpixel 3R. A column constituted by the subpixel 3B and the subpixel 3G1, and a column constituted by the subpixel 3G2 and the subpixel 3R, which are formed along the row direction, are arranged so as to alternate in the column direction. Accordingly, in the display region, the respective colors of the subpixels 3 repeat in the row direction such that the subpixel 3B and the subpixel 3G1 are arranged in an alternating manner in odd-numbered rows, and the subpixel 3G2 and the subpixel 3R are arranged in an alternating manner in even-numbered rows, for example, in the PenTile arrangement as well, in the same manner as an S-Stripe arrangement.

These arrangements make use of the fact that human vision is less sensitive to R and B and more sensitive to G. As illustrated in FIGS. 3 and 12, in these arrangements, each row is constituted by two colors at a time, namely the subpixel 3B and the subpixel 3G1 or the subpixel 3G2 and the subpixel 3R. Also, in each row, subpixels of colors lacking as compared to RGB arrangements are reproduced in a simulated manner through combinations with subpixels in adjacent rows.

Thus in these arrangements, the dot width of the subpixels 3 in each row can be increased in the row direction by an amount corresponding to the subpixels of the colors lacking, as compared to a vertical stripe-type RGB arrangement. Accordingly, a high-resolution organic EL display device 1 can be manufactured with ease, and a resolution that appears high can be maintained, even with a lower number of pixels.

Unlike an organic EL display device having a known PenTile arrangement, the subpixel 3G1 and the subpixel 3G2 in the organic EL display device 1 according to the present embodiment have a different layered structure, as illustrated in FIGS. 1, 2, and 4.

Manufacturing Method for Organic EL Display Device 1

Figure 13A:
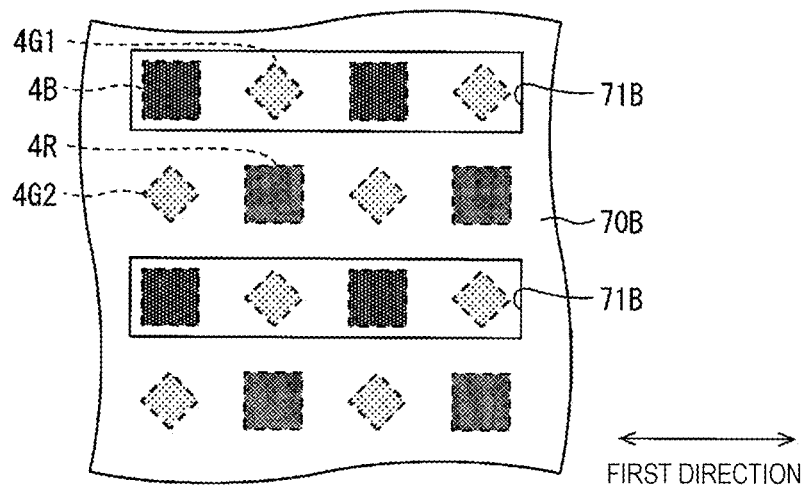
FIGS. 13A to 13C are plan views illustrating processes for manufacturing the light-emitting layer unit in the organic EL display device according to Embodiment 2 of the disclosure, in the order of those processes.
Figure 13B:
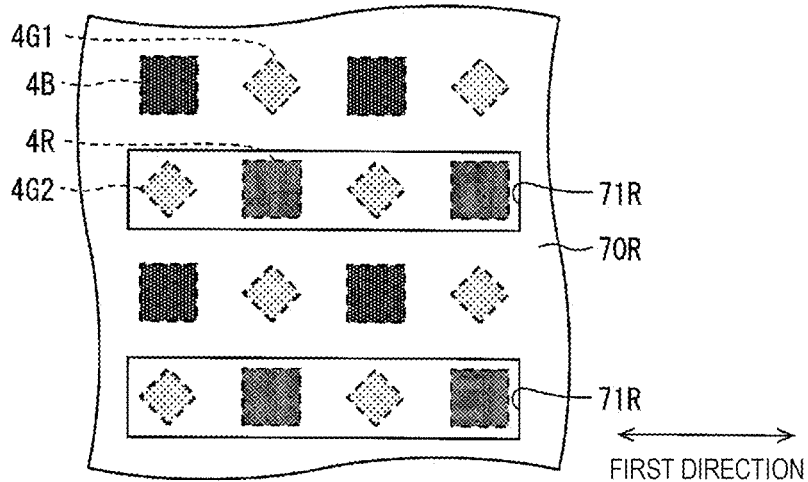
Figure 13C:
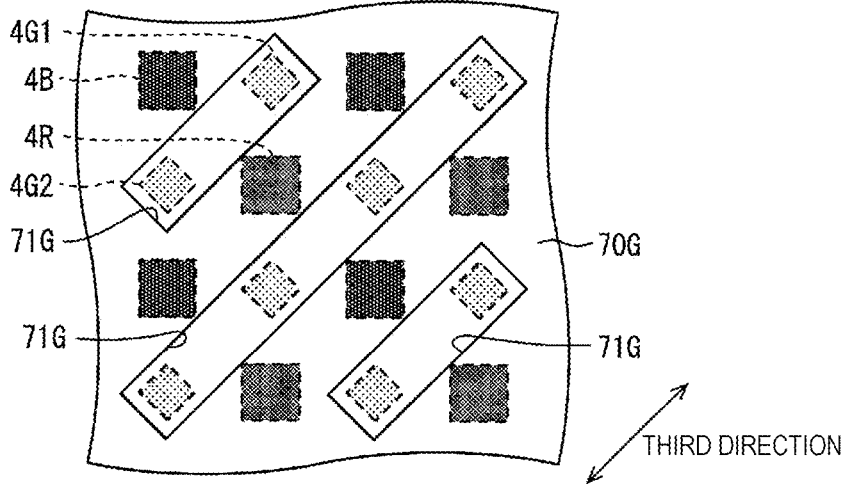
Figure 14:
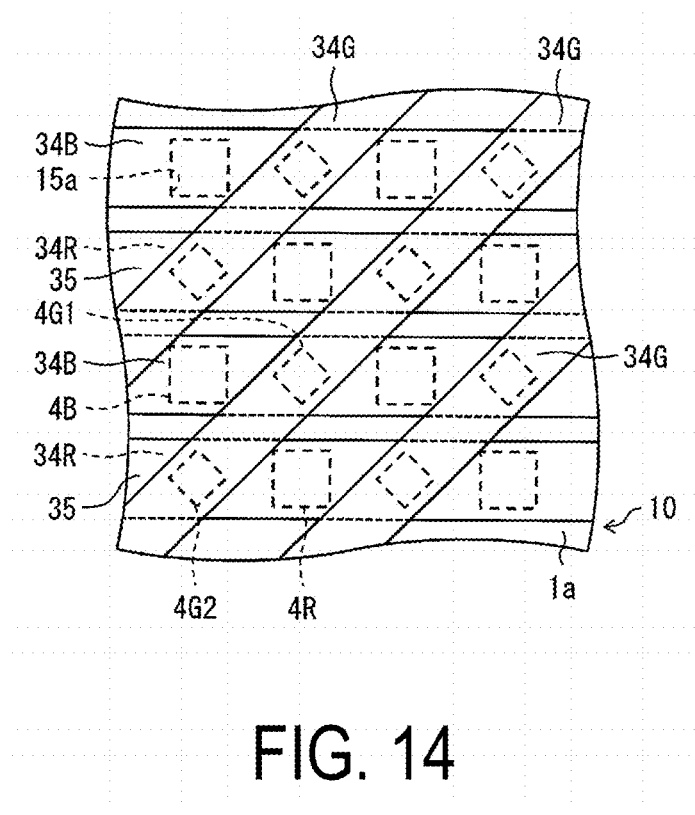
FIG. 14 is a plan view illustrating the layered state of each color of light-emitting layer and the separation layer in the organic EL display device according to Embodiment 2 of the disclosure.

FIGS. 13A to 13C are plan views illustrating processes for manufacturing the light-emitting layer unit 33 in the organic EL display device 1 according to the present embodiment, in the order of those processes. FIG. 14 is a plan view illustrating the layered state of each color of light-emitting layer 34 and the separation layer 35 in the organic EL display device 1 according to the present embodiment. Note that FIG. 14 illustrates the light-emitting layer 34R (indicated as "34R (34)" in FIG. 1) and the separation layer 35 as overlapping such that the separation layer 35 serves as the upper layer and the light-emitting layer 34R serves as the lower layer.

Note that in FIGS. 13A to 13C, the same hatching as that indicated in FIG. 12 has been added to the light emitting regions 4 for the purpose of identifying the light emitting region 4B, the light emitting region 4G1, the light emitting region 4G2, and the light emitting region 4R. The actual deposition is carried out through openings 71B, 71R, and 71G in vapor deposition masks 70B, 70R, and 70G, respectively. As described earlier, the light emitting region 4B, the light emitting region 4G1, the light emitting region 4G2, and the light emitting region 4R are positioned within the subpixel 3B, the subpixel 3G1, the subpixel 3G2, and the subpixel 3R, respectively, in that order.

FIG. 14 illustrates only the light-emitting layers 34B, 34R, and 34G, and the openings 15a in the banks 15 corresponding to the light emitting regions 4B, 4G1, 4G2, and 4R, in a display region 1a of the TFT substrate 10, for the sake of simplicity.

In the manufacturing method for the organic EL display device 1 according to the present embodiment, when forming the bank 15, the bank 15 is patterned and formed so that the openings 15a corresponding to the light emitting regions 4 illustrated in FIG. 14 (i.e., the light emitting regions 4B, 4G1, 4G2, and 4R) are formed; and as illustrated in FIG. 13C, in the green fluorescent light-emitting layer formation process (S7), a vapor deposition mask 70G having a different opening pattern than the vapor deposition mask 70G according to Embodiment 1 is used. Aside from these points, however, the manufacturing method according to the present embodiment is the same as the manufacturing method for the organic EL display device 1 according to Embodiment 1.

In the manufacturing method for the organic EL display device 1 according to the present embodiment, vapor deposition is carried out using the vapor deposition masks 70B, 70R, and 70G illustrated in FIGS. 13A to 13C in the blue fluorescent light-emitting layer formation process (S4) to the green fluorescent light-emitting layer formation process (S7) illustrated in FIG. 10.

In the blue fluorescent light-emitting layer formation process (S4), the material of the blue fluorescent light-emitting layer 34B is linearly-deposited in the direction connecting the light emitting region 4B and the light emitting region 4G1 adjacent in the row direction (i.e., the direction connecting the subpixel 3B and the subpixel 3G1) using, as the vapor deposition mask 70B in the same manner as in Embodiment 1, a slitted mask having the slit-shaped openings 71B in which the openings are longer in the above-described first direction, which is provided spanning a plurality of the pixels 2 so as to connect the light emitting region 4B and the light emitting region 4G1 adjacent in the row direction (the first direction); as a result, the blue fluorescent light-emitting layer 34B is formed on the hole transport layer 32, in the light emitting region 4B and the light emitting region 4G1 indicated by the broken lines in FIG. 13A.

In the present embodiment too, the following descriptions of the method of manufacturing the organic EL display device 1 can be given with equivalent meaning by replacing "light emitting regions 4", "light emitting region 4B", "light emitting region 4G1", "light emitting region 4G2", and "light emitting region 4R" with "subpixels 3", "subpixel 3B", "subpixel 3G1", "subpixel 3G2", and "subpixel 3R", respectively, as described above.

In the present embodiment too, assuming, for example, that the light emitting region 4B and the light emitting region 4G1 provided in the same pixel 2 constitute a single set, the openings 71B are formed corresponding to a plurality of sets of the light emitting regions 4 connected in the row direction, so as to connect, in an alternating manner, the light emitting regions 4B and the light emitting regions 4G1 within the same pixel 2 and in the pixels 2 adjacent in the row direction.

The number of pixels 2 is not illustrated in FIGS. 13A to 13C and 14 for the sake of simplicity. Thus like Embodiment 1, the example in FIG. 13A illustrates a case where a plurality of the openings 71B are formed spanning the light emitting regions 4B and the light emitting regions 4G1 corresponding to two pixels arranged in the row direction (i.e., the light emitting regions 4B and the light emitting regions 4G1 corresponding to four subpixels).

However, in the present embodiment too, each of the openings 71B may be formed corresponding to the light emitting regions 4B and the light emitting regions 4G1 in three or more pixels 2 arranged consecutively in the row direction, and may, for example, be formed continuously from one end of the display region 1*a* of the TFT substrate 10 to the other end of the display region 1*a* with respect to the row direction.

In either case, in the blue fluorescent light-emitting layer formation process (S4), the blue fluorescent light-emitting layer 34B is formed having the same pattern as the openings 71B in the vapor deposition mask 70B when viewed in a plan view. As a result, in the present embodiment, a line-shaped blue fluorescent light-emitting layer 34B spanning a plurality of pixels along the row direction is formed in subpixel columns of odd-numbered rows that constitute the subpixel 3B and the subpixel 3G1, as illustrated in FIG. 14.

In the red light-emitting layer formation process (S5) and the separation layer formation process (S6), the materials of the red light-emitting layer 34R and the separation layer 35 are linearly-deposited in the direction connecting the light emitting region 4G2 and the light emitting region 4R using, as the vapor deposition mask 70R in the same manner as in Embodiment 1, a slitted mask having the slit-shaped openings 71R in which the openings are longer in the above-described first direction, which is provided spanning a plurality of the pixels 2 so as to connect the light emitting region 4R and the light emitting region 4G2 adjacent in the row direction (the first direction); as a result, the red light-emitting layer 34R and the separation layer 35 are formed, on the hole transport layer 32, in the light emitting region 4G2 and the light emitting region 4R indicated by the broken lines in FIG. 13B.

In the present embodiment too, assuming, for example, that the light emitting region 4R and the light emitting region 4G2 provided in the same pixel 2 constitute a single set, the openings 71R are formed corresponding to a plurality of sets of the light emitting regions 4 connected in the row direction, so as to connect, in an alternating manner, the light emitting regions 4R and the light emitting regions 4G" within the same pixel 2 and in the pixels 2 adjacent in the row direction.

Note that as described above, the number of pixels 2 is not illustrated in FIGS. 13A to 13C and 14 for the sake of simplicity. Thus like Embodiment 1, in the present embodiment too, the example in FIG. 13B illustrates a case where a plurality of the openings 71R are formed spanning the light emitting regions 4R and the light emitting regions 4G2 corresponding to two pixels arranged in the row direction (i.e., the light emitting regions 4R and the light emitting regions 4G2 corresponding to four subpixels).

However, in the present embodiment too, the openings 71R may be formed as intermittent stripes along the row direction so as to correspond to the light emitting regions 4R and the light emitting regions 4G2 in a plurality of pixels 2 arranged in the row direction, or may be formed as continuous stripes from one end to the other end of the display region 1*a* with respect to the row direction.

In either case, in the red light-emitting layer formation process (S5) and the separation layer formation process (S6), the red light-emitting layer 34R and the separation layer 35 are formed having the same pattern as the openings 71R in the vapor deposition mask 70R when viewed in a plan view.

Like Embodiment 1, in the present embodiment, the material of the red light-emitting layer 34R is linearly-deposited in subpixel columns of even-numbered rows that constitute the subpixel 3G2 and the subpixel 3R. As a result, a line-shaped red light-emitting layer 34R spanning a plurality of pixels along the row direction is formed, having the same pattern as the openings 71R and parallel to the blue fluorescent light-emitting layer 34B when viewed in a plan view, as illustrated in FIG. 14. Additionally, the separation layer 35 having the same pattern as the red light-emitting layer 34R when viewed in a plan view is layered upon the red light-emitting layer 34R.

However, in the present embodiment too, the red light-emitting layer 34R and the separation layer 35 may of course be patterned and formed using separate dedicated vapor deposition masks having the same opening pattern, in the same manner as in the first embodiment.

As illustrated in FIG. 13C, in the green fluorescent light-emitting layer formation process (S7), the green fluorescent light-emitting layer 34G is formed having a plurality of line shapes following an oblique direction, so as to intersect with the blue fluorescent light-emitting layer 34B and the separation layer 35 (specifically, so as to intersect with those layers at an oblique angle of 45 degrees).

In other words, in the green fluorescent light-emitting layer formation process (S7) in the present embodiment, the material of the green fluorescent light-emitting layer 34G is linearly-deposited in a direction connecting the light emitting regions 4G1 and the light emitting regions 4G2 adjacent in the oblique direction, using, as the vapor deposition mask 70G, a slitted mask having at least slit-shaped openings 71G, in which the openings are longer in the above-described third direction, which is provided spanning a plurality of the pixels 2 so as to connect the light emitting regions 4G1 and the light emitting regions 4G2 adjacent in the oblique direction (the third direction) (i.e., directly adjacent); as a result, the green fluorescent light-emitting layer 34G is formed in the light emitting regions 4G1 and the light emitting regions 4G2 indicated by the broken lines in FIG. 13C.

The openings 71G are formed corresponding to the light emitting regions 4G1 and the light emitting regions 4G2 in a plurality of the pixels 2 arranged in the oblique direction so that the light emitting regions 4G1 and the light emitting regions 4G2 adjacent in the oblique direction at least within the same pixel 2 are connected, and so that some of the openings 71G connect the light emitting regions 4G1 and the light emitting regions 4G2 in the pixels 2 adjacent in the oblique direction in an alternating manner.

For the sake of simplicity, the example in FIG. 13C illustrates a case where the opening 71G is formed spanning the light emitting regions 4G2 and the light emitting regions 4G1 corresponding to two subpixels arranged in the oblique direction within the same pixel 2, on either side of the opening 71G spanning the light emitting regions 4G1 and the light emitting regions 4G2 corresponding to two pixels arranged in the oblique direction (i.e., the light emitting regions 4G1 and the light emitting regions 4G2 corresponding to four subpixels), so as to connect the light emitting regions 4G1 and the light emitting regions 4G2 arranged in the oblique direction within 2×2 pixels 2 adjacent in the up, down, left, and right directions (i.e., the row direction and the column direction) (to rephrase, 4×4 subpixels 3).

However, even when the green fluorescent light-emitting layer 34G is deposited in the oblique direction as in the present embodiment, the openings 71G may, for example, include openings 71G spanning the light emitting regions 4G1 and the light emitting regions 4G2 in three or more pixels 2 arranged consecutively in the oblique direction, or may be formed continuously from one end of the display region 1*a* of the TFT substrate 10 to the other end of the display region 1*a* with respect to the oblique direction (i.e., a direction parallel to a diagonal line).

In other words, the openings 71G may be formed as continuous stripes from one end to the other end of the display region 1*a* in the oblique direction, and only the openings 71G arranged in parallel on both ends may be formed spanning the light emitting regions 4G1 and the light emitting regions 4G2 corresponding to two subpixels arranged in the oblique direction within the same pixel 2 so as to be located on either side of a plurality of openings 71G spanning the light emitting regions 4G1 and the light emitting regions 4G2 in a plurality of the pixels 2.

Assuming 2×2 pixels 2 adjacent in the row direction and the column direction constitute a single set, for example, a group of the openings 71G constituted by the slit-shaped openings 71G may be provided for each set so as to connect the light emitting regions 4G1 and the light emitting regions 4G2 adjacent in the oblique direction (i.e., directly adjacent) within the corresponding set. In other words, the openings 71G may be formed as intermittent stripes along the oblique direction by stripe-shaped openings 71G extending in the oblique direction being partitioned on a set-by-set basis.

However, the present embodiment is not limited thereto. The vapor deposition mask 70G may have a configuration in which four or more pixels 2, in which individual pluralities of the pixels are adjacent in the row direction and the column direction, are taken as a single set, and a group of openings 71G constituted by slit-shaped openings 71G is provided for each of the sets. For example, 2×3 or 4×4 pixels 2 in the row direction×column direction may be taken as a single set, and a slitted mask in which a group of openings 71G constituted by slit-shaped openings 71G is provided for each set may be used as the vapor deposition mask 70G. By taking four or more pixels 2, in which individual pluralities of the pixels are adjacent in the row direction and the column direction, as a single set, and providing a group of openings 71G constituted by slit-shaped openings 71G for each of the sets in this manner, the same green fluorescent light-emitting layer 34G spanning both the light emitting regions 4G1 and the light emitting regions 4G2 can be formed in common for the light emitting regions 4G1 and the light emitting regions 4G2 within the same pixel 2 without the openings 71G being partitioned within the pixel 2. In other words, the same green fluorescent light-emitting layer 34G spanning both the subpixel 3G1 and the subpixel 3G2 can be formed in common for the subpixel 3G1 and the subpixel 3G2 within the same pixel 2.

In either case, in the green fluorescent light-emitting layer formation process (S7), the green fluorescent light-emitting layer 34G is formed having the same pattern as the openings 71G in the vapor deposition mask 70G when viewed in a plan view.

In the present embodiment, a plurality of green fluorescent light-emitting layers 34G are formed, in line shapes following the oblique direction, on the hole transport layer 32, overlapping the blue fluorescent light-emitting layer 34B in the subpixel 3G1 and overlapping the separation layer 35 in the subpixel 3G2, and having the same pattern as the openings 71G when viewed in a plan view, as illustrated in FIG. 14.

The present embodiment describes an example in which a vapor deposition mask 70G in which a plurality of the openings 71G are provided in the oblique direction is used as the vapor deposition mask 70G, as described above. However, in the green fluorescent light-emitting layer formation process (S7), the blue fluorescent light-emitting layer 34B, the green fluorescent light-emitting layer 34G, and the red light-emitting layer 34R may be linearly-deposited by using a vapor deposition mask 70G similar to the vapor deposition mask 70G used in Embodiment 1 and linearly-depositing a film formed substrate (a function layer formed substrate, which here is the TFT substrate 10 on which the separation layer 35 is formed through the processes up to the separation layer formation process (S6) immediately before the green fluorescent light-emitting layer formation process (S7)) after being rotated 45 degrees relative to the vapor deposition mask 70G.

According to the present embodiment, employing a Pen-Tile type pixel arrangement makes it possible to improve the apparent resolution.

In an organic EL display device having a PenTile arrangement that does not employ the above-described layered structure, linear deposition can only be carried out for subpixel columns constituted by green subpixels. To rephrase, in an organic EL display device having a PenTile arrangement lacking the above-described layered structure, a slitted mask can only be used to form the light-emitting layer of a single color.

However, according to the present embodiment, employing the above-described layered structure makes it possible to carry out linear deposition not only in the direction connecting the light emitting region 4G1 and the light emitting region 4G2, but also in the direction connecting the light emitting region 4B and the light emitting region 4G1 and in the direction connecting the light emitting region 4G2 and the light emitting region 4R, in the same manner as in Embodiment 1. In other words, according to the present embodiment, linear deposition can be carried out not only in the direction connecting the subpixel 3G1 and the subpixel 3G2, but also in the direction connecting the subpixel 3G1 and the subpixel 3R and in the direction connecting the subpixel 3B and the subpixel 3G1, which makes it possible to suppress color mixing in those directions as well.

Thus according to the present embodiment, linear deposition is possible for a plurality of light-emitting layers 34 having different colors, and furthermore for all of the layers constituting the light-emitting layer unit 33, including all of the light-emitting layers 34, which has not been possible with organic EL display devices having PenTile arrangements lacking the above-described layered structure.

The organic EL display device 1 according to the present embodiment simply has a different pixel arrangement, as described above. The display method (display principles) of the organic EL display device 1 is the same as in Embodiment 1.

Accordingly, the present embodiment can also achieve effects similar to those of Embodiment 1. The same modifications as those of Embodiment 1 can be applied to the present embodiment as well.

For example, in the present embodiment too, a vapor deposition mask 70 in which the openings 71 are provided for two subpixels, corresponding to the subpixel 3B and the subpixel 3G1 in each of the pixels 2, for example, may be used as the vapor deposition mask 70; and when forming some of the light-emitting layers 34 among the blue fluorescent light-emitting layer 34B, the red light-emitting layer 34R, and the green fluorescent light-emitting layer 34G, a normal vapor deposition mask having an opening pattern in which individual openings 71 are provided for each subpixel may be used as the vapor deposition mask 70. Additionally, the light-emitting layers 34 may be formed by using vapor deposition masks smaller than the TFT substrate 10 as the vapor deposition masks 70 and carrying out stepwise deposition, in which the vapor deposition masks 70 are moved in order relative to the TFT substrate 10 and brought into contact with the TFT substrate 10 each time.

Additionally, in the present embodiment, the light emitting regions 4G1 and 4G2 (the subpixels 3G1 and 3G2) are rotated by 45 degrees relative to the light emitting regions 4B and 4R (the subpixels 3B and 3R), for diamond shapes, as illustrated in FIGS. 12 to 14.

In the present embodiment, the green fluorescent light-emitting layer 34G is linearly-deposited in an oblique direction, as illustrated in FIG. 13B. Thus as illustrated in FIG. 13C, by carrying out linear deposition so that the respective sides of the opening 71G (the ends of the respective openings) in the vapor deposition mask 70G are parallel to the respective sides of the light emitting regions 4G1 and 4G2 that oppose the stated sides, the gaps between the light emitting regions 4 can be used to the greatest extent possible, which makes it possible to increase the density at which the subpixels 3 are provided.

Third Embodiment

A description follows regarding yet another embodiment of the disclosure, mainly with reference to FIGS. 9A to 9C, FIGS. 13A to 13C, and FIGS. 15A and 15B.

The present embodiment will describe differences from the first and second embodiments, and constituent elements having the same functions as the constituent elements described in the first and second embodiments will be assigned the same reference signs, with descriptions thereof omitted. It goes without saying that the same modifications as those of the first and second embodiments can be applied to the present embodiment as well.

When using a slitted mask as the vapor deposition mask 70 as described in Embodiments 1 and 2, the function layers in the light-emitting layer unit 33 may be deposited through scanning vapor deposition (small-mask scanning vapor deposition) in which vapor deposition is carried out while scanning (scanning deposition) using a vapor deposition mask 70 smaller than the film formed substrate, which is the substrate on which the function layers are formed.

Figure 15A:
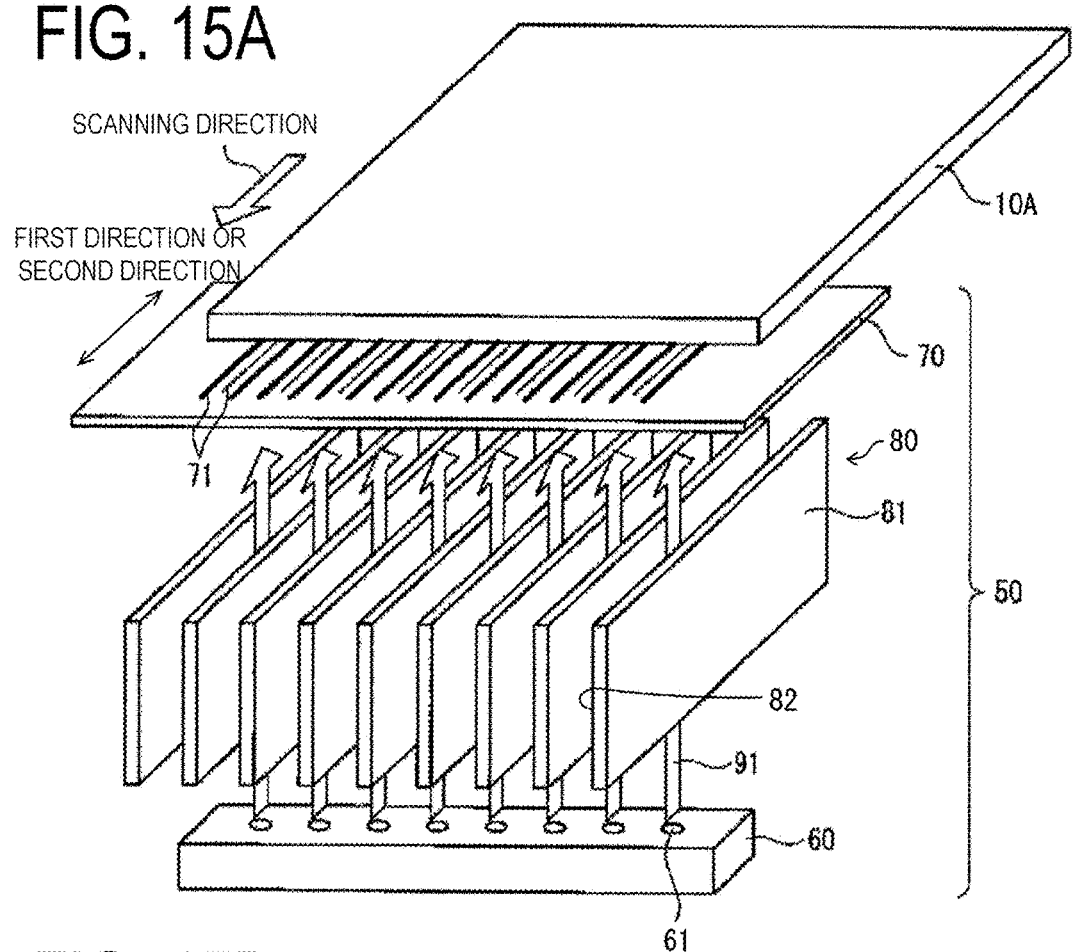
FIG. 15A is a perspective view illustrating the overall configuration of the main portions of a vapor deposition apparatus used to manufacture an organic EL display device according to Embodiment 3 of the disclosure.
Figure 15B:
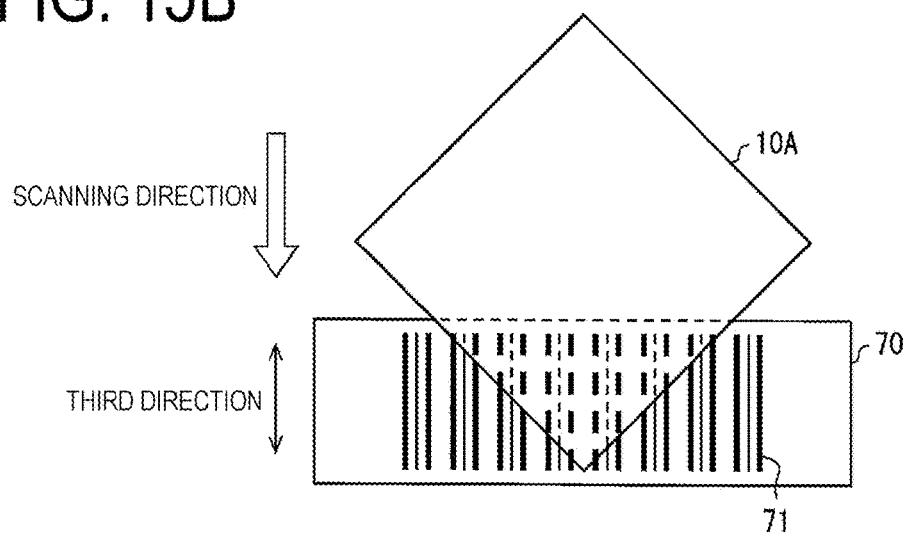
FIG. 15B is a plan view illustrating a state in which a film formed substrate has been rotated by 45 degrees relative to a vapor deposition mask in the vapor deposition apparatus.

FIG. 15A is a perspective view illustrating the overall configuration of the main portions of a vapor deposition apparatus used to manufacture the organic EL display device 1 according to the present embodiment, and FIG. 15B is a plan view illustrating a state in which a TFT substrate 10A serving as a film formed substrate has been rotated by 45 degrees relative to the vapor deposition mask 70 in the vapor deposition apparatus illustrated in FIG. 15A.

As illustrated in FIG. 15A, a vapor deposition apparatus using a scanning vapor deposition method includes a film formation chamber (vacuum chamber) (not illustrated), as well as a mask unit 50 that includes at least a vapor deposition source 60 serving as a supply source of vapor deposition particles 91 and the vapor deposition mask 70, provided within the film formation chamber. It is desirable that the mask unit 50 further include a limiting plate unit 80, which limits the passage angle (flow) of the vapor deposition particles 91 emitted from the vapor deposition source 60, between the vapor deposition source 60 and the vapor deposition mask 70.

The vapor deposition source 60, the limiting plate unit 80, the vapor deposition mask 70, and the TFT substrate 10A serving as the film formed substrate are arranged opposing each other in that order, from the vapor deposition source 60 side, within the film formation chamber (not illustrated), with set spaces provided between those elements (in other words, separated by set distances).

The relative positions of the vapor deposition source 60, the limiting plate unit 80, and the vapor deposition mask 70 are fixed as the mask unit 50.

In the present embodiment, a rectangular vapor deposition mask 70 having a smaller area than the TFT substrate 10A serving as the film formed substrate (and more precisely, having a shorter length in a scanning direction of the TFT substrate 10 than the length of the TFT substrate 10A in that scanning direction) is used as the vapor deposition mask 70.

The TFT substrate 10A serving as the film formed substrate may be the TFT substrate 10 for a single organic EL display device 1, or may be a mother substrate that can be cut to configure a plurality of organic EL display devices 1 (i.e., an oversized TFT substrate provided with a plurality of circuits corresponding to a plurality of TFT substrates 10 for a plurality of organic EL display devices 1). In a mass-manufacturing process, a plurality of organic EL display devices 1 are formed on the mother substrate and are then divided into the individual organic EL display devices 1.

A plurality of openings 71 are provided in the vapor deposition mask 70 along a direction orthogonal to the scanning direction of the TFT substrate 10A.

The vapor deposition source 60 is, for example, a receptacle containing a vapor deposition material in its interior. The vapor deposition source 60 may be a receptacle that contains the vapor deposition material directly within the receptacle interior, or may have a load-lock pipe and be formed so that the vapor deposition material is supplied from the exterior.

A plurality of emission openings 61 from which the vapor deposition particles 91 are emitted are arranged in the surface of the vapor deposition source 60 opposing the limiting plate unit 80, at a constant pitch along the direction orthogonal to the scanning direction (i.e., along the direction in which the openings 71 are arranged).

However, the present embodiment is not limited thereto. Depending on the size of the TFT substrate 10A, a single vapor deposition source 60 provided with only one emission opening 61 may be used, or a plurality of vapor deposition sources 60, each provided with only one emission opening 61, may be arranged in the direction orthogonal to the scanning direction.

The vapor deposition source 60 is preferably disposed opposing the vapor deposition mask 70 with the limiting plate unit 80 provided therebetween. The vapor deposition source 60 generates the vapor deposition particles 91 in a gaseous state by heating and vaporizing the vapor deposition material (if the vapor deposition material is a liquid material) or sublimating the vapor deposition material (if the vapor deposition material is a solid material). The vapor deposition source 60 emits the vapor deposition material in this gaseous state from the emission openings 61 toward the limiting plate unit 80 and the vapor deposition mask 70 as the vapor deposition particles 91.

The limiting plate unit 80 includes a plurality of limiting plates 81 provided parallel to each other and separated from each other with respect to the direction orthogonal to the scanning direction. A limiting plate opening 82 is formed, as an opening regions, between each of the limiting plates 81 adjacent in the second direction.

The vapor deposition particles 91 emitted from the vapor deposition source 60 pass through the limiting plate openings 82, pass through the openings 71 serving as mask openings formed in the vapor deposition mask 70, and are deposited on the TFT substrate 10A serving as the film formed substrate.

In the present embodiment, the function layers of the light-emitting layer unit 33 are formed by disposing the mask unit 50 opposing the TFT substrate 10A with a set gap provided therebetween, moving at least one of the mask unit 50 and the TFT substrate 10A relative to the other in a direction parallel to the above-described scanning direction, and depositing the vapor deposition particles 91 on the surface of the TFT substrate 10A opposing the vapor deposition mask 70 (i.e., a film formed surface) through the openings 71 in the vapor deposition mask 70, as illustrated in FIG. 15A.

Of course, the vapor deposition apparatus including the above-described mask unit 50 can also be used to deposit the organic layers (function layers) among the organic EL layers 22 which are not included in the light-emitting layer unit 33. When using the above-described vapor deposition apparatus to deposit the organic layers (function layers) among the organic EL layers 22 which are not included in the light-emitting layer unit 33, an open mask in which the entirety of a region opposing the display region 1a is open can be used as the vapor deposition mask 70.

Thus with a scanning vapor deposition method, the deposition is carried out while scanning the film formed substrate, without the film formed substrate and the vapor deposition mask 70 being in contact. Thus in the past, it has not been possible to form all of the light-emitting layers through the scanning vapor deposition method to achieve an S-Stripe- or PenTile-type pixel arrangement, and it has not been possible to use a scanning vapor deposition method to form the light-emitting layers aside from the light-emitting layers having a luminescent color of green.

However, according to the present embodiment, scanning deposition is carried out using the vapor deposition mask 70, which has the openings 71 corresponding to each of the blue fluorescent light-emitting layer 34B, the red light-emitting layer 34R and separation layer 35, and the green fluorescent light-emitting layer 34G, as the vapor deposition mask 70. This makes it possible to form the function layers constituting the high resolution light-emitting layer unit 33 having an S-Stripe- or PenTile-type pixel arrangement, while utilizing the advantages provided by scanning deposition.

In scanning vapor deposition, it is not necessary to use a vapor deposition mask 70 having the same size as the film formed substrate, as described above, and an oversized film formed substrate can be used as the film formed substrate. This makes it possible to use an oversized TFT substrate 10A as the film formed substrate. Additionally, according to the present embodiment, it is not necessary to increase the distance between the vapor deposition source and the film formed substrate, as is the case when using a separate-patterning technique. The distance between the vapor deposition source 60 and the TFT substrate 10A serving as the film formed substrate can be reduced, which provides greater material utilization efficiency and makes it possible to reduce the size of the apparatus.

Manufacturing Method for Organic EL Display Device 1

According to the present embodiment, if, in the green fluorescent light-emitting layer formation process (S7) illustrated in FIG. 13C, the film formed substrate (TFT substrate 10A) is rotated 45 degrees relative to the vapor deposition mask 70 and deposited in an oblique direction, a slitted mask can be used as the vapor deposition mask 70 to form all of the layers in the light-emitting layer unit 33, as illustrated in FIGS. 9A to 9C and FIGS. 13A to 13C.

Here, rotating the film formed substrate by 45 degrees relative to the vapor deposition mask 70 and depositing in an oblique direction refers to arranging the film formed substrate so that the long side directions of the openings 71 in the vapor deposition mask 70 and the limiting plate openings 82 (i.e., a slit direction, which corresponds to the longer direction of the openings) are arranged in a direction parallel to an oblique direction forming a 45-degree angle with one side of the film formed substrate (and more precisely, a display region of the film formed substrate) or an axis of the film formed substrate (if the film formed substrate or the display region of the film formed substrate is circular or elliptical), and carrying out the deposition while moving at least one of the mask unit 50 and the film formed substrate relative to each other in the direction parallel to the oblique direction.

Accordingly, in the present embodiment, rotating the film formed substrate by 45 degrees relative to the vapor deposition mask 70 and depositing in the oblique direction refers to disposing the film formed substrate so that the long side directions of the openings 71 in the vapor deposition mask 70 and the limiting plate openings 82 correspond to a direction parallel to a diagonal line of the film formed substrate (and more precisely, a diagonal line of the display region 1a of the film formed substrate), and then depositing while moving at least one of the mask unit 50 and the film formed substrate relative to each other in the direction parallel to the diagonal line of the film formed substrate.

This will be described in more detail below.

The manufacturing method of the organic EL display device 1 according to the present embodiment is the same as the manufacturing method of the organic EL display device 1 according to Embodiments 1 and 2, except that in the blue fluorescent light-emitting layer formation process (S4) to the green fluorescent light-emitting layer formation process (S7) illustrated in FIG. 10, the blue fluorescent light-emitting layer 34B, the red light-emitting layer 34R, the separation layer 35, and the green fluorescent light-emitting layer 34G are formed using scanning vapor deposition.

Accordingly, the following will describe a method of forming the blue fluorescent light-emitting layer 34B, the red light-emitting layer 34R, the separation layer 35, and the green fluorescent light-emitting layer 34G using scanning vapor deposition in the blue fluorescent light-emitting layer formation process (S4) to the green fluorescent light-emitting layer formation process (S7).

A case where the organic EL display device 1 has an S-Stripe pixel arrangement, as illustrated in FIG. 3, will be described first.

When the organic EL display device 1 has an S-Stripe pixel arrangement, in the blue fluorescent light-emitting layer formation process (S4) illustrated in FIG. 9A, first, the vapor deposition mask 70B having a smaller area than the TFT substrate 10A when viewed in a plan view is used as the vapor deposition mask 70 illustrated in FIG. 15A, and the TFT substrate 10A is arranged so that the longer direction of the openings in the vapor deposition mask 70B corresponds to the row direction of the TFT substrate 10A (the first direction). Then, the material of the blue fluorescent light-emitting layer 34B is linearly-deposited in the direction connecting the light emitting regions 4G1 and the light emitting regions 4B adjacent in the above-described first direction (i.e., the direction connecting the subpixel 3G1 and the subpixel 3B) while moving at least one of the mask unit 50 and the TFT substrate 10A relative to the other so that the longer direction of the openings in the vapor deposition mask 70B (i.e., the above-described first direction) corresponds to the scanning direction.

As a result, in the present embodiment, the blue fluorescent light-emitting layer 34B is formed as a continuous stripe, from one end to the other end of the display region of the TFT substrate 10A, with respect to the row direction (e.g., the display region 1a of the TFT substrate 10 illustrated in FIG. 11). More specifically, in the present embodiment, the blue fluorescent light-emitting layer 34B is formed as a continuous stripe from one end to the other end of the TFT substrate 10A with respect to the row direction.

Next, in the red light-emitting layer formation process (S5), first, the vapor deposition mask 70R having a smaller area than the TFT substrate 10A when viewed in a plan view is used as the vapor deposition mask 70 illustrated in FIG. 15A, and the TFT substrate 10A is arranged so that the longer direction of the openings in the vapor deposition mask 70R correspond to the row direction of the TFT substrate 10A (the first direction). Then, the material of the red light-emitting layer 34R is linearly-deposited in the direction connecting the light emitting regions 4R and the light emitting regions 4G2 adjacent in the above-described first direction (i.e., the direction connecting the subpixel 3R and the subpixel 3G2) while moving at least one of the mask unit 50 and the TFT substrate 10A relative to the other so that the longer direction of the openings in the vapor deposition mask 70R (i.e., the above-described first direction) corresponds to the scanning direction.

As a result, in the present embodiment, the red light-emitting layer 34R is formed as a continuous stripe, adjacent and parallel to the blue fluorescent light-emitting layer 34B, from one end to the other end of the display region of the TFT substrate 10A, with respect to the row direction (e.g., the display region 1a of the TFT substrate 10 illustrated in FIG. 11). More specifically, in the present embodiment, the red light-emitting layer 34R is formed as a continuous stripe, adjacent and parallel to the blue fluorescent light-emitting layer 34B, from one end to the other end of the TFT substrate 10A with respect to the row direction.

Then, in the separation layer formation process (S6), the material of the separation layer 35 is linearly-deposited, on the red light-emitting layer 34R, in the direction connecting the light emitting regions 4R and the light emitting regions 4G2 adjacent in the above-described first direction (the direction connecting the subpixel 3R and the subpixel 3G2), in the same manner as in the above-described red light-emitting layer formation process (S5), using the above-described vapor deposition mask 70R or a dedicated vapor deposition mask having the same opening pattern as the above-described vapor deposition mask 70R. As a result, the separation layer 35 having the same pattern as the red light-emitting layer 34R when viewed in a plan view is layered upon the red light-emitting layer 34R.

Then, in the green fluorescent light-emitting layer formation process (S7), the vapor deposition mask 70G having a smaller area than the TFT substrate 10A when viewed in a plan view is used as the vapor deposition mask 70 illustrated in FIG. 15A, and the TFT substrate 10A is rotated clockwise or counterclockwise by 90 degrees from the state (position) of the TFT substrate 10A in the separation layer formation process (S6), so that the longer direction of the openings in the vapor deposition mask 70G correspond to the column direction of the TFT substrate 10A (the second direction). Then, the material of the green fluorescent light-emitting layer 34G is linearly-deposited in the direction connecting the light emitting regions 4G1 and the light emitting regions 4G2 adjacent in the above-described second direction (i.e., the direction connecting the subpixel 3G1 and the subpixel 3G2) while moving at least one of the mask unit 50 and the TFT substrate 10A relative to the other so that the longer direction of the openings in the vapor deposition mask 70G (i.e., the above-described second direction) corresponds to the scanning direction.

As a result, in the present embodiment, the green fluorescent light-emitting layer 34G is formed as a continuous stripe, from one end to the other end of the display region of the TFT substrate 10A, with respect to the column direction (e.g., the display region 1a of the TFT substrate 10 illustrated in FIG. 11). More specifically, in the present embodiment, the green fluorescent light-emitting layer 34G is formed as a continuous stripe from one end to the other end of the TFT substrate 10A with respect to the column direction.

The foregoing describes, as an example, a case where dedicated vapor deposition masks 70 are used as the vapor deposition masks 70 in the processes of forming the light-emitting layers 34 of the respective colors. However, if color mixing caused by the sublimation of vapor deposition films adhering to the vapor deposition masks 70 or the sublimation of vapor deposition films that have peeled off from the vapor deposition masks 70 is not a problem, the same vapor deposition mask 70 as that used in the blue fluorescent light-emitting layer formation process (S4) may be used in the red light-emitting layer formation process (S5), the green fluorescent light-emitting layer formation process (S7), and the like, or individual vapor deposition masks 70 having the same opening pattern as that vapor deposition mask 70 may be used. When employing scanning vapor deposition, the light-emitting layers 34 and the openings 71 need not have the same shapes when viewed in a plan view, and thus vapor deposition masks 70 having the same opening pattern can be used as the vapor deposition masks 70 as long as the opening widths and opening pitches are the same for each of the openings 71.

In any event, according to the present embodiment, rotating the TFT substrate 10A by 90 degrees within the same plane after carrying out the separation layer formation process (S6) makes it possible to linearly-deposit the material of the green fluorescent light-emitting layer 34G in the direction connecting the light emitting regions 4G1 and the light emitting regions 4G2 using a slitted mask as the vapor deposition mask 70.

Although the foregoing describes, as an example, a case where the TFT substrate 10A is rotated relative to the mask unit 50, the present embodiment is not limited thereto. For example, the mask unit 50 may be rotated relative to the TFT substrate 10A within the same plane by using an XY stage or the like. Here, rotating the mask unit 50 relative to the TFT substrate 10A within the same plane refers to rotating the mask unit 50 in the horizontal direction while maintaining the individual relative positional relationships with the constituent elements constituting the mask unit, such as the vapor deposition source 60, the limiting plate unit 80, and the vapor deposition mask 70. In this case, if the constituent elements constituting the mask unit 50 are held integrally using a single holder, those constituent elements may be rotated together in the horizontal direction (i.e., the mask unit 50 itself may be rotated in the horizontal direction) by rotating the entire holder in the horizontal direction; if the constituent elements are held individually by separate holding members in a state where the relative positional relationships of those constituent elements are maintained, the constituent elements may be rotated individually in the horizontal direction while ultimately maintaining the relative positional relationships between those constituent elements.

Thus according to the present embodiment, in the green fluorescent light-emitting layer formation process (S7), at least one of the mask unit 50 and the TFT substrate 10A is rotated relative to the other, in the same plane, from the state in the previous light-emitting layer formation process, and as a result, linear deposition can be carried out in either direction using a slitted mask as the vapor deposition mask 70. Accordingly, the linear deposition can be carried out using a slitted mask in all of the processes from the blue fluorescent light-emitting layer formation process (S4) to the green fluorescent light-emitting layer formation process (S7). Here, rotating at least one of the mask unit 50 and the TFT substrate 10A within the same plane relative to the other refers, in the case where the mask unit 50 is rotated, to rotating the mask unit 50 within the same plane as the plane in which that mask unit is arranged, and refers, in the case where the TFT substrate 10A is rotated, to rotating the TFT substrate 10A within the same plane as the plane in which that TFT substrate 10A is arranged.

A case where the organic EL display device 1 has a PenTile pixel arrangement, as illustrated in FIG. 12, will be described next.

The processes from the blue fluorescent light-emitting layer formation process (S4) to the separation layer formation process (S6) are the same regardless of whether the organic EL display device 1 has a PenTile pixel arrangement or an S-Stripe pixel arrangement.

Accordingly, when the organic EL display device 1 has a PenTile pixel arrangement, in the blue fluorescent light-emitting layer formation process (S4) illustrated in FIG. 13A, first, the vapor deposition mask 70B having a smaller area than the TFT substrate 10A when viewed in a plan view is used as the vapor deposition mask 70 illustrated in FIG. 15A, and the TFT substrate 10A is arranged so that the longer direction of the openings in the vapor deposition mask 70B corresponds to the row direction of the TFT substrate 10A (the first direction). Then, the material of the blue fluorescent light-emitting layer 34B is linearly-deposited in the direction connecting the light emitting regions 4G1 and the light emitting regions 4B adjacent in the above-described first direction while moving at least one of the mask unit 50 and the TFT substrate 10A relative to the other so that the longer direction of the openings in the vapor deposition mask 70B (i.e., the above-described first direction) corresponds to the scanning direction.

As a result, in the present embodiment, the blue fluorescent light-emitting layer 34B is formed as a continuous stripe, from one end to the other end of the display region of the TFT substrate 10A, with respect to the row direction (e.g., the display region 1a of the TFT substrate 10 illustrated in FIG. 14). More specifically, in the present embodiment, the blue fluorescent light-emitting layer 34B is formed as a continuous stripe from one end to the other end of the TFT substrate 10A with respect to the row direction.

Next, in the red light-emitting layer formation process (S5), first, the vapor deposition mask 70R having a smaller area than the TFT substrate 10A when viewed in a plan view is used as the vapor deposition mask 70 illustrated in FIG. 15A, and the TFT substrate 10A is arranged so that the longer direction of the openings in the vapor deposition mask 70R correspond to the row direction of the TFT substrate 10A (the first direction). Then, the material of the red light-emitting layer 34R is linearly-deposited in the direction connecting the light emitting regions 4R and the light emitting regions 4G2 adjacent in the above-described first direction while moving at least one of the mask unit 50 and the TFT substrate 10A relative to the other so that the longer direction of the openings in the vapor deposition mask 70R (i.e., the above-described first direction) corresponds to the scanning direction.

As a result, in the present embodiment, the red light-emitting layer 34R is formed as a continuous stripe, adjacent and parallel to the blue fluorescent light-emitting layer 34B, from one end to the other end of the display region of the TFT substrate 10A, with respect to the row direction (e.g., the display region 1a of the TFT substrate 10 illustrated in FIG. 14). More specifically, in the present embodiment, the red light-emitting layer 34R is formed as a continuous stripe, adjacent and parallel to the blue fluorescent light-emitting layer 34B, from one end to the other end of the TFT substrate 10A with respect to the row direction.

Then, in the separation layer formation process (S6), the material of the separation layer 35 is linearly-deposited, on the red light-emitting layer 34R, in the direction connecting the light emitting regions 4R and the light emitting regions 4G2 adjacent in the above-described first direction, in the same manner as in the above-described red light-emitting layer formation process (S5), using the above-described vapor deposition mask 70R or a dedicated vapor deposition mask having the same opening pattern as the above-described vapor deposition mask 70R. As a result, the separation layer 35 having the same pattern as the red light-emitting layer 34R when viewed in a plan view is layered upon the red light-emitting layer 34R.

Then, if the organic EL display device 1 has a PenTile pixel arrangement, in the green fluorescent light-emitting layer formation process (S7), the vapor deposition mask 70G having a smaller area than the TFT substrate 10A when viewed in a plan view is used as the vapor deposition mask 70 illustrated in FIGS. 15A and 15B, and the TFT substrate 10A is rotated 45 degrees relative to the vapor deposition mask 70 (i.e., the vapor deposition mask 70G) so that the longer direction of the openings in the vapor deposition mask 70G corresponds to the oblique direction (the third direction) with respect to the TFT substrate 10A, as illustrated in FIG. 15B. Then, the material of the green fluorescent light-emitting layer 34G is linearly-deposited in the direction connecting the light emitting regions 4G1 and the light emitting regions 4G2 adjacent in the above-described third direction while moving at least one of the mask unit 50 and the TFT substrate 10A relative to the other so that the longer direction of the openings in the vapor deposition mask 70G (i.e., the above-described third direction) corresponds to the scanning direction.

As a result, in the present embodiment, the green fluorescent light-emitting layer 34G is formed as a continuous stripe, from one end to the other end of the display region of the TFT substrate 10A (e.g., the display region 1a of the TFT substrate 10 illustrated in FIG. 11), with respect to the oblique direction (the diagonal line direction, in the example illustrated in FIG. 15B). More specifically, in the present embodiment, the green fluorescent light-emitting layer 34G is formed as a continuous stripe from one end to the other end of the TFT substrate 10A with respect to the oblique direction (the diagonal line direction, in the example illustrated in FIG. 15B).

Thus when the organic EL display device 1 has a PenTile pixel arrangement, after the separation layer formation process (S6), the TFT substrate 10A is rotated by 45 degrees within the same plane, and the TFT substrate 10A is arranged so that the longer direction of the openings in the vapor deposition mask 70 is parallel to the diagonal line direction of the TFT substrate 10A, as illustrated in FIG. 15B. As a result, the material of the green fluorescent light-emitting layer 34G can be linearly-deposited in the direction connecting the light emitting regions 4G1 and the light emitting regions 4G2 adjacent in the oblique direction by using a slitted mask as the vapor deposition mask 70.

In other words, when the organic EL display device 1 has a PenTile pixel arrangement, the outer edges (sides) of the TFT substrate 10A are, in the green fluorescent light-emitting layer formation process (S7), angled (rotated) by 45 degrees relative to the outer edges (sides) of the vapor deposition mask 70 so that the longer direction of the openings in the vapor deposition mask 70 are parallel to the diagonal line direction of the TFT substrate 10A, as illustrated in FIG. 15B. As a result, the material of the green fluorescent light-emitting layer 34G can be linearly-deposited in the direction connecting the light emitting regions 4G1 and the light emitting regions 4G2 adjacent in the oblique direction, by using a slitted mask as the vapor deposition mask 70.

Although the foregoing describes, as an example, a case where the TFT substrate 10A is rotated relative to the mask unit 50, the mask unit 50 may, for example, be rotated relative to the TFT substrate 10A within the same plane by using an XY stage or the like, as described earlier.

Thus according to the present embodiment, even when the organic EL display device 1 has a PenTile pixel arrangement, in the green fluorescent light-emitting layer formation process (S7), at least one of the mask unit 50 and the TFT substrate 10A is rotated relative to the other, in the same plane, from the state in the previous light-emitting layer formation process, and as a result, linear deposition can be carried out in either direction using a slitted mask as the vapor deposition mask 70. Accordingly, the linear deposition can be carried out using a slitted mask in all of the processes from the blue fluorescent light-emitting layer formation process (S4) to the green fluorescent light-emitting layer formation process (S7).

Note that in the present embodiment, the openings 71G in the vapor deposition mask 70G are formed so that the opening widths thereof are smaller than the opening widths of the openings 71R and 71B in the vapor deposition masks 70R and 70B, as illustrated in FIGS. 12 and 13A to 13C. Thus the foregoing describes, as an example, a case where dedicated vapor deposition masks 70 are used as the vapor deposition masks 70 in the processes of forming each color of the light-emitting layers 34, and particularly in the green fluorescent light-emitting layer formation process (S7). However, the present embodiment is not limited thereto. For example, in the case where the vapor deposition masks 70 used in the above-described processes have the same opening widths and the same opening pitches, if color mixing caused by the sublimation of vapor deposition films adhering to the vapor deposition masks 70 or the sublimation of vapor deposition films that have peeled off from the vapor deposition masks 70 is not a problem, the same vapor deposition mask 70 may be used as the vapor deposition masks 70 used in each of the above-described processes. As described above, when employing scanning vapor deposition, the light-emitting layers 34 and the openings 71 need not have the same shapes when viewed in a plan view, and thus vapor deposition masks 70 having the same opening pattern (the same vapor deposition mask 70 or individual vapor deposition masks 70 having the same opening patterns) can be used as the vapor deposition masks 70 as long as the opening widths and opening pitches are the same for each of the openings 71.

Additionally, the present embodiment describes, as an example, a case where the mask unit 50 includes the limiting plate unit 80 and a linear vapor deposition source, in which the emission openings 61 are arranged in a line, is used as the vapor deposition source 60, as illustrated in FIG. 15A; and furthermore describes, as an example, a case where at least one of the mask unit 50 and the TFT substrate 10A is, in the green fluorescent light-emitting layer formation process (S7), rotated relative to the other within the same plane from the state in the previous light-emitting layer formation process. However, the limiting plate unit 80 is not necessary, and the type of the vapor deposition source 60 is also not particularly limited. As such, depending on the configuration of the mask unit 50, when the mask unit 50 is rotated relative to the TFT substrate 10A, it is not necessary to rotate the entire mask unit 50, and it is sufficient to rotate at least the vapor deposition mask 70 relative to the TFT substrate 10A within the same plane.

Additionally, the present embodiment describes, as an example, a case where the blue fluorescent light-emitting layer 34B, the red light-emitting layer 34R, the separation layer 35, and the green fluorescent light-emitting layer 34G are formed using scanning vapor deposition in the blue fluorescent light-emitting layer formation process (S4) to the green fluorescent light-emitting layer formation process (S7), as described above. However, the present embodiment is not limited thereto, and in at least one of the above-described S4 to S7, stepwise deposition, in which the vapor deposition masks 70 are moved in order relative to the TFT substrate 10 and brought into contact with the TFT substrate 10 each time, may be carried out instead of the above-described scanning deposition. In this case too, as described above, in the green fluorescent light-emitting layer formation process (S7), rotating at least one of the mask unit 50 and the TFT substrate 10A is relative to the other, in the same plane, from the state in the previous light-emitting layer formation process makes it possible to carry out linear deposition using the vapor deposition mask 70 smaller than the TFT substrate 10A.

Additionally, the present embodiment describes, as an example, a case where the above-described processes indicated by S4 to S7 are carried out in that order (i.e., of the processes indicated by S4 to S7, the green fluorescent light-emitting layer formation process (S7) is carried out last), as described above. However, the present embodiment is not limited thereto, and the order of the above-described processes indicated by S4 to S7 may be switched as described later in Embodiment 4. Note that when the green fluorescent light-emitting layer formation process (S7) of the above-described processes indicated by S4 to S7 is carried out first, it is necessary to rotate at least one of the mask unit 50 and the TFT substrate 10A relative to the other within the same plane after the green fluorescent light-emitting layer formation process (S7) in order to carry out linear deposition using the vapor deposition mask 70 that is smaller than the TFT substrate 10A. Additionally, when the green fluorescent light-emitting layer formation process (S7) of the above-described processes indicated by S4 to S7 is carried out second or third, it is necessary to rotate at least one of the mask unit 50 and the TFT substrate 10A relative to the other within the same plane both before and after the green fluorescent light-emitting layer formation process (S7) in order to carry out linear deposition using the vapor deposition mask 70 that is smaller than the TFT substrate 10A.

In either case, in the above-described processes indicated by S4 to S7, linear deposition can be carried out using a vapor deposition mask 70 smaller than the TFT substrate 10A by carrying out the linear deposition after rotating at least one of the TFT substrate 10A and the slitted mask relative to the other, within the same plane, from the state in the light-emitting layer formation process carried out first, in at least one of the light-emitting layer formation processes aside from the light-emitting layer formation process carried out first.

Fourth Embodiment

Yet another embodiment of the disclosure will be described below with reference primarily to FIGS. 16 to 18.

The present embodiment will describe differences from the first to third embodiments, and constituent elements having the same functions as the constituent elements described in the first to third embodiments will be assigned the same reference signs, with descriptions thereof omitted. It goes without saying that the same modifications as those of the first to third embodiments can be applied to the present embodiment as well.

The organic EL display device 1 according to the present embodiment is the same as the organic EL display device 1 according to Embodiments 1 to 3 excepting the following points.

Embodiment 1 describes, as an example, a case where the processes indicated by S1 to S11 are carried out in that order, as illustrated in FIG. 10. However, the processes indicated by S4 to S7 do not absolutely need to be carried out in this order. The following will describe an example in which this order of processes is changed.

Furthermore, specific Examples of the materials and thicknesses of the layers layered on the TFT substrate 10 will be given below for each example. However, the dimensions and materials denoted in the Examples are merely examples, and the present embodiment is not intended to be limited to these specific dimensions and materials. As in Example 1 defining dimensions, materials, and the mixing ratio of materials, the following Examples defining dimensions, materials, and the mixing ratio of materials also assume that the thickness of the light-transmissive electrode 21*b* has been optically optimized through optical simulations to align the luminescent color of the subpixel 3G1 and the luminescent color of the subpixel 3G2.

Example 1: Defining Layering Order of Function Layers in Light-Emitting Layer Unit FIG. 16 is a diagram schematically illustrating the layered structure of the light-emitting layer unit 33 of the organic EL display device 1 according to the present embodiment.

Figure 16:
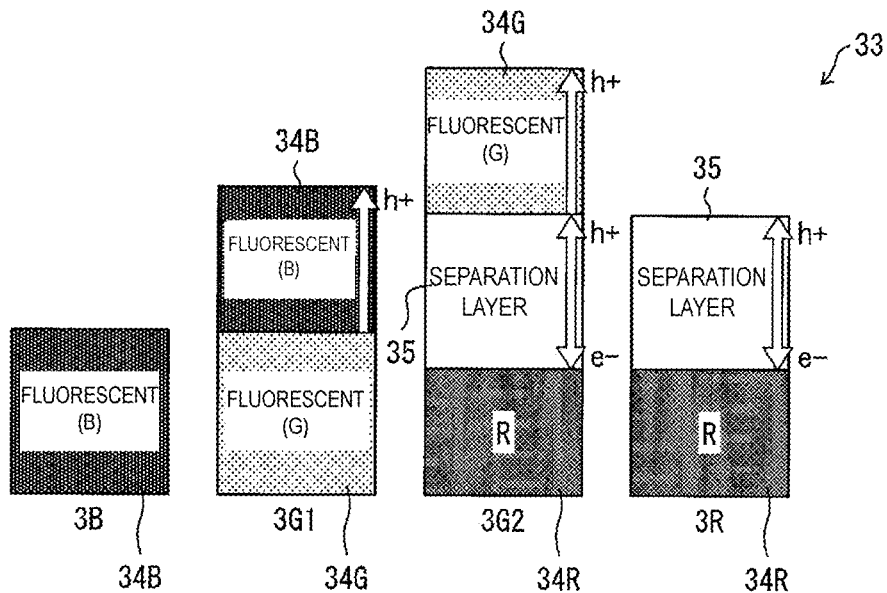
FIG. 16 is a diagram schematically illustrating a layered structure in the light-emitting layer unit of an organic EL display device according to Example 1 defining layering order of function layers in a light-emitting layer unit in Embodiment 4 of the disclosure.

FIG. 16 illustrates the layered structure of the light-emitting layer unit 33 when the red light-emitting layer formation process (S5) and the separation layer formation process (S6) are carried out before the blue fluorescent light-emitting layer formation process (S4) is carried out.

When the blue fluorescent light-emitting layer 34B contains a host material, it is preferable, to suppress a drop in light emission efficiency arising due to energy transfer from the blue fluorescent luminescent material to the host material, that a material having a high $S_1$ level, a high $T_1$ level, and the like be employed as the host material used in the blue fluorescent light-emitting layer 34B.

Host materials having electron transport properties make up most of the organic EL element host materials currently being used. As such, selecting a host material having electron transport properties as the host material broadens the range of selections, and makes it easy to select a host material satisfying the above-describe conditions.

However, when the material in the blue fluorescent light-emitting layer 34B having the highest mixing ratio is an electron transporting material, such as when a host material having electron transport properties is used in the blue fluorescent light-emitting layer 34B as the material having the highest content percentage in the blue fluorescent light-emitting layer 34B, and when the first electrode 21 is an anode electrode and the second electrode 23 is a cathode electrode, it is possible that the holes and electrons cannot recombine well in the green fluorescent light-emitting layer 34G of the subpixel 3G1 if the blue fluorescent light-emitting layer 34B, the red light-emitting layer 34R, an intermediate layer, and the green fluorescent light-emitting layer 34G are layered, as the light-emitting layer unit 33, in that order from the first electrode 21 side between the first electrode 21 and the second electrode 23, as illustrated in FIGS. 1, 2, and 4.

The reason for this is as follows. Of the function layers constituting the light-emitting layer unit 33, the green fluorescent light-emitting layer 34G is located furthest on the cathode electrode side, and a hole transporting material is used in the green fluorescent light-emitting layer 34G as the material having the highest content percentage within the green fluorescent light-emitting layer 34G. As such, electrons do not flow easily in the green fluorescent light-emitting layer 34G on the cathode electrode side. Additionally, when an electron transporting material is used in the blue fluorescent light-emitting layer 34B on the anode electrode side, as the material having the highest content percentage within the blue fluorescent light-emitting layer 34B as described above, holes do not flow easily in the blue fluorescent light-emitting layer 34B.

Accordingly, in the example illustrated in FIG. 16, the light-emitting layer unit 33 has the red light-emitting layer 34R, the separation layer 35 (intermediate layer), the green fluorescent light-emitting layer 34G, and the blue fluorescent light-emitting layer 34B layered, in that order from the first electrode 21 side, between the first electrode 21 and the second electrode 23.

The manufacturing method for the organic EL display device 1 according to this example is the same as the manufacturing method for the organic EL display devices 1 according to Embodiments 1 to 3, aside from the processes indicated by S4 to S7 in the organic EL element preparation process illustrated in FIG. 10 being carried out in the order of the red light-emitting layer formation process (S5), the separation layer formation process (S6), the green fluorescent light-emitting layer formation process (S7), and the blue fluorescent light-emitting layer formation process (S4). Accordingly, the organic EL display device 1 having the layered structure illustrated in FIG. 16 can be manufactured. Examples defining dimensions, materials, and the mixing ratio of materials will be described below.

Example 2: Defining Dimensions, Materials, and Mixing Ratio of Materials

Reflective electrode 21*a* (first electrode 21; anode electrode): Ag (100 nm)

Light-transmissive electrode 21*b* (first electrode 21, anode electrode): ITO (subpixel 3B: 135 nm/subpixel 3G1: 165 nm/subpixel 3G2: 145 nm/subpixel 3R: 40 nm)

Hole injection layer 31: HAT-CN (10 nm)

Hole transport layer 32: TCTA (20 nm)

Red light-emitting layer 34R: CBP (host material 90%)/Ir(piq)3 (red luminescent material, 10%) (10 nm)

Separation layer 35: CBP (20 nm)

Green fluorescent light-emitting layer 34G: TPD (host material, 90%)/coumarin 6 (green fluorescent luminescent material, 10%) (10 nm)

Blue fluorescent light-emitting layer 34B: mCP (host material, 90%)/DMAC-DPS (blue fluorescent luminescent material, 10%) (10 nm)

Electron transport layer 36: DPEPO (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

Note that Example 2 defining dimensions, materials, and the mixing ratio of materials describes, as an example, a case where mCP, which is a hole transporting material, is used as a host material for the material having the highest content percentage in the blue fluorescent light-emitting layer 34B. However, according to the example illustrated in FIG. 16, even if the material having the highest content percentage in the blue fluorescent light-emitting layer 34B is an electron transporting material as described above, the green fluorescent light-emitting layer 34G containing a hole transporting material as the material having the highest content percentage is located on the first electrode 21 (anode electrode) side in the subpixel 3G1, which makes it easy for holes and electrons to recombine in the green fluorescent light-emitting layer 34G, and makes it possible to improve the light emitting efficiency.

In the example illustrated in FIG. 16, there is no particular limit on the carrier mobility of the material having the highest content percentage in the blue fluorescent light-emitting layer 34B. The above-described effect can be achieved even if the material is a hole transporting material or a bipolar transporting material.

As in Embodiment 1, a hole transporting material is used as the material having the highest content percentage in the green fluorescent light-emitting layer 34G, a bipolar transporting material or a hole transporting material (desirably, a bipolar transporting material) is used as the material having the highest content percentage in the red light-emitting layer 34R, and a material having bipolar transport properties for the intermediate layer as a whole is used as the intermediate layer in this example as well.

According to this example, the same effects as in Embodiments 1 to 3 can be achieved by using the above-described layered structure. Additionally, according to this example, employing the above-described layered structure of course makes it possible to suppress color mixing in the subpixels 3, in the same manner as in Embodiments 1 to 3; furthermore, even if the blue fluorescent light-emitting layer 34B has infiltrated into the subpixel 3G2, energy is transferred from the blue fluorescent luminescent material to the green fluorescent luminescent material, and thus blue color mixing will not arise in the subpixel 3G2.

Additionally, according to this example, the red light-emitting layer formation process (S5) is carried out before the blue fluorescent light-emitting layer formation process (S4), and thus even if the red luminescent material has infiltrated into the subpixel 3B, the red light-emitting layer 34R that has infiltrated into the subpixel 3B is located further on the anode electrode side than the blue fluorescent light-emitting layer 34B. Accordingly, when the material having the highest content percentage in the blue fluorescent light-emitting layer 34B is a hole transporting material, electrons will not reach the red light-emitting layer 34R, and thus red color mixing will not arise in the subpixel 3B.

Example 2: Defining Layering Order of Function Layers in Light-Emitting Layer Unit FIG. 17 is a diagram schematically illustrating the layered structure of the light-emitting layer unit 33 of another organic EL display device 1 according to the present embodiment.

As described above, host materials having electron transport properties make up most of the organic EL element host materials currently being developed.

When the materials having the highest content percentages in the light-emitting layers 34 are all hole transporting materials, such as when a host material having hole transport properties is used as the material having the highest content percentage in each light-emitting layer 34, there is often an increase in voltage.

With respect to the recent state of development in the organic EL display device industry, host materials having hole transport properties can be synthesized more easily and have a wider range of types that host materials having electron transport properties, and have undergone much more development. Selecting a host material having electron transport properties as the host material therefore makes it easier to obtain a material having favorable properties than when selecting a host material having hole transport properties.

In reality, electron transporting materials having extremely high electron mobility are better known than hole transporting materials having extremely high hole mobility. As such, it is easier to achieve low voltages by selecting an electron transporting material than by selecting a hole transporting material as the material having the highest content percentage in each light-emitting layer 34.

Figure 17:
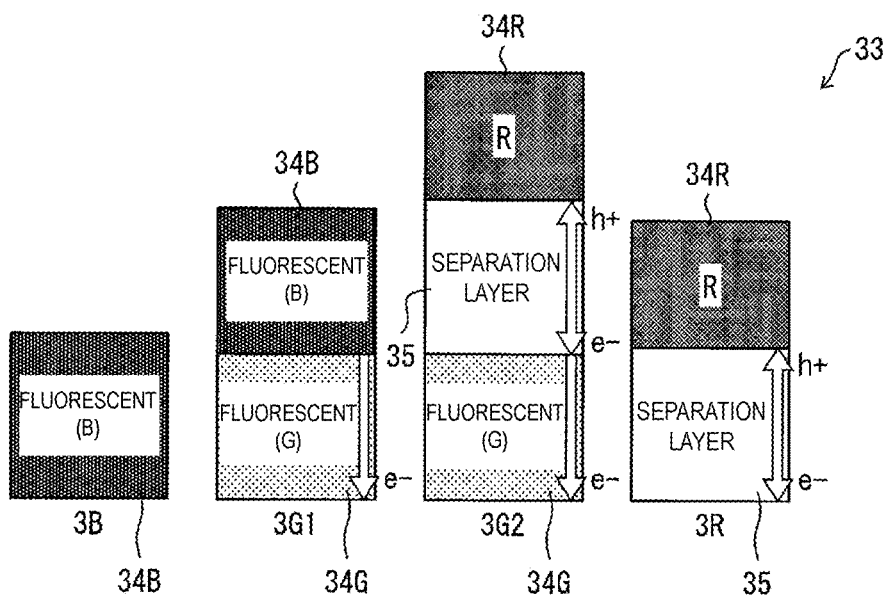
FIG. 17 is a diagram schematically illustrating a layered structure in the light-emitting layer unit of an organic EL display device according to Example 2 defining layering order of function layers in a light-emitting layer unit in Embodiment 4 of the disclosure.

Accordingly, in the example illustrated in FIG. 17, the light-emitting layer unit 33 has a configuration in which the green fluorescent light-emitting layer 34G, the separation layer 35 (intermediate layer) and blue fluorescent light-emitting layer 34B, and the red light-emitting layer 34R are layered in that order, from the first electrode 21 side, between the first electrode 21 and the second electrode 23, and an electron transporting material is used as the material having the highest content percentage in the green fluorescent light-emitting layer 34G. This makes it possible to reduce the voltage of the organic EL display device 1.

As described above, in this example, an electron transporting material is used as the material having the highest content percentage in the green fluorescent light-emitting layer 34G, a bipolar transporting material or an electron transporting material (desirably, an electron transporting material) is used as the material having the highest content percentage in the blue fluorescent light-emitting layer 34B, a bipolar transporting material or an electron transporting material is used as the material having the highest content percentage in the red light-emitting layer 34R, and a material having bipolar transport properties for the intermediate layer as a whole is used as the intermediate layer. This makes it possible to reduce the voltages of the organic EL elements 20, which in turn makes it possible to further reduce the voltage of the organic EL display device 1.

According to this example, the same effects as in Embodiments 1 to 3 can be achieved by using the above-described layered structure. Additionally, according to this example, employing the above-described layered structure of course makes it possible to suppress color mixing in the subpixels 3; furthermore, by using an electron transporting material as the material having the highest content percentage in the green fluorescent light-emitting layer 34G as described above, even if the blue fluorescent light-emitting layer 34B has infiltrated into the subpixel 3G2, almost no holes flow in the green fluorescent light-emitting layer 34G, which provides an advantage in that no blue color mixing will arise in the subpixel 3G2.

The manufacturing method for the organic EL display device 1 according to this example is the same as the manufacturing method for the organic EL display devices 1 according to Embodiments 1 to 3, aside from the processes indicated by S4 to S7 in the organic EL element preparation process illustrated in FIG. 10 being carried out in the order of the green fluorescent light-emitting layer formation process (S7), the separation layer formation process (S6), the red light-emitting layer formation process (S5), and the blue fluorescent light-emitting layer formation process (S4). Accordingly, the organic EL display device 1 having the layered structure illustrated in FIG. 17 can be manufactured. Examples defining dimensions, materials, and the mixing ratio of materials will be described below.

Example 3: Defining Dimensions, Materials, and Mixing Ratio of Materials

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 165 nm/subpixel 3G2: 145 nm/subpixel 3R: 40 nm)
Hole injection layer 31: HAT-CN (10 nm)
Hole transport layer 32: TCTA (20 nm)
Green fluorescent light-emitting layer 34G: BCP (host material, 90%)/coumarin 6 (green fluorescent luminescent material, 10%) (10 nm)
Separation layer 35: CBP (20 nm)
Red light-emitting layer 34R: CBP (host material 90%)/Ir(piq)3 (red luminescent material, 10%) (10 nm)
Blue fluorescent light-emitting layer 34B: DPEPO (host material, 90%)/DMAC-DPS (blue fluorescent luminescent material, 10%) (10 nm)
Electron transport layer 36: DPEPO (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

Thus in this example, for example, a host material constituted by an electron transporting material is used as the material having the highest content percentage in the blue fluorescent light-emitting layer 34B and the green fluorescent light-emitting layer 34G, and a host material constituted by a bipolar transporting material is used as the material having the highest content percentage in the red light-emitting layer 34R.

In this example, the processes indicated by S4 to S7 are carried out in the order of the green fluorescent light-emitting layer formation process (S7), the separation layer formation process (S6), the red light-emitting layer formation process (S5), and the blue fluorescent light-emitting layer formation process (S4), as described above. Thus in Embodiment 3 and in the case where scanning vapor deposition is used in the processes indicated by S4 to S7 in Example 1 defining the layering order of the function layers in the light-emitting layer unit, the mask unit 50 (at least the vapor deposition mask 70) and the TFT substrate 10 (the TFT substrate 10A) are rotated relative to each other within the same plane in the green fluorescent light-emitting layer formation process (S7) after the separation layer formation process (S6), after which the deposition is carried out. However, in this example, the mask unit 50 and the TFT substrate 10 (the TFT substrate 10A) are rotated relative to each other within the same plane in the separation layer formation process (S6) after the green fluorescent light-emitting layer formation process (S7), after which the deposition is carried out.

In this manner, in the case where scanning vapor deposition is used in the processes indicated by S4 to S7, when vapor-depositing at least one of the luminescent materials (i.e., in at least one of the light-emitting layer formation processes), the film formed substrate and the mask unit 50 (at least the vapor deposition mask 70) are rotated relative to each other, after which the deposition is carried out.

In this example, too, rotating at least one of the mask unit 50 and the TFT substrate 10 (the TFT substrate 10A) relative to the other within the same plane makes it possible to ensure the longer direction of the openings in the vapor deposition mask 70 matches the scanning direction, and makes it possible to carry out linear deposition in the desired direction.

Example 3: Defining Layering Order of Function Layers in Light-Emitting Layer Unit FIG. 18 is a diagram schematically illustrating the layered structure of the light-emitting layer unit 33 of yet another organic EL display device 1 according to the present embodiment.

Figure 18:
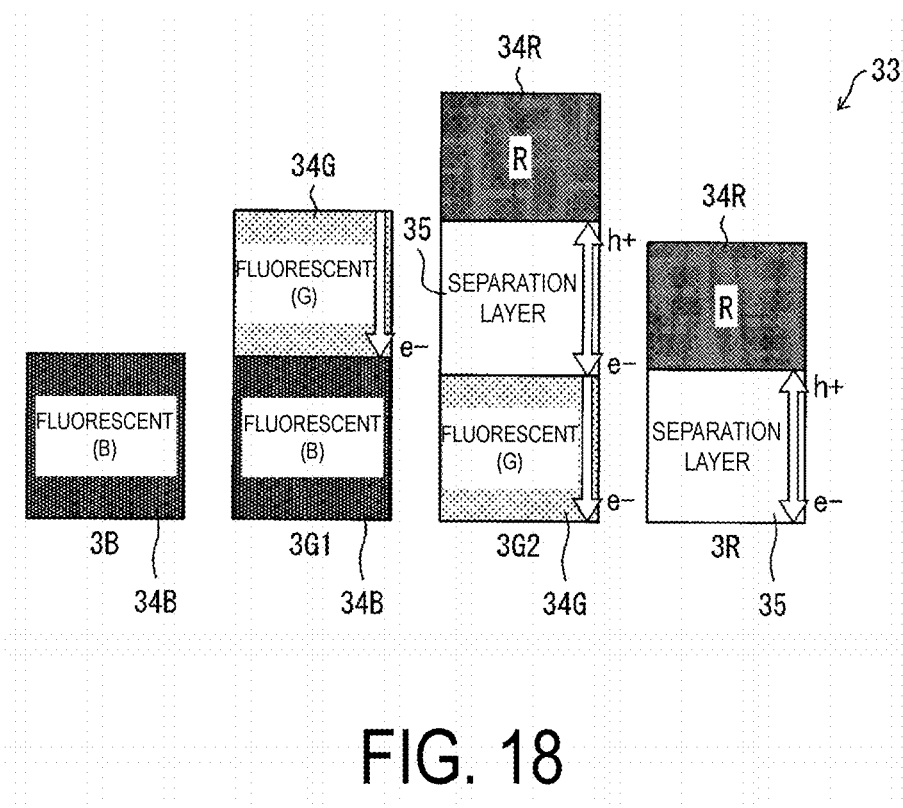
FIG. 18 is a diagram schematically illustrating a layered structure in the light-emitting layer unit of an organic EL display device according to Example 3 defining layering order of function layers in a light-emitting layer unit in Embodiment 4 of the disclosure.

In the example illustrated in FIG. 18, the light-emitting layer unit 33 has a configuration in which the blue fluorescent light-emitting layer 34B, the green fluorescent light-emitting layer 34G, the separation layer 35 (intermediate layer), and the red light-emitting layer 34R are layered in that order, from the first electrode 21 side, between the first electrode 21 and the second electrode 23, and an electron transporting material is used as the material having the highest content percentage in the green fluorescent light-emitting layer 34G.

In this example, an electron transporting material is used as a material having the highest content percentage in the green fluorescent light-emitting layer 34G, a bipolar transporting material or an electron transporting material is used as the material having the highest content percentage in the red light-emitting layer 34R, and a material having bipolar transport properties for the separation layer 35 as a whole is used as the separation layer 35.

Although the carrier mobility of the material having the highest content percentage in the blue fluorescent light-emitting layer 34B is not particularly limited, it is desirable that the material have electron transport properties (i.e., that the material having the highest content percentage in the blue fluorescent light-emitting layer 34B be an electron transporting material).

The manufacturing method for the organic EL display device 1 according to this example is the same as the manufacturing method for the organic EL display devices 1 according to Embodiments 1 to 3, aside from the processes indicated by S4 to S7 in the organic EL element preparation process illustrated in FIG. 10 being carried out in the order of the blue fluorescent light-emitting layer formation process (S4), the green fluorescent light-emitting layer formation process (S7), the separation layer formation process (S6), and the red light-emitting layer formation process (S5). Accordingly, the organic EL display device 1 having the layered structure illustrated in FIG. 18 can be manufactured. Examples defining dimensions, materials, and the mixing ratio of materials will be described below.

Example 4: Defining Dimensions, Materials, and Mixing Ratio of Materials

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 160 nm/subpixel 3G2: 145 nm/subpixel 3R: 40 nm)

Hole injection layer 31: HAT-CN (10 nm)
Hole transport layer 32: TCTA (20 nm)
Blue fluorescent light-emitting layer 34B: DPEPO (host material, 90%)/DMAC-DPS (blue fluorescent luminescent material, 10%) (10 nm)
Green fluorescent light-emitting layer 34G: BCP (host material, 90%)/coumarin 6 (green fluorescent luminescent material, 10%) (10 nm)
Separation layer 35: CBP (20 nm)
Red light-emitting layer 34R: CBP (host material 90%)/Ir(piq)3 (red luminescent material, 10%) (10 nm)
Electron transport layer 36: DPEPO (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

According to this example, in the subpixel 3G1, the green fluorescent light-emitting layer 34G, which contains an electron transporting material as the material having the highest content percentage, is located further on the second electrode 23 (cathode electrode) side than the blue fluorescent light-emitting layer 34B. Accordingly, it is easy for holes and electrons to recombine in the green fluorescent light-emitting layer 34G, which makes it possible to realize a high level of light emitting efficiency.

Additionally, using an electron transporting material as the material having the highest content percentage in the green fluorescent light-emitting layer 34G as described above makes it possible to reduce the voltage of the organic EL display device 1.

Furthermore, in light of host materials having electron transport properties often being used as the host materials for organic EL elements currently being developed, using an electron transporting material as the material having the highest content percentage in each of the light-emitting layers 34 as described above broadens the range of selections for the host material, for example, and furthermore is it possible to reduce the voltages of the organic EL elements 20, which in turn makes it possible to reduce the voltage of the organic EL display device 1.

Additionally, according to this example, it is more difficult for color mixing caused by deposited materials infiltrating to adjacent subpixels 3 to arise than in the organic EL display devices 1 according to Embodiments 1 to 3 and Examples 1 and 2 defining the layering order of the function layers in the light-emitting layer unit described in the present embodiment.

According to the present embodiment, the same effects as in Embodiments 1 to 3 can be achieved by using the above-described layered structure. Additionally, according to this example, employing the above-described layered structure of course makes it possible to suppress color mixing in the subpixels 3; furthermore, even if the blue fluorescent light-emitting layer 34B has infiltrated into the subpixel 3G2, energy is transferred from the blue fluorescent luminescent material to the green fluorescent luminescent material, which provides an advantage in that no blue color mixing will arise in the subpixel 3G2.

Additionally, according to this example, when the material having the highest content percentage in the blue fluorescent light-emitting layer 34B is an electron transporting material, holes will not reach the red light-emitting layer 34R even if the red luminescent material has infiltrated into the blue fluorescent light-emitting layer 34B in the subpixel 3B, and thus red light mixing will not arise in the subpixel 3B. There is thus a reduced risk of color mixing.

In this example, the processes indicated by S4 to S7 are carried out in the order of the blue fluorescent light-emitting layer formation process (S4), the green fluorescent light-emitting layer formation process (S7), the separation layer formation process (S6), and the red light-emitting layer formation process (S5), as described above. Thus in this example, when using scanning vapor deposition in the processes indicated by S4 to S7, the mask unit 50 (at least the vapor deposition mask 70) and the TFT substrate 10 (the TFT substrate 10A) are rotated relative to each other within the same plane in the green fluorescent light-emitting layer formation process (S7) after the blue fluorescent light-emitting layer formation process (S4), after which the deposition is carried out. Then, in the separation layer formation process (S6), the mask unit 50 (at least the vapor deposition mask 70) and the TFT substrate 10 (the TFT substrate 10A) are once again rotated relative to each other within the same plane, after which the deposition is carried out.

In this example, too, rotating the mask unit 50 and the TFT substrate 10 (the TFT substrate 10A) relative to each other within the same plane makes it possible to ensure the longer direction of the openings in the vapor deposition mask 70 matches the scanning direction, and makes it possible to carry out linear deposition in the desired direction.

Example 4: Defining Layering Order of Function Layers in Light-Emitting Layer Unit In the manufacturing method for the organic EL display device 1 having the layered structure illustrated in FIGS. 1, 2, and 4, the processes indicated by S4 to S7 in the organic EL element preparation process illustrated in FIG. 10 may be carried out in the order of the red light-emitting layer formation process (S5), the separation layer formation process (S6; an intermediate layer formation process), the blue fluorescent light-emitting layer formation process (S4), and the green fluorescent light-emitting layer formation process (S7).

In this case, it is desirable that the blue fluorescent light-emitting layer 34B be at least 15 nm thick. Materials having the same carrier mobilities as the materials of the function layers in the light-emitting layer units 33 of the organic EL display devices 1 according to Embodiments 1 to 3 can be used as the materials of the function layers in the light-emitting layer unit 33.

Accordingly, a bipolar transporting material or a hole transporting material can be used as the material having the highest content percentage in the blue fluorescent light-emitting layer 34B, but of those, it is preferable that a hole transporting material such as mCP indicated in Example 5 defining dimensions, materials, and the mixing ratio of materials (described below) be used. Examples defining dimensions, materials, and the mixing ratio of materials will be described below.

Example 5: Defining Dimensions, Materials, and Mixing Ratio of Materials

Reflective electrode 21a (first electrode 21; anode electrode): Ag (100 nm)
Light-transmissive electrode 21b (first electrode 21, anode electrode): ITO (subpixel 3B: 130 nm/subpixel 3G1: 150 nm/subpixel 3G2: 145 nm/subpixel 3R: 40 nm)
Hole injection layer 31: HAT-CN (10 nm)
Hole transport layer 32: TCTA (20 nm)

Red light-emitting layer 34R: CBP (host material 90%)/Ir(piq)3 (red luminescent material, 10%) (10 nm)

Separation layer 35: CBP (20 nm)

Blue fluorescent light-emitting layer 34B: mCP (host material, 90%)/DMAC-DPS (blue fluorescent luminescent material, 10%) (20 nm)

Green fluorescent light-emitting layer 34G: TPD (host material, 90%)/coumarin 6 (green fluorescent luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

According to this example too, the same effects as in Embodiments 1 to 3 can be achieved by using the above-described layered structure.

Additionally, according to this example, color mixing in the subpixels 3 can of course be suppressed; furthermore, even if the blue fluorescent light-emitting layer 34B has infiltrated into the subpixel 3G2, energy is transferred from the blue fluorescent luminescent material to the green fluorescent luminescent material, and thus blue color mixing will not arise in the subpixel 3G2.

Additionally, according to this example, the red light-emitting layer formation process (S5) is carried out before the blue fluorescent light-emitting layer formation process (S4), and thus even if the red luminescent material has infiltrated into the subpixel 3B, the red light-emitting layer 34R that has infiltrated into the subpixel 3B is located further on the anode electrode side than the blue fluorescent light-emitting layer 34B. Accordingly, when the material having the highest content percentage in the blue fluorescent light-emitting layer 34B is a hole transporting material, electrons will not reach the red light-emitting layer 34R, and thus red color mixing will not arise in the subpixel 3B.

Furthermore, when the red light-emitting layer 34R has infiltrated into the subpixel 3G1, the red light-emitting layer 34R that has infiltrated into the subpixel 3G1 is located closer to the anode electrode than the blue fluorescent light-emitting layer 34B, as with the subpixel 3B. Accordingly, if the blue fluorescent light-emitting layer 34B is thick in the subpixel 3G1, electrons will not flow on the side further toward the anode electrode than the green fluorescent light-emitting layer 34G, and the thickness of the blue fluorescent light-emitting layer 34B will exceed the Förster radius. As a result, due to the distance, energy will not be transferred from the green fluorescent light-emitting layer 34G to the red light-emitting layer 34R through the blue fluorescent light-emitting layer 34B, and thus no red color mixing will arise.

Thus according to this example, employing the above-described layered structure provides three patterns of cases where color mixing can be avoided structurally, and is thus even more difficult for color mixing caused by deposited materials infiltrating into adjacent subpixels 3 to arise than with the layered structure according to Embodiments 1 and 2. There is thus a reduced risk of color mixing.

Example 5: Defining Layering Order of Function Layers in Light-Emitting Layer Unit In the manufacturing method for the organic EL display device 1 having the layered structure illustrated in FIG. 17, the processes indicated by S4 to S8 in the organic EL element preparation process illustrated in FIG. 10 may be carried out in the order of the green fluorescent light-emitting layer formation process (S7), the blue fluorescent light-emitting layer formation process (S4), the separation layer formation process (S6; the intermediate layer formation process), the red light-emitting layer formation process (S5), and the electron transport layer formation process (S8). In this case, it is desirable that the blue fluorescent light-emitting layer 34B be at least 15 nm thick. Materials having the same carrier mobilities as the materials of the function layers in the light-emitting layer unit 33 of the organic EL display device 1 according to Example 2 defining the layering order of the function layers in the light-emitting layer unit described above in the present embodiment can be used as the materials of the function layers in the light-emitting layer unit 33. Examples defining dimensions, materials, and the mixing ratio of materials will be described below.

Example 6: Defining Dimensions, Materials, and Mixing Ratio of Materials

Reflective electrode 21a (first electrode 21; anode electrode): Ag (100 nm)

Light-transmissive electrode 21b (first electrode 21, anode electrode): ITO (subpixel 3B: 130 nm/subpixel 3G1: 155 nm/subpixel 3G2: 145 nm/subpixel 3R: 40 nm)

Hole injection layer 31: HAT-CN (10 nm)

Hole transport layer 32: TCTA (20 nm)

Green fluorescent light-emitting layer 34G: BCP (host material, 90%)/coumarin 6 (green fluorescent luminescent material, 10%) (10 nm)

Blue fluorescent light-emitting layer 34B: DPEPO (host material, 90%)/DMAC-DPS (blue fluorescent luminescent material, 10%) (20 nm)

Separation layer 35: CBP (20 nm)

Red light-emitting layer 34R: CBP (host material 90%)/Ir(piq)3 (red luminescent material, 10%) (10 nm)

Electron transport layer 36: DPEPO (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

Advantageous Effects

According to this example too, the same effects as in Example 2 defining the layering order of the function layers in the light-emitting layer unit described above in the present embodiment can be achieved by using the above-described layered structure.

Additionally, according to this example, color mixing in the subpixels 3 can of course be suppressed; furthermore, even if the blue fluorescent light-emitting layer 34B has infiltrated into the subpixel 3G2, energy is transferred from the blue fluorescent luminescent material to the green fluorescent luminescent material, and thus blue color mixing will not arise in the subpixel 3G2.

Additionally, according to this example, the red light-emitting layer formation process (S5) is carried out after the blue fluorescent light-emitting layer formation process (S4), and thus even if the red luminescent material has infiltrated into the subpixel 3B, the red light-emitting layer 34R that has infiltrated into the subpixel 3B is located further on the cathode electrode side than the blue fluorescent light-emitting layer 34B. Accordingly, when the material having the highest content percentage in the blue fluorescent light-emitting layer 34B is an electron transporting material, holes will not reach the red light-emitting layer 34R, and thus red color mixing will not arise in the subpixel 3B.

Furthermore, when the red light-emitting layer 34R has infiltrated into the subpixel 3G1, the red light-emitting layer 34R that has infiltrated into the subpixel 3G1 is located closer to the cathode electrode than the blue fluorescent light-emitting layer 34B, as with the subpixel 3B. Accordingly, if the blue fluorescent light-emitting layer 34B is thick in the subpixel 3G1, holes will not flow on the side further toward the cathode electrode than the green fluorescent light-emitting layer 34G, and the thickness of the blue fluorescent light-emitting layer 34B will exceed the Förster radius. As a result, due to the distance, energy will not be transferred from the green fluorescent light-emitting layer 34G to the red light-emitting layer 34R through the blue fluorescent light-emitting layer 34B, and thus no red color mixing will arise.

Thus according to this example, employing the above-described layered structure provides three patterns of cases where color mixing can be avoided structurally, in the same manner as the layered structure described in Embodiments 1 and 2. It is thus even more difficult for color mixing caused by deposited materials infiltrating into adjacent subpixels 3 to arise. There is thus a reduced risk of color mixing.

Additionally, according to this example, the light-emitting layers 34, and particularly the blue fluorescent light-emitting layer 34B and the green fluorescent light-emitting layer 34G, contain electron transporting materials as the materials having the highest content percentage in those layers. As such, it is easy to reduce the voltages of the organic EL elements 20, which in turn names it possible to easily lower the voltage of the organic EL display device 1.

In this example, the processes indicated by S4 to S7 are carried out in the order of the red light-emitting layer formation process (S5), the separation layer formation process (S6; the intermediate layer formation process), the blue fluorescent light-emitting layer formation process (S4), and the green fluorescent light-emitting layer formation process (S7), as described above. Thus in this example, when using scanning vapor deposition in the processes indicated by S4 to S7, the mask unit 50 (at least the vapor deposition mask 70) and the TFT substrate 10 (the TFT substrate 10A) are rotated relative to each other within the same plane in the green fluorescent light-emitting layer formation process (S7) after the blue fluorescent light-emitting layer formation process (S4), after which the deposition is carried out.

In this example, too, rotating the mask unit 50 and the TFT substrate 10 (the TFT substrate 10A) relative to each other within the same plane makes it possible to ensure the longer direction of the openings in the vapor deposition mask 70 matches the scanning direction, and makes it possible to carry out linear deposition in the desired direction.

Other Modified Examples

Embodiments 1 to 3 and the present embodiment describe, as an example, a case where the organic EL display device 1 is a top-emitting display device in which the light from the light-emitting layer unit 33 is emitted from the sealing substrate 40 side. However, the light-emission direction of the organic EL display device 1 may be on the first electrode 21 side or on the second electrode 23 side. Accordingly, the organic EL display device 1 may be a bottom-emitting organic EL display device in which the light from the light-emitting layer unit 33 is emitted from the first electrode 21 side, i.e., the TFT substrate 10 side. In this case, the first electrode 21 may be a transparent electrode, and instead of providing the protection layer 24, a reflective electrode thicker than the second electrode 23 (the semi-transparent electrode) in the case where the organic EL display device 1 is a top-emitting display device may be used as the second electrode 23.

Note that when the organic EL display device 1 is a bottom-emitting device, an insulating substrate that is transparent, called a transparent substrate or a light-transmitting substrate, such as a glass substrate or a plastic substrate, is used as the insulating substrate 11.

Additionally, when the organic EL display device 1 is a bottom-emitting device, the light from the light-emitting layer unit 33 is emitted from the light-transmissive electrode side directly from the light-transmissive electrode side, or having been reflected by the reflective electrode. The light-transmissive electrode material, the reflective electrode material, and the like described above can be used as the materials of the light-transmissive electrode and the reflective electrode.

In the subpixel 3G1, if, when energy is transferred from the blue fluorescent luminescent material in the blue fluorescent light-emitting layer 34B to the green fluorescent luminescent material in the green fluorescent light-emitting layer 34G, molecules of the blue fluorescent luminescent material and molecules of the green fluorescent luminescent material come into direct contact, it is possible that Dexter transfer between $T_1$ levels will arise and deactivation will occur as heat without light being emitted.

Accordingly, a blocking layer (not illustrated) may be provided between the blue fluorescent light-emitting layer 34B and the green fluorescent light-emitting layer 34G in the subpixel 3G1, the blocking layer lacking a luminescent material, and having a thickness less than or equal to the Förster radius so as to inhibit Dexter transfer from the blue fluorescent luminescent material in the blue fluorescent light-emitting layer 34B to the green fluorescent luminescent material in the green fluorescent light-emitting layer 34G.

The blocking layer has a thickness less than or equal to the Förster radius, and thus in the subpixel 3G1, Förster transfer from the blue fluorescent luminescent material to the green fluorescent luminescent material is not inhibited, but Dexter transfer is inhibited. Accordingly, providing the thin blocking layer, constituted by any desired material, between the blue fluorescent light-emitting layer 34B and the green fluorescent light-emitting layer 34G in the subpixel 3G1 makes it possible to improve the light emitting efficiency of the green fluorescent luminescent material in the subpixel 3G1.

The thickness of the blocking layer is equal to the opposing surface distance $D_{BG}$, and it is therefore necessary to set the thickness to be less than or equal to the Förster radius. To reliably ensure Förster transfer, the blocking layer is preferably formed as thin as possible. The thickness of the blocking layer is therefore preferably less than or equal to 10 nm, and more preferably less than or equal to 5 nm.

The blocking layer may be provided as a common layer for the subpixel 3G1 and the subpixel 3G2, or may be provided as a common layer for the subpixel 3B and the subpixel 3G1.

When the blocking layer is provided as a common layer for the subpixel 3G1 and the subpixel 3G2, the vapor deposition mask 70G or a dedicated vapor deposition mask having the same pattern as the vapor deposition mask 70G can be used to form the blocking layer, in the same manner as when forming the green fluorescent light-emitting layer 34G.

When the blocking layer is provided as a common layer for the subpixel 3B and the subpixel 3G1, the vapor deposition mask 70B or a dedicated vapor deposition mask having the same pattern as the vapor deposition mask 70B can be used to form the blocking layer, in the same manner as when forming the blue fluorescent light-emitting layer 34B.

The separation layer 35 may be formed from a plurality of layers having different carrier transport properties.

Although a slitted mask will be unable to be used to form the separation layer 35, the separation layer 35 may be formed selectively in the subpixel 3G2. In other words, the separation layer 35 may be provided only between the red light-emitting layer 34R and the green fluorescent light-emitting layer 34G in the subpixel 3G2.

Supplement

A manufacturing method for a display device (e.g., the organic EL display device 1) according Aspect 1 of the disclosure is a manufacturing method for a display device, the display device including: a substrate (the TFT substrate 10, 10A) having a display region (the display region 1*a*) in which a plurality of pixels (the pixels 2) are arranged, each pixel including a first subpixel (e.g., the subpixel 3B), a second subpixel (e.g., the subpixel 3G1), a third subpixel (e.g., the subpixel 3G2), and a fourth subpixel (e.g., the subpixel 3R), wherein the first subpixel and the second subpixel are arranged in an alternating manner in a first direction (e.g., the row direction); the third subpixel and the fourth subpixel are arranged in an alternating manner in the first direction; a column constituted by the first subpixel and the second subpixel, and a column constituted by the third subpixel and the fourth subpixel, are arranged in an alternating manner in a second direction (e.g., the column direction) orthogonal to the first direction; in the first subpixel, a first fluorescent luminescent material emits light, and the light emitted from the first fluorescent luminescent material is emitted to the exterior; in the second subpixel and the third subpixel, a second fluorescent luminescent material emits light, and the light emitted from the second fluorescent luminescent material is emitted to the exterior; in the fourth subpixel, a third luminescent material emits light, and the light emitted from the third luminescent material is emitted to the exterior; the first fluorescent luminescent material emits light having a first peak wavelength; the second fluorescent luminescent material emits light having a second peak wavelength longer than the first peak wavelength; the third luminescent material emits light having a third peak wavelength longer than the second peak wavelength; and an energy level (S1 level) of the second fluorescent luminescent material in a minimum excited singlet state is lower than an energy level of the first fluorescent luminescent material in a minimum excited singlet state and higher than an energy level of the third luminescent material in a minimum excited singlet state, the method including: a function layer formation step of forming a plurality of function layers (e.g., the hole injection layer 31, the hole transport layer 32, the blue fluorescent light-emitting layer 34B, the green fluorescent light-emitting layer 34G, the red light-emitting layer 34R, the separation layer 35, the electron transport layer 36, the electron injection layer 37, the blocking layer, and the like) constituted by vapor deposition particles on the substrate by vapor-depositing vapor deposition particles corresponding to the respective function layers on the substrate through vapor deposition masks (e.g., the vapor deposition masks 70, 70R, 70G, and 70B) in which are formed a plurality of mask openings (e.g., the openings 71, 71R, 71G, and 71B) having predetermined opening patterns corresponding to the respective function layers, wherein the function layer formation step includes: a first light-emitting layer formation step of forming a first light-emitting layer containing the first fluorescent luminescent material (e.g., the blue fluorescent light-emitting layer 34B) in common for the first subpixel and the second subpixel; a second light-emitting layer formation step of forming a second light-emitting layer containing the second fluorescent luminescent material (e.g., the green fluorescent light-emitting layer 34G) in common for the second subpixel and the third subpixel; a third light-emitting layer formation step of forming a third light-emitting layer containing the third luminescent material (e.g., the red light-emitting layer 34R) in common for the third subpixel and the fourth subpixel; and an intermediate layer formation step of forming an intermediate layer in the third subpixel, so that in the third subpixel, the second light-emitting layer and the third light-emitting layer are layered with the intermediate layer (e.g., the separation layer 35, or the separation layer 35 and a blocking layer), constituted by at least one function layer (e.g., the separation layer 35, or the separation layer 35 and a blocking layer) aside from the light-emitting layers and having a thickness exceeding the Förster radius, being interposed therebetween, and in the function layer formation step: the first light-emitting layer and the second light-emitting layer are formed so that in the second subpixel, a distance between opposing surfaces of the first light-emitting layer and the second light-emitting layer is less than or equal to the Förster radius; and in at least two light-emitting layer formation steps among the first light-emitting layer formation step, the second light-emitting layer formation step, and the third light-emitting layer formation step, the vapor deposition particles are linearly deposited on the substrate using, as the vapor deposition mask, a slitted mask including slit-shaped mask openings provided so that the mask openings span a plurality of the pixels.

As a manufacturing method for a display device according to Aspect 2 of the disclosure, in Aspect 1, the display device may have an S-Stripe pixel arrangement in which the first subpixel and the fourth subpixel are adjacent, and the second subpixel and the third subpixel are adjacent, in the second direction; in the first light-emitting layer formation step, the first fluorescent luminescent material may be linearly-deposited in a direction connecting the first subpixel and the second subpixel adjacent in the first direction; in the second light-emitting layer formation step, the second fluorescent luminescent material may be linearly-deposited in a direction connecting the second subpixel and the third subpixel adjacent in the second direction; and in the third light-emitting layer formation step, the third luminescent material may be linearly-deposited in a direction connecting the third subpixel and the fourth subpixel adjacent in the first direction.

As a manufacturing method for a display device according to Aspect 3 of the disclosure, in Aspect 2, in the at least two light-emitting layer formation steps, using a mask unit (50), which includes a slitted mask having a smaller area than the substrate as the slitted mask and a vapor deposition source (60) that emits the vapor deposition particles, and in which the relative positions of the vapor deposition mask and the vapor deposition source are fixed, the vapor deposition particles may be linearly-deposited on the substrate through the slitted mask by moving at least one of the mask unit and the substrate relative to the other while scanning the substrate with the slitted mask and the substrate arranged opposing each other with a set gap provided therebetween.

As a manufacturing method for a display device according to Aspect 4 of the disclosure, in Aspect 3, in at least one light-emitting layer formation step, of the first to third light-emitting layer formation steps, that is not the light-emitting layer formation step carried out first, the linear deposition may be carried out after rotating at least one of the substrate and the slitted mask relative to the other within the same plane from the state in the light-emitting layer formation step carried out first.

As a manufacturing method for a display device according to Aspect 5 of the disclosure, in Aspect 1, the display device may have a PenTile pixel arrangement in which the second subpixel and the fourth subpixel are adjacent, and the third subpixel and the first subpixel are adjacent, in the second direction, and the first subpixel and the fourth subpixel are adjacent, and the second subpixel and the third subpixel are adjacent, in a third direction (an oblique direction) intersecting with the first direction and the second direction; in the first light-emitting layer formation step, the first fluorescent luminescent material may be linearly-deposited in a direction connecting the first subpixel and the second subpixel adjacent in the first direction; in the second light-emitting layer formation step, the second fluorescent luminescent material may be linearly-deposited in a direction connecting the second subpixel and the third subpixel adjacent in the third direction; and in the third light-emitting layer formation step, the third luminescent material may be linearly-deposited in a direction connecting the third subpixel and the fourth subpixel adjacent in the first direction.

As a manufacturing method for a display device according to Aspect 6 of the disclosure, in Aspect 5, in the at least two light-emitting layer formation steps, using a mask unit (50), which includes a slitted mask having a smaller area than the substrate as the slitted mask and a vapor deposition source (60) that emits the vapor deposition particles, and in which the relative positions of the vapor deposition mask and the vapor deposition source are fixed, the vapor deposition particles may be linearly-deposited on the substrate through the slitted mask by moving at least one of the mask unit and the substrate relative to the other while scanning the substrate with the slitted mask and the substrate arranged opposing each other with a set gap provided therebetween.

As a manufacturing method for a display device according to Aspect 7 of the disclosure, in Aspect 6, in at least one light-emitting layer formation step, of the first to third light-emitting layer formation steps, that is not the light-emitting layer formation step carried out first, the linear deposition may be carried out after rotating at least one of the substrate and the slitted mask relative to the other within the same plane from the state in the light-emitting layer formation step carried out first; the third direction may be an oblique direction (e.g., the diagonal line direction) forming a 45-degree angle with one side or an axis of the substrate; and in the second light-emitting layer formation step, the substrate may be arranged so that a longer direction of the mask openings in the slitted mask is a direction parallel to the oblique direction, and at least one of the mask unit and the substrate is moved relative to the other in a direction parallel to the oblique direction.

As a manufacturing method for a display device according to Aspect 8 of the disclosure, in any one of Aspects 1 to 7, the intermediate layer formation step may include a separation layer formation step of forming a separation layer (the separation layer 35) having a thickness exceeding the Förster radius as the function layer; and in the separation layer formation step, the separation layer may be formed in common for the third subpixel and the fourth subpixel using a vapor deposition mask having the same opening pattern as the vapor deposition mask used to form the third light-emitting layer (e.g., the vapor deposition mask 70R, or a vapor deposition mask specifically for forming the separation layer, which has the same opening pattern as the vapor deposition mask 70R)

As a manufacturing method for a display device according to Aspect 9 of the disclosure, in Aspect 8, the slitted mask may be used as the vapor deposition mask in each of the first light-emitting layer formation step, the second light-emitting layer formation step, the third light-emitting layer formation step, and the intermediate layer formation step.

As a manufacturing method for a display device according to Aspect 10 of the disclosure, any one of Aspects 1 to 9 may further include: an anode electrode formation step of forming an anode electrode (e.g., the first electrode 21); and a cathode electrode formation step of forming a cathode electrode (e.g., the second electrode 23), wherein one of the anode electrode and the cathode electrode may include a reflective electrode (e.g., the reflective electrode 21a), and the other may be a light-transmissive electrode.

As a manufacturing method for a display device according to Aspect 11 of the disclosure, in Aspect 10, the function layer formation step may be carried out after the anode electrode formation step and before the cathode electrode formation step; in the function layer formation step, the first light-emitting layer formation step, the third light-emitting layer formation step, the intermediate layer formation step, and the second light-emitting layer formation step may be carried out in that order; and in the second light-emitting layer formation step, a material having the highest content percentage in the second light-emitting layer may be a hole transporting material.

As a manufacturing method for a display device according to Aspect 12 of the disclosure, in Aspect 10, the function layer formation step may be carried out after the anode electrode formation step and before the cathode electrode formation step; in the function layer formation step, the third light-emitting layer formation step, the intermediate layer formation step, the second light-emitting layer formation step, and the first light-emitting layer formation step may be carried out in that order; and in the second light-emitting layer formation step, a material having the highest content percentage in the second light-emitting layer may be a hole transporting material.

As a manufacturing method for a display device according to Aspect 13 of the disclosure, in Aspect 12, in the first light-emitting layer formation step, a material having the highest content percentage in the first light-emitting layer may be a hole transporting material.

As a manufacturing method for a display device according to Aspect 14 of the disclosure, in Aspect 10, the function layer formation step may be carried out after the anode electrode formation step and before the cathode electrode formation step; in the function layer formation step, the second light-emitting layer formation step, the intermediate layer formation step, the third light-emitting layer formation step, and the first light-emitting layer formation step may be carried out in that order; and in the second light-emitting layer formation step, a material having the highest content percentage in the second light-emitting layer may be an electron transporting material.

As a manufacturing method for a display device according to Aspect 15 of the disclosure, in Aspect 10, the function layer formation step may be carried out after the anode electrode formation step and before the cathode electrode formation step; in the function layer formation step, the first light-emitting layer formation step, the second light-emitting layer formation step, the intermediate layer formation step, and the third light-emitting layer formation step may be carried out in that order; and in the second light-emitting layer formation step, a material having the highest content percentage in the second light-emitting layer may be an electron transporting material.

As a manufacturing method for a display device according to Aspect 16 of the disclosure, in Aspect 15, in the first light-emitting layer formation step, a material having the highest content percentage in the first light-emitting layer may be an electron transporting material.

As a manufacturing method for a display device according to Aspect 17 of the disclosure, in Aspect 10, the function layer formation step may be carried out after the anode electrode formation step and before the cathode electrode formation step; in the function layer formation step, the third light-emitting layer formation step, the intermediate layer formation step, the first light-emitting layer formation step, and the second light-emitting layer formation step may be carried out in that order; and in the second light-emitting layer formation step, a material having the highest content percentage in the second light-emitting layer may be a hole transporting material.

As a manufacturing method for a display device according to Aspect 18 of the disclosure, in Aspect 17, in the first light-emitting layer formation step, a material having the highest content percentage in the first light-emitting layer may be a hole transporting material.

As a manufacturing method for a display device according to Aspect 19 of the disclosure, in Aspect 10, the function layer formation step may be carried out after the anode electrode formation step and before the cathode electrode formation step; in the function layer formation step, the second light-emitting layer formation step, the first light-emitting layer formation step, the intermediate layer formation step, and the third light-emitting layer formation step may be carried out in that order; and in the second light-emitting layer formation step, a material having the highest content percentage in the second light-emitting layer may be an electron transporting material.

As a manufacturing method for a display device according to Aspect 20 of the disclosure, in Aspect 19, in the first light-emitting layer formation step, a material having the highest content percentage in the first light-emitting layer may be an electron transporting material.

As a manufacturing method for a display device according to Aspect 21 of the disclosure, in any one of Aspects 17 to 20, in the first light-emitting layer formation step, the first light-emitting layer may be formed so that the thickness of the first light-emitting layer is at least 15 nm.

As a manufacturing method for a display device according to Aspect 22 of the disclosure, in any one of Aspects 1 to 21, the first subpixel may be a blue subpixel; the second subpixel may be a first green subpixel; the third subpixel may be a second green subpixel; the fourth subpixel may be a red subpixel; a fluorescent luminescent material that emits blue light may be used for the first fluorescent luminescent material; a fluorescent luminescent material that emits green light may be used for the second fluorescent luminescent material; and a luminescent material that emits red light may be used for the third luminescent material.

A display device (e.g., the organic EL display device 1) according Aspect 23 of the disclosure includes: a substrate (the TFT substrate 10, 10A) having a display region (the display region 1a) in which a plurality of pixels (the pixels 2) are arranged, each pixel including a first subpixel (e.g., the subpixel 3B), a second subpixel (e.g., the subpixel 3G1), a third subpixel (e.g., the subpixel 3G2), and a fourth subpixel (e.g., the subpixel 3R), wherein the first subpixel and the second subpixel are arranged in an alternating manner in a first direction (e.g., a row direction); the third subpixel and the fourth subpixel are arranged in an alternating manner in the first direction; a column constituted by the first subpixel and the second subpixel, and a column constituted by the third subpixel and the fourth subpixel, are arranged in an alternating manner in a second direction (e.g., the column direction) orthogonal to the first direction; a first light-emitting layer containing a first fluorescent luminescent material (e.g., the blue fluorescent light-emitting layer 34B) is provided in common for the first subpixel and the second subpixel; a second light-emitting layer containing a second fluorescent luminescent material (e.g., the green fluorescent light-emitting layer 34G) is provided in common for the second subpixel and the third subpixel; a third light-emitting layer containing a third luminescent material (e.g., the red light-emitting layer 34R) is provided in common for the third subpixel and the fourth subpixel; at least two light-emitting layers among the first light-emitting layer, the second light-emitting layer, and the third light-emitting layer include a light-emitting layer provided spanning a plurality of pixels; an energy level ($S_1$ level) of the second fluorescent luminescent material in a minimum excited singlet state is lower than an energy level of the first fluorescent luminescent material in a minimum excited singlet state and higher than an energy level of the third luminescent material in a minimum excited singlet state; in the second subpixel, a distance between opposing surfaces of the first light-emitting layer and the second light-emitting layer (e.g., the opposing surface distance $D_{BG}$) is less than or equal to a Förster radius; the third subpixel includes an intermediate layer (e.g., the separation layer 35, or the separation layer 35 and a blocking layer), the intermediate layer constituted by at least one function layer (e.g., the separation layer 35, or the separation layer 35 and a blocking layer) aside from the light-emitting layers and having a thickness exceeding the Förster radius, and in the third subpixel, the second light-emitting layer and the third light-emitting layer are layered with the intermediate layer interposed therebetween; in the first subpixel, the first fluorescent luminescent material emits light, and the light emitted from the first fluorescent luminescent material is emitted to the exterior; in the second subpixel and the third subpixel, the second fluorescent luminescent material emits light, and the light emitted from the second fluorescent luminescent material is emitted to the exterior; in the fourth subpixel, the third luminescent material emits light, and the light emitted from the third luminescent material is emitted to the exterior; the first fluorescent luminescent material emits light having a first peak wavelength; the second fluorescent luminescent material emits light having a second peak wavelength longer than the first peak wavelength; and the third luminescent material emits light having a third peak wavelength longer than the second peak wavelength.

As a display device according to Aspect 24 of the disclosure, in Aspect 23, the device may further include: an anode electrode (e.g., the first electrode 21) and a cathode electrode (e.g., the second electrode 23), wherein one of the anode electrode and the cathode electrode may include a reflective electrode (e.g., the reflective electrode 21a), and the other may be a light-transmissive electrode; in each pixel, a plurality of function layers including the first light-emitting layer, the second light-emitting layer, the third light-emitting layer, and the intermediate layer (e.g., the hole injection layer 31, the hole transport layer 32, the blue fluorescent light-emitting layer 34B, the green fluorescent light-emitting layer 34G, the red light-emitting layer 34R, the separation layer 35, the blocking layer, the electron transport layer 36, and the electron injection layer 37) may be provided between the anode electrode and the cathode electrode; in the first subpixel, the light emitted from the first fluorescent luminescent material may be emitted through the light-transmissive electrode to the exterior, directly or having been reflected in multiple between the reflective electrode and the light-transmissive electrode in the first subpixel; in the second subpixel, the light emitted from the second fluorescent luminescent material may be emitted through the light-transmissive electrode to the exterior, directly or having been reflected in multiple between the reflective electrode and the light-transmissive electrode in the second subpixel; in the third subpixel, the light emitted from the second fluorescent luminescent material may be emitted through the light-transmissive electrode to the exterior, directly or having been reflected in multiple between the reflective electrode and the light-transmissive electrode in the third subpixel; and in the fourth subpixel, the light emitted from the third luminescent material may be emitted through the light-transmissive electrode to the exterior, directly or having been reflected in multiple between the reflective electrode and the light-transmissive electrode in the fourth subpixel.

The disclosure is not limited to the embodiments described above, and various modifications can be made within a scope not departing from the scope of the claims. Embodiments obtained by appropriately combining the technical approaches described in each of the different embodiments also fall within the technical scope of the disclosure. Moreover, novel technical features may be formed by combining the technical approaches disclosed in each of the embodiments.

REFERENCE SIGNS LIST

1 Organic EL display device (display device)
1a Display region
2 Pixel
3, 3B, 3G1, 3G2, 3R Subpixel
4, 4B, 4G1, 4G2, 4R Light emitting region
10 TFT substrate (substrate)
11 Insulating substrate
12 TFT
13 Interlayer insulating film
13a Contact hole
14 Wiring line
15 Bank
15a Opening
20, 20B, 20G1, 20G2, 20R Organic EL element
21 First electrode (anode electrode)
21a Reflective electrode
21b Light-transmissive electrode
22 Organic EL layer
23 Second electrode (cathode electrode)
24 Protection layer
31 Hole injection layer (function layer)
32 Hole transport layer (function layer)
33 Light-emitting layer unit
34 Light-emitting layer (function layer)
34B Blue fluorescent light-emitting layer (function layer)
34G Green fluorescent light-emitting layer (function layer)
34R Red light-emitting layer (function layer)
35 Separation layer (function layer)
36 Electron transport layer (function layer)
37 Electron injection layer (function layer)
40 Sealing substrate
50 Mask unit
60 Vapor deposition source
61 Emission opening
80 Limiting plate unit
81 Limiting plate
82 Limiting plate opening
91 Vapor deposition particle
70B, 70R, 70G, 70 Vapor deposition mask
71B, 71R, 71G, 71 Opening (mask opening)
$D_{BG}$, $D_{GR}$ Opposing surface distance

The invention claimed is:

1. A manufacturing method for a display device, the display device comprising:
   a substrate having a display region in which a plurality of pixels are arranged, each pixel including a first subpixel, a second subpixel, a third subpixel, and a fourth subpixel,
   wherein the first subpixel and the second subpixel are arranged in an alternating manner in a first direction;
   the third subpixel and the fourth subpixel are arranged in an alternating manner in the first direction;
   a column constituted by the first subpixel and the second subpixel, and a column constituted by the third subpixel and the fourth subpixel, are arranged in an alternating manner in a second direction orthogonal to the first direction;
   in the first subpixel, a first fluorescent luminescent material emits light, and the light emitted from the first fluorescent luminescent material is emitted to the exterior;
   in the second subpixel and the third subpixel, a second fluorescent luminescent material emits light, and the light emitted from the second fluorescent luminescent material is emitted to the exterior;
   in the fourth subpixel, a third luminescent material emits light, and the light emitted from the third luminescent material is emitted to the exterior;
   the first fluorescent luminescent material emits light having a first peak wavelength;
   the second fluorescent luminescent material emits light having a second peak wavelength longer than the first peak wavelength;
   the third luminescent material emits light having a third peak wavelength longer than the second peak wavelength; and
   an energy level of the second fluorescent luminescent material in a minimum excited singlet state is lower than an energy level of the first fluorescent luminescent material in a minimum excited singlet state and higher than an energy level of the third luminescent material in a minimum excited singlet state,
   the method comprising:
   a function layer formation step of forming a plurality of function layers constituted by vapor deposition particles on the substrate by vapor-depositing vapor deposition particles corresponding to the respective function layers on the substrate through vapor deposition masks in which are formed a plurality of mask openings having predetermined opening patterns corresponding to the respective function layers, wherein the function layer formation step includes:
a first light-emitting layer formation step of forming a first light-emitting layer containing the first fluorescent luminescent material in common for the first subpixel and the second subpixel;
a second light-emitting layer formation step of forming a second light-emitting layer containing the second fluorescent luminescent material in common for the second subpixel and the third subpixel;
a third light-emitting layer formation step of forming a third light-emitting layer containing the third luminescent material in common for the third subpixel and the fourth subpixel; and
an intermediate layer formation step of forming an intermediate layer in the third subpixel, so that in the third subpixel, the second light-emitting layer and the third light-emitting layer are layered with the intermediate layer, constituted by at least one function layer aside from the light-emitting layers and having a thickness exceeding the Förster radius, being interposed therebetween, and
in the function layer formation step:
the first light-emitting layer and the second light-emitting layer are formed so that in the second subpixel, a distance between opposing surfaces of the first light-emitting layer and the second light-emitting layer is less than or equal to the Förster radius; and
in at least two light-emitting layer formation steps among the first light-emitting layer formation step, the second light-emitting layer formation step, and the third light-emitting layer formation step, the vapor deposition particles are linearly deposited on the substrate using, as the vapor deposition mask, a slitted mask including slit-shaped mask openings provided so that the mask openings span a plurality of the pixels.

2. The manufacturing method for a display device according to claim 1,
wherein the display device has an S-Stripe pixel arrangement in which the first subpixel and the fourth subpixel are adjacent, and the second subpixel and the third subpixel are adjacent, in the second direction;
in the first light-emitting layer formation step, the first fluorescent luminescent material is linearly-deposited in a direction connecting the first subpixel and the second subpixel adjacent in the first direction;
in the second light-emitting layer formation step, the second fluorescent luminescent material is linearly-deposited in a direction connecting the second subpixel and the third subpixel adjacent in the second direction; and
in the third light-emitting layer formation step, the third luminescent material is linearly-deposited in a direction connecting the third subpixel and the fourth subpixel adjacent in the first direction.

3. The manufacturing method for a display device according to claim 2,
wherein in the at least two light-emitting layer formation steps,
using a mask unit, which includes a slitted mask having a smaller area than the substrate as the slitted mask and a vapor deposition source that emits the vapor deposition particles, and in which the relative positions of the vapor deposition mask and the vapor deposition source are fixed, the vapor deposition particles are linearly-deposited on the substrate through the slitted mask by moving at least one of the mask unit and the substrate relative to the other while scanning the substrate with the slitted mask and the substrate arranged opposing each other with a set gap provided therebetween.

4. The manufacturing method for a display device according to claim 3,
wherein in at least one light-emitting layer formation step, of the first to third light-emitting layer formation steps, that is not the light-emitting layer formation step carried out first, the linear deposition is carried out after rotating at least one of the substrate and the slitted mask relative to the other within the same plane from the state in the light-emitting layer formation step carried out first.

5. The manufacturing method for a display device according to claim 1,
wherein the display device has a PenTile pixel arrangement in which the second subpixel and the fourth subpixel are adjacent, and the third subpixel and the first subpixel are adjacent, in the second direction, and the first subpixel and the fourth subpixel are adjacent, and the second subpixel and the third subpixel are adjacent, in a third direction intersecting with the first direction and the second direction;
in the first light-emitting layer formation step, the first fluorescent luminescent material is linearly-deposited in a direction connecting the first subpixel and the second subpixel adjacent in the first direction;
in the second light-emitting layer formation step, the second fluorescent luminescent material is linearly-deposited in a direction connecting the second subpixel and the third subpixel adjacent in the third direction; and
in the third light-emitting layer formation step, the third luminescent material is linearly-deposited in a direction connecting the third subpixel and the fourth subpixel adjacent in the first direction.

6. The manufacturing method for a display device according to claim 5,
wherein in the at least two light-emitting layer formation steps,
using a mask unit, which includes a slitted mask having a smaller area than the substrate as the slitted mask and a vapor deposition source that emits the vapor deposition particles, and in which the relative positions of the vapor deposition mask and the vapor deposition source are fixed, the vapor deposition particles are linearly-deposited on the substrate through the slitted mask by moving at least one of the mask unit and the substrate relative to the other while scanning the substrate with the slitted mask and the substrate arranged opposing each other with a set gap provided therebetween.

7. The manufacturing method for a display device according to claim 6,
wherein in at least one light-emitting layer formation step, of the first to third light-emitting layer formation steps, that is not the light-emitting layer formation step carried out first, the linear deposition is carried out after rotating at least one of the substrate and the slitted mask relative to the other within the same plane from the state in the light-emitting layer formation step carried out first;
the third direction is an oblique direction forming a 45-degree angle with one side or an axis of the substrate;
in the second light-emitting layer formation step, the substrate is arranged so that a longer direction of the mask openings in the slitted mask is a direction parallel to the oblique direction, and at least one of the mask unit and the substrate is moved relative to the other in a direction parallel to the oblique direction.

8. The manufacturing method for a display device according to claim 1,
wherein the intermediate layer formation step may include a separation layer formation step of forming a separation layer having a thickness exceeding the Förster radius as the function layer; and
in the separation layer formation step, the separation layer is formed in common for the third subpixel and the fourth subpixel using a vapor deposition mask having the same opening pattern as the vapor deposition mask used to form the third light-emitting layer.

9. The manufacturing method for a display device according to claim 1, further comprising:
an anode electrode formation step of forming an anode electrode; and
a cathode electrode formation step of forming a cathode electrode,
wherein one of the anode electrode and the cathode electrode includes a reflective electrode, and the other includes a light-transmissive electrode.

10. The manufacturing method for a display device according to claim 9,
wherein the function layer formation step is carried out after the anode electrode formation step and before the cathode electrode formation step;
in the function layer formation step, the first light-emitting layer formation step, the third light-emitting layer formation step, the intermediate layer formation step, and the second light-emitting layer formation step are carried out in that order; and
in the second light-emitting layer formation step, a material having the highest content percentage in the second light-emitting layer is a hole transporting material.

11. The manufacturing method for a display device according to claim 9,
wherein the function layer formation step is carried out after the anode electrode formation step and before the cathode electrode formation step;
in the function layer formation step, the third light-emitting layer formation step, the intermediate layer formation step, the second light-emitting layer formation step, and the first light-emitting layer formation step are carried out in that order; and
in the second light-emitting layer formation step, a material having the highest content percentage in the second light-emitting layer is a hole transporting material.

12. The manufacturing method for a display device according to claim 9,
wherein the function layer formation step is carried out after the anode electrode formation step and before the cathode electrode formation step;
in the function layer formation step, the second light-emitting layer formation step, the intermediate layer formation step, the third light-emitting layer formation step, and the first light-emitting layer formation step are carried out in that order; and
in the second light-emitting layer formation step, a material having the highest content percentage in the second light-emitting layer is an electron transporting material.

13. The manufacturing method for a display device according to claim 9,
wherein the function layer formation step is carried out after the anode electrode formation step and before the cathode electrode formation step;
in the function layer formation step, the first light-emitting layer formation step, the second light-emitting layer formation step, the intermediate layer formation step, and the third light-emitting layer formation step are carried out in that order; and
in the second light-emitting layer formation step, a material having the highest content percentage in the second light-emitting layer is an electron transporting material.

14. The manufacturing method for a display device according to claim 9,
wherein the function layer formation step is carried out after the anode electrode formation step and before the cathode electrode formation step;
in the function layer formation step, the third light-emitting layer formation step, the intermediate layer formation step, the first light-emitting layer formation step, and the second light-emitting layer formation step are carried out in that order; and
in the second light-emitting layer formation step, a material having the highest content percentage in the second light-emitting layer is a hole transporting material.

15. The manufacturing method for a display device according to claim 9,
wherein the function layer formation step is carried out after the anode electrode formation step and before the cathode electrode formation step;
in the function layer formation step, the second light-emitting layer formation step, the first light-emitting layer formation step, the intermediate layer formation step, and the third light-emitting layer formation step are carried out in that order; and
in the second light-emitting layer formation step, a material having the highest content percentage in the second light-emitting layer is an electron transporting material.

16. A display device comprising:
a substrate having a display region in which a plurality of pixels are arranged, each pixel including a first subpixel, a second subpixel, a third subpixel, and a fourth subpixel,
wherein the first subpixel and the second subpixel are arranged in an alternating manner in a first direction;
the third subpixel and the fourth subpixel are arranged in an alternating manner in the first direction;
a column constituted by the first subpixel and the second subpixel, and a column constituted by the third subpixel and the fourth subpixel, are arranged in an alternating manner in a second direction orthogonal to the first direction;
a first light-emitting layer containing a first fluorescent luminescent material is provided in common for the first subpixel and the second subpixel;
a second light-emitting layer containing a second fluorescent luminescent material is provided in common for the second subpixel and the third subpixel;
a third light-emitting layer containing a third luminescent material is provided in common for the third subpixel and the fourth subpixel;
at least two light-emitting layers among the first light-emitting layer, the second light-emitting layer, and the third light-emitting layer include a light-emitting layer provided spanning a plurality of pixels;
an energy level of the second fluorescent luminescent material in a minimum excited singlet state is lower than an energy level of the first fluorescent luminescent material in a minimum excited singlet state and higher than an energy level of the third luminescent material in a minimum excited singlet state;

in the second subpixel, a distance between opposing surfaces of the first light-emitting layer and the second light-emitting layer is less than or equal to a Förster radius;

the third subpixel includes an intermediate layer, the intermediate layer constituted by at least one function layer aside from the light-emitting layers and having a thickness exceeding the Förster radius, and in the third subpixel, the second light-emitting layer and the third light-emitting layer are layered with the intermediate layer interposed therebetween;

in the first subpixel, the first fluorescent luminescent material emits light, and the light emitted from the first fluorescent luminescent material is emitted to the exterior;

in the second subpixel and the third subpixel, the second fluorescent luminescent material emits light, and the light emitted from the second fluorescent luminescent material is emitted to the exterior;

in the fourth subpixel, the third luminescent material emits light, and the light emitted from the third luminescent material is emitted to the exterior;

the first fluorescent luminescent material emits light having a first peak wavelength;

the second fluorescent luminescent material emits light having a second peak wavelength longer than the first peak wavelength; and the third luminescent material emits light having a third peak wavelength longer than the second peak wavelength.

* * * * *